US012777983B2

(12) United States Patent
Tang et al.

(10) Patent No.: US 12,777,983 B2
(45) Date of Patent: Oct. 27, 2026

(54) LIGHT-EMITTING SUBSTRATE AND MANUFACTURING METHOD THEREFOR, BACKLIGHT MODULE, AND DISPLAY APPARATUS

(71) Applicants: Hefei BOE Ruisheng Technology Co., Ltd., Hefei (CN); BOE TECHNOLOGY GROUP CO., LTD., Beijing (CN)

(72) Inventors: Hai Tang, Beijing (CN); Xiaolin Geng, Beijing (CN); Bing Zhang, Beijing (CN); Liang Gao, Beijing (CN)

(73) Assignees: Hefei BOE Ruisheng Technology Co., Ltd., Anhui (CN); Beijing BOE Technology Development Co., Ltd., Beijing (CN)

( * ) Notice: Subject to any disclaimer, the term of this patent is extended or adjusted under 35 U.S.C. 154(b) by 380 days.

(21) Appl. No.: 18/553,040

(22) PCT Filed: Oct. 28, 2022

(86) PCT No.: PCT/CN2022/128351
§ 371 (c)(1),
(2) Date: Sep. 28, 2023

(87) PCT Pub. No.: WO2024/087194
PCT Pub. Date: May 2, 2024

(65) Prior Publication Data
US 2025/0079410 A1 Mar. 6, 2025

(51) Int. Cl.
*H10W 90/00* (2026.01)

(52) U.S. Cl.
CPC .................................. *H10W 90/00* (2026.01)

(58) Field of Classification Search
CPC ... H10W 90/00; H10H 29/0363; H10H 29/24; H10H 29/856; H10H 20/841; H10H 20/856
See application file for complete search history.

(56) References Cited

U.S. PATENT DOCUMENTS 10,451,921 B2 10/2019 Mifune
2011/0096265 A1* 4/2011 Murakoshi ........ G02F 1/133605 349/64

(Continued)

FOREIGN PATENT DOCUMENTS

CN 105977348 A 9/2016
CN 109326585 A 2/2019

(Continued)

OTHER PUBLICATIONS

B. Zhang et al., "Research on Modification of Warpage Printing Ink for MiniLED Substrate", SID Symposium Digest of Technical Papers, May 2021, vol. 52, Issue 1, pp. 1201-1203.

(Continued)

*Primary Examiner* — Karen Kusumakar
(74) *Attorney, Agent, or Firm* — Dority & Manning, P.A.

(57) ABSTRACT

A light-emitting substrate includes: a substrate, a reflective layer, a reflective sheet, and a plurality of light-emitting devices. The reflective layer is located on a side of the substrate, and the reflective layer has a plurality of annular patterns arranged at intervals. The reflective sheet is located on a side of the reflective layer away from the substrate, and the reflective sheet has a plurality of first openings. An annular pattern is exposed by a corresponding first opening; and in a direction perpendicular to a plane where the substrate is located, an outer sidewall of the annular pattern surrounds the corresponding first opening, and an inner sidewall of the annular pattern is located in the correspond- (Continued)

ing first opening. A light-emitting device is located in an inner sidewall of one of the annular patterns.

19 Claims, 24 Drawing Sheets

(56) References Cited

U.S. PATENT DOCUMENTS

| | | | |
|---|---|---|---|
| 2015/0160402 | A1 | 6/2015 | Kim et al. |
| 2016/0252218 | A1* | 9/2016 | Fujikawa .............. F21V 19/005 362/241 |
| 2018/0175264 | A1* | 6/2018 | Lee ...................... H10H 20/857 |
| 2020/0357775 | A1* | 11/2020 | Hirasawa ............. H10H 20/853 |
| 2021/0336212 | A1 | 10/2021 | Long |
| 2022/0028933 | A1 | 1/2022 | He et al. |
| 2022/0137458 | A1 | 5/2022 | Liu et al. |
| 2022/0163849 | A1 | 5/2022 | Tien et al. |
| 2022/0206339 | A1 | 6/2022 | Sun et al. |
| 2022/0269137 | A1 | 8/2022 | Hashimoto et al. |
| 2022/0310873 | A1 | 9/2022 | Liu |
| 2022/0375911 | A1 | 11/2022 | Li et al. |
| 2024/0160063 | A1 | 5/2024 | Sun et al. |
| 2024/0377677 | A1 | 11/2024 | Qin et al. |

FOREIGN PATENT DOCUMENTS

| | | | |
|---|---|---|---|
| CN | 111061091 | A | 4/2020 |
| CN | 111308589 | A | 6/2020 |
| CN | 112198713 | A | 1/2021 |
| CN | 112233567 | A | 1/2021 |
| CN | 112713166 | A | 4/2021 |
| CN | 113064301 | A | 7/2021 |
| CN | 113093433 | A | 7/2021 |
| CN | 113126363 | A | 7/2021 |
| CN | 113253519 | A | 8/2021 |
| CN | 113345994 | B | 11/2021 |
| CN | 113777826 | A | 12/2021 |
| CN | 113889562 | A | 1/2022 |
| CN | 113985652 | A | 1/2022 |
| CN | 215526304 | U | 1/2022 |
| CN | 215680685 | U | 1/2022 |
| CN | 215896398 | U | 2/2022 |
| CN | 215986820 | U | 3/2022 |
| CN | 114442370 | A | 5/2022 |
| CN | 114447200 | A | 5/2022 |
| CN | 114527603 | A | 5/2022 |
| EP | 4207291 | A1 | 7/2023 |
| EP | 4307038 | A1 | 1/2024 |
| JP | 2006066282 | A | 3/2006 |
| JP | 2011165434 | A | 8/2011 |
| KR | 20090103292 | A | 10/2009 |
| KR | 102059126 | B1 | 12/2019 |

OTHER PUBLICATIONS

PCT International Search Report and Written Opinion (w/ English translation) for corresponding Application No. PCT/CN2022/096209, dated Feb. 22, 2023, 15 pages.
PCT International Search Report and Written Opinion (w/ English translation) for corresponding Application No. PCT/CN2022/109938, mailed Apr. 13, 2023, 12 pages.
PCT International Search Report and Written Opinion (w/ English translation) for corresponding Application No. PCT/CN2023/085258, mailed Dec. 1, 2023, 14 pages.
United States Office Action for corresponding U.S. Appl. No. 18/264,451, dated Feb. 18, 2025, 12 pages.
Chinese First Office Action (with English translation) for corresponding Application No. CN 202280001569.2, dated May 12, 2026, 19 pages.
Industrial Technology, "The Basics and Applications of 3D Printing Technology" (with English Translation), Jul. 15, 2026, 9 pages.
Indian Office Action for corresponding Application No. 202447090962, dated May 5, 2026, 8 pages.
U.S. Non-Final Office Action for corresponding U.S. Appl. No. 19/305,047, dated Mar. 6, 2026, 11 pages.

* cited by examiner

LIGHT-EMITTING SUBSTRATE AND MANUFACTURING METHOD THEREFOR, BACKLIGHT MODULE, AND DISPLAY APPARATUS

CROSS-REFERENCE TO RELATED APPLICATION

This application is a national phase entry under 35 USC 371 of International Patent Application No. PCT/CN2022/128351 filed on Oct. 28, 2022, which is incorporated herein by reference in its entirety.

TECHNICAL FIELD

The present disclosure relates to the field of display technologies, and in particular, to a light-emitting substrate and a manufacturing method therefor, a backlight module, and a display apparatus.

BACKGROUND

Due to many advantages of self-luminescence, high efficiency, high brightness, high reliability, energy saving and fast response time, sub-millimeter light-emitting diodes, also known as mini light-emitting diodes (Mini-LEDs) and micro light-emitting diodes (Micro-LEDs) have been used in a variety of applications ranging from micro-displays, medium-sized displays, such as cell phones and televisions, to large-screen displays for cinemas. Mini-LED and Micro-LED are active self-emitting components, in which the size of Mini-LED is about 80 μm to 500 μm, and the size of Micro-LED is about less than 80 μm.

SUMMARY

In an aspect, a light-emitting substrate is provided. The light-emitting substrate includes: a substrate, a reflective layer, a reflective sheet and a plurality of light-emitting devices. The reflective layer is located on a side of the substrate, and the reflective layer has a plurality of annular patterns arranged at intervals. The reflective sheet is located on a side of the reflective layer away from the substrate, in which the reflective sheet has a plurality of first openings, an annular pattern is exposed by a corresponding first opening, and in a direction perpendicular to a plane where the substrate is located, an outer sidewall of the annular pattern surrounds the corresponding first opening, and an inner sidewall of the annular pattern is located in the corresponding first opening. A light-emitting device is located in an inner sidewall of one of the annular patterns.

In some embodiments, in a direction parallel to the plane where the substrate is located, a minimum distance between the outer sidewall of the annular pattern and the inner sidewall of the annular pattern is greater than or equal to 2.3 mm.

In some embodiments, in a direction parallel to the plane where the substrate is located, a minimum distance between the outer sidewall of the annular pattern and the corresponding first opening is greater than or equal to 2 mm.

In some embodiments, the annular pattern includes a first sub-portion, a second sub-portion, a third sub-portion and a fourth sub-portion which are sequentially connected end to end, in which the first sub-portion and the third sub-portion extend along a first direction, and the second sub-portion and the fourth sub-portion extend along a second direction, where the first direction intersects the second direction.

In some embodiments, the annular pattern includes a first sub-portion, a second sub-portion, a third sub-portion and a fourth sub-portion which are sequentially cross-connected, in which the first sub-portion and the third sub-portion extend along a first direction, and the second sub-portion and the fourth sub-portion extend along a second direction, where the first direction intersects the second direction.

In some embodiments, the first sub-portion, the second sub-portion, the third sub-portion and the fourth sub-portion are of an integral structure.

In some embodiments, the plurality of annular patterns are arranged in multiple columns along the first direction, and arranged in multiple rows along the second direction; the reflective layer further includes a plurality of connection patterns; the plurality of connection patterns include: multiple first connection patterns and multiple third connection patterns which extend along the first direction, and multiple second connection patterns and multiple fourth connection patterns which extend along the second direction; and along the first direction, two first sub-portions of two adjacent annular patterns are connected to a first connection pattern, and two third sub-portions of two adjacent annular patterns are connected to a third connection pattern; and along the second direction, two second sub-portions of two adjacent annular patterns are connected to a second connection pattern, and two fourth sub-portions of two adjacent annular patterns are connected to a fourth connection pattern.

In some embodiments, an annular pattern and a connection pattern connected thereto are of an integral structure.

In some embodiments, in the direction perpendicular to a plane where the substrate is located, a thickness of the reflective layer is in a range of 50 μm to 80 μm, inclusive.

In some embodiments, an angle between at least part of the inner sidewall of the annular pattern and the plane where the substrate is located is an acute angle; and/or an angle between at least part of the outer sidewall of the annular pattern and the plane where the substrate is located is an acute angle.

In some embodiments, at least part of the inner sidewall of the annular pattern is a curved surface; and/or at least part of the outer sidewall of the annular pattern is a curved surface.

In some embodiments, an outer boundary line of an orthographic projection of the annular pattern on the substrate includes at least one outer curved segment, and the outer curved segment protrudes in a direction away from a corresponding light-emitting device; and/or an inner boundary line of the orthographic projection of the annular pattern on the substrate includes at least one inner curved segment, and the inner curved segment protrudes in a direction toward the corresponding light-emitting device.

In some embodiments, a surface of the annular pattern away from the substrate has a plurality of protrusion structures.

In some embodiments, the annular pattern includes a first annular portion and a second annular portion which are connected to each other, in which the first annular portion surrounds at least part of a corresponding light-emitting device, and the second annular portion surrounds the corresponding light-emitting device and surrounds the first annular portion; and a thickness of the first annular portion is less than or equal to a thickness of the second annular portion.

In some embodiments, in a direction parallel to the plane where the substrate is located, a distance between the inner sidewall of the annular pattern and a corresponding light-emitting device is in a range of 0 μm to 300 μm, inclusive.

In some embodiments, in a direction parallel to the plane where the substrate is located, a minimum distance between the first opening and a corresponding light-emitting device is greater than or equal to 500 μm.

In some embodiments, the first opening is in a shape of a rectangle or circle.

In some embodiments, the light-emitting substrate further includes: an encapsulation layer located on a side of the plurality of light-emitting devices away from the substrate, the encapsulation layer including a plurality of encapsulation patterns, in which an orthographic projection of the light-emitting device on the substrate is located in a range of an orthographic projection of an encapsulation pattern on the substrate, and the orthographic projection of the encapsulation pattern on the substrate is overlapping with an orthographic projection of the annular pattern on the substrate.

In some embodiments, the orthographic projection of the encapsulation pattern on the substrate is partially overlapping with an orthographic projection of the reflective sheet on the substrate.

In some embodiments, the orthographic projection of the encapsulation pattern on the substrate is non-overlapping with an orthographic projection of the reflective sheet on the substrate.

In another aspect, a manufacturing method for a light-emitting substrate is provided. The manufacturing method includes: providing a substrate; fixing a plurality of light-emitting devices on the substrate; forming a reflective layer on the substrate by using a three dimensional (3D) printing process, in which the reflective layer has a plurality of annular patterns arranged at intervals, and a light-emitting device is located in an inner sidewall of one of the annular patterns; and attaching a reflective sheet on a side of the reflective layer away from the substrate, in which the reflective sheet has a plurality of first openings, an annular pattern is exposed by a corresponding first opening, and in a direction perpendicular to a plane where the substrate is located, an outer sidewall of the annular pattern surrounds the corresponding first opening, and an inner sidewall of the annular pattern is located in the corresponding first opening.

In some embodiments, the plurality of light-emitting devices are arranged in multiple columns along a first direction, and arranged in multiple rows along a second direction, and the first direction intersects with the second direction; and the substrate has a plurality of first printing areas, and a first printing area surrounds a light-emitting device. Forming the reflective layer on the substrate by using the 3D printing process, includes: forming an annular pattern in the first printing area by using a printing process in a surrounding manner, the plurality of annular patterns forming the reflective layer.

In some embodiments, the first printing area includes: a first sub-area and a second sub-area; the first sub-area is closer to the light-emitting device than the second sub-area; and the first sub-area surrounds at least part of the light-emitting device, and the second sub-area surrounds the light-emitting device. Forming the annular pattern in the first printing area by using the printing process in a surrounding manner, includes: forming a first annular portion in the first sub-area by using a printing process in a surrounding manner or dotted-line manner, the first annular portion surrounding the at least part of the light-emitting device; and forming a second annular portion in the second sub-area by using another printing process in a surrounding manner, in which the second annular portion surrounds the light-emitting device and surrounds the first annular portion, a thickness of the first annular portion is less than or equal to a thickness of the second annular portion, and the first annular portion is connected to the second annular portion to form the annular pattern.

In some embodiments, the plurality of light-emitting devices are arranged in multiple columns along a first direction, and arranged in multiple rows along a second direction, and the first direction intersects with the second direction; and the substrate has a plurality of second printing areas and a plurality of third printing areas which extend along the first direction, and a plurality of fourth printing areas and fifth printing areas which extend along the second direction; and two opposite sides of the light-emitting device along the second direction are respectively provided with a second printing area and a third printing area, and two opposite sides of the light-emitting device along the first direction are respectively provided with a fourth printing area and a fifth printing area. Forming the reflective layer on the substrate by using the 3D printing process, includes: forming a first sub-portion in a second printing area on a side of each light-emitting device by using a printing process in a dotted-line manner; forming a third sub-portion in a third printing area on another side of each light-emitting device by using another printing process in a dotted-line manner; forming a second sub-portion in a fourth printing area on yet another side of each light-emitting device by using yet another printing process in a dotted-line manner; and forming a fourth sub-portion in a fifth printing area on still yet another side of each light-emitting device by using still yet another printing process in a dotted-line manner, in which a first sub-portion, a second sub-portion, a third sub-portion and a fourth sub-portion which are located around a same light-emitting device are connected to each other to form an annular pattern of the reflective layer.

In some embodiments, the plurality of light-emitting devices are arranged in multiple columns along a first direction, and arranged in multiple rows along a second direction, and the first direction intersects with the second direction; and the substrate has a plurality of sixth printing areas and a plurality of seventh printing areas which extend along the first direction, and a plurality of eighth printing areas and a plurality of ninth printing areas which extend along the second direction; and two opposite sides of a row of light-emitting devices along the second direction are respectively provided with a sixth printing area and a seventh printing area, and two opposite sides of a column of light-emitting devices along the second direction are respectively provided with an eighth printing area and a ninth printing area. Forming the reflective layer on the substrate by using the 3D printing process, includes: forming a first reflective pattern in a sixth printing area on a side of each row of light-emitting devices by using a printing process in a straight-line manner, the first reflective pattern including: first sub-portions and first connection patterns each connecting two adjacent first sub-portions, and each light-emitting device in the row corresponds to one of the first sub-portions; forming a second reflective pattern in a seventh printing area on another side of each row of light-emitting devices by using another printing process in a straight-line manner, the second reflective pattern including: third sub-portions and third connection patterns each connecting two adjacent third sub-portions, and each light-emitting device in the row corresponds to one of the third sub-portions; forming a third reflective pattern in an eighth printing area on yet another side of each column of light-emitting devices by using yet another printing process in a straight-line manner, the third reflective pattern including: second sub-portions and second connection patterns each connecting two adjacent second sub-portions, and each light-emitting device in the column corresponds to one of the second sub-portions; and forming a fourth reflective pattern in a ninth printing area on still yet another side of each column of light-emitting devices by using still yet another printing process in a straight-line manner, the fourth reflective pattern including: fourth sub-portions and fourth connection patterns each connecting two adjacent fourth sub-portions, and each light-emitting device in the column corresponds to one of the fourth sub-portions, in which a first sub-portion, a second sub-portion, a third sub-portion and a fourth sub-portion which are located around a same light-emitting device are connected to each other to form an annular pattern of the reflective layer; and a plurality of first reflective patterns, a plurality of second reflective patterns, a plurality of third reflective patterns and a plurality of fourth reflective patterns form the reflective layer.

In some embodiments, the manufacturing method further includes: before attaching the reflective sheet on the side of the reflective layer away from the substrate, forming an encapsulation layer on the side of the reflective layer away from the substrate, the encapsulation layer including a plurality of encapsulation patterns, in which the encapsulation patterns correspond to the light-emitting devices; and an orthographic projection of the light-emitting device on the substrate is located in a range of an orthographic projection of an encapsulation pattern on the substrate, and the orthographic projection of the encapsulation pattern on the substrate is overlapping with an orthographic projection of the annular pattern on the substrate.

In yet another aspect, a backlight module is provided. The backlight module includes: the light-emitting substrate as described in the above embodiments, and optical film sheets located on a light-exit side of the light-emitting substrate.

In still yet another aspect, a display apparatus is provided. The display apparatus includes: the backlight module as described in the above embodiments, a color filter substrate located on a light-exit side of the backlight module, and an array substrate located between the backlight module and the color filter substrate.

BRIEF DESCRIPTION OF THE DRAWINGS

In order to describe technical solutions in some embodiments of the present disclosure more clearly, the accompanying drawings to be used in some embodiments of the present disclosure will be introduced briefly. Obviously, the accompanying drawings to be described below are merely some embodiments of the present disclosure, and a person of ordinary skill in the art can obtain other drawings according to those drawings. In addition, the accompanying drawings to be described below may be regarded as schematic diagrams, but are not limitations on actual sizes of products and actual processes of methods to which the embodiments of the present disclosure relate.

DETAILED DESCRIPTION

Figure 1A:
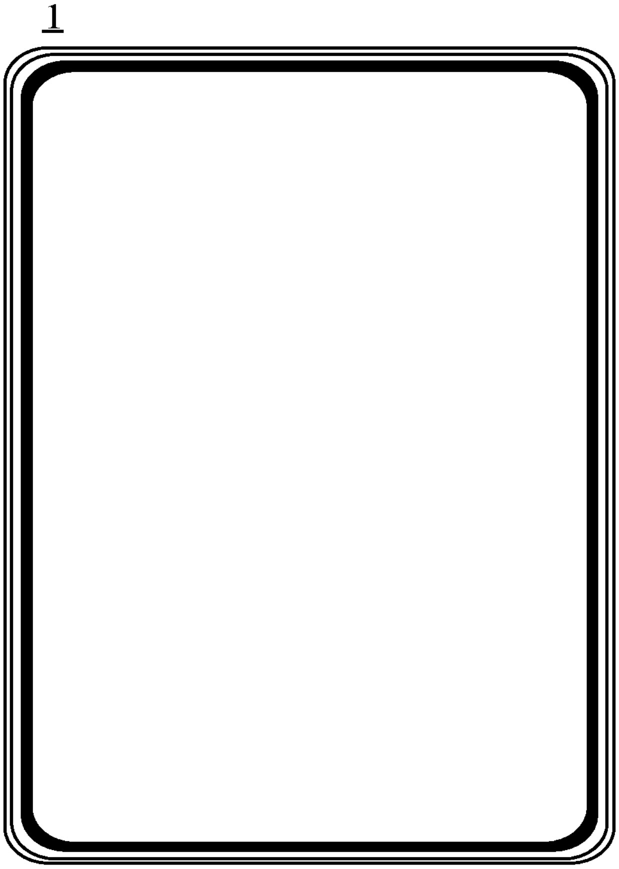
FIG. 1*a* is a structural diagram of a display apparatus, in accordance with some embodiments of the present disclosure.

The technical solutions in some embodiments of the present disclosure will be described clearly and completely with reference to the accompanying drawings; obviously, the described embodiments are merely some but not all embodiments of the present disclosure. All other embodiments obtained by a person of ordinary skill in the art based on embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "example," "specific example," or "some examples" are intended to indicate that specific features, structures, materials, or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

The terms "first" and "second" are used for descriptive purposes only, and are not to be construed as indicating or implying a relative importance or implicitly indicating a number of indicated technical features. Thus, features defined with "first" or "second" may explicitly or implicitly include one or more of the features. In the description of the embodiments of the present disclosure, the term "a/the plurality of" or "multiple" means two or more unless otherwise specified.

Some embodiments may be described using the term "connected" and its derivatives. For example, the term "connected" may represent a fixed connection, or a detachable connection, or a one-piece connection; alternatively, the term "connected" may represent a direct connection, or an indirect connection through an intermediate medium. For example, the term "connected" may be used in the description of some embodiments to indicate that two or more elements are in direct physical or electrical contact with each other. The embodiments disclosed herein are not necessarily limited to the content herein.

The phrase "A and/or B" includes the following three combinations: only A, only B, and a combination of A and B.

As used herein, the term "if" is, optionally, construed as "when" or "in a case where" or "in response to determining that" or "in response to detecting," depending on the context. Similarly, depending on the context, the phrase "if it is determined that" or "if [a stated condition or event] is detected" is optionally construed as "in a case where it is determined that" or "in response to determining that" or "in a case where [the stated condition or event] is detected" or "in response to detecting [the stated condition or event]."

The use of the phrase "applicable to" or "configured to" herein means an open and inclusive expression, which does not exclude devices that are applicable to or configured to perform additional tasks or steps.

In addition, the use of the phase "based on" is meant to be open and inclusive, since a process, step, calculation or other action that is "based on" one or more of the stated conditions or values may, in practice, be based on additional conditions or value beyond those stated.

The term such as "about," "substantially," and "approximately" as used herein includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

The term such as "perpendicular," and "equal" as used herein include a stated condition and a condition similar to the stated condition. A range of the similar condition is within an acceptable deviation range, and the acceptable deviation range is determined by a person of ordinary skill in the art, considering measurement in question and errors associated with measurement of a particular quantity (i.e., the limitations of a measurement system). The term "perpendicular" includes absolute perpendicularity and approximate perpendicularity, in which an acceptable range of deviation of the approximate perpendicularity may be, for example, a deviation within 5°. The term "equal" includes absolute equality and approximate equality, in which an acceptable range of deviation of the approximate equality may be that, for example, a difference between two that are equal is less than or equal to 5% of either of the two.

It will be understood that, in a case where a layer or element is referred to as being on another layer or substrate, it may be that the layer or the element is directly on the another layer or the substrate, or there may be a middle layer between the layer or the element and the another layer or the substrate.

Exemplary embodiments are described herein with reference to sectional views and/or plan views as idealized exemplary drawings. In the accompanying drawings, thicknesses of layers and areas of regions are enlarged for clarity. Thus, variations in shape with respect to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown to have a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Some embodiments of the present disclosure provide a display apparatus 1. As shown in FIG. 1*a*, the display apparatus 1 may be any device that can display images whether in motion (e.g., a video) or stationary (e.g., a still image), and regardless of text or image. More specifically, it is expected that the embodiments may be implemented in or associated with a plurality of electronic devices. The plurality of electronic devices may include (but is not limit to), for example, mobile telephones, wireless devices, personal data assistants (PDA), hand-held or portable computers, GPS receivers/navigators, cameras, MP4 video players, video cameras, game consoles, watches, clocks, calculators, TV monitors, flat panel displays, computer monitors, car displays (such as odometer displays), navigators, cockpit controllers and/or displays, displays with camera views (such as displays of rear view cameras in vehicles), electronic photos, electronic billboards or indicators, projectors, building structures, packagings and aesthetic structures (such as a display showing an image of a piece of jewelry), and the like.

Exemplarily, in a case where the display apparatus 1 is a large-sized display apparatus, the display apparatus 1 may include a plurality of display sub-apparatuses, and the plurality of display sub-apparatuses are spliced together to form the large-size display apparatus, so as to satisfy large-size display. This display apparatus may be called a spliced display apparatus.

In some examples, the display apparatus 1 may be a liquid crystal display (LCD) apparatus.

Figure 1B:
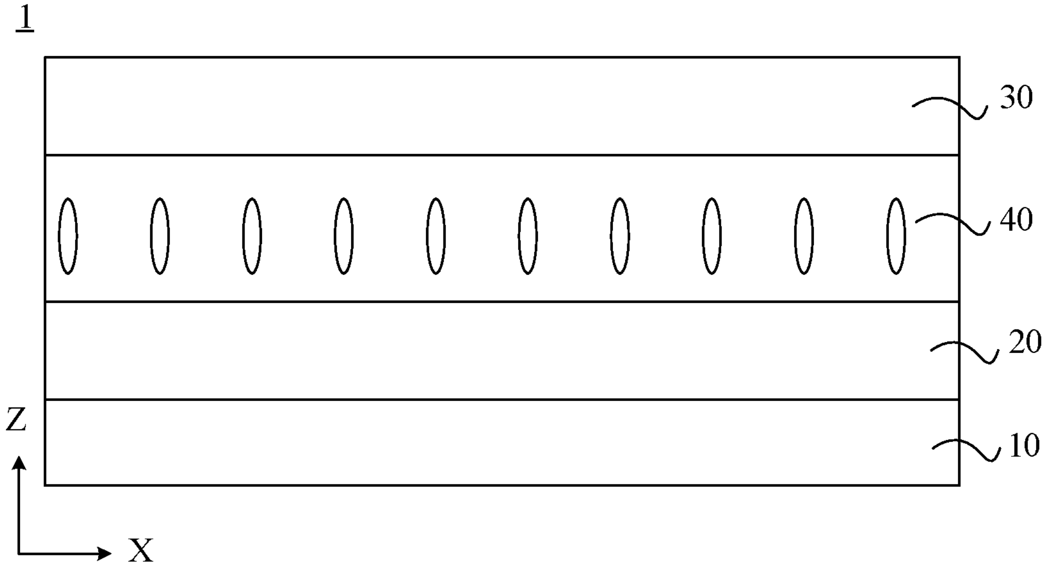
FIG. 1*b* is a structural diagram of another display apparatus, in accordance with some embodiments of the present disclosure.

In some examples, as shown in FIG. 1*b*, the display apparatus 1 includes: a backlight module 10, an array substrate 20 located on a light-exit side of the backlight module 10, and a color filter substrate 30 located on a side of the array substrate 20 away from the backlight module 10.

Exemplarily, the backlight module 10 can serve as a light source for providing backlight. For example, the backlight provided by the backlight module 10 may be white light or blue light.

For example, the light-exit side of the backlight module 10 refers to a side where the backlight module 10 emits light.

Exemplarily, the array substrate 20 may include a plurality of pixel driving circuits and a plurality of pixel electrodes, in which the plurality of pixel driving circuits are arranged in an array, for example. The plurality of pixel driving circuits are electrically connected to the plurality of pixel electrodes in one-to-one correspondence, and a pixel driving circuit provides a pixel voltage for a corresponding pixel electrode.

Exemplarily, the color filter substrate 30 may include various types of color filters. For example, in a case where backlight provided by the backlight module 10 is white light, the color filters may include red filters, green filters, and blue filters. For example, the red filter can only transmit red light in incident light, the green filter can only transmit green light in the incident light, and the blue filter can only transmit blue light in the incident light. As another example, in a case where the backlight provided by the backlight module 10 is blue light, the color filters may include red filters and green filters.

Exemplarily, the display apparatus 1 further includes a common electrode, and the common electrode may receive a common voltage.

For example, the common electrode may be disposed on the array substrate 20.

As another example, the common electrode may be disposed on the color filter substrate 30.

In some examples, as shown in FIG. 1*b*, the display apparatus 1 further includes a liquid crystal layer 40 located between the color filter substrate 30 and the array substrate 20.

Exemplarily, the liquid crystal layer 40 includes numerous liquid crystal molecules. For example, an electric field can be generated between a pixel electrode and the common electrode due to the action of the pixel voltage and the common voltage, and liquid crystal molecules located between the pixel electrode and the common electrode can be deflected due to the action of the electric field.

It can be understood that the backlight provided by the backlight module 10 can pass through the array substrate 20 and be incident on the liquid crystal molecules of the liquid crystal layer 40. The liquid crystal molecules are deflected due to the action of the electric field generated between the pixel electrode and the common electrode, thereby changing the amount of light passing through the liquid crystal molecules, so that the light passing through the liquid crystal molecules reaches a preset brightness. The light above-mentioned passes through the filters of different colors in the color filter substrate 30 and then exits. The emitted light includes light of various colors, such as red light, green light and blue light. The light rays of various colors cooperate with each other to make the display apparatus 1 realize display.

Exemplarily, the type of the backlight module 10 in the display apparatus 1 may be varied, which can be set according to actual conditions, and the present disclosure does not limit this.

For example, the backlight module 10 may be an edge-type backlight module; alternatively, the backlight module 10 may be a direct-type backlight module.

For the convenience of description, the following embodiments of the present disclosure will be introduced by taking the backlight module 10 as an example of a direct type backlight module.

Figure 2:
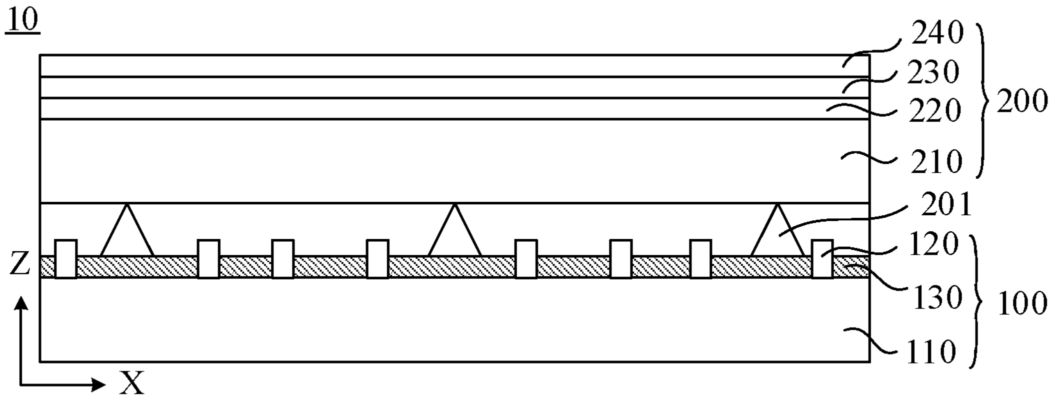
FIG. 2 is a structural diagram of a backlight module, in accordance with some embodiments of the present disclosure.

In some embodiments, as shown in FIG. 2, the backlight module 10 includes: a light-emitting substrate 100 and optical film sheets 200 located on a light-exit side of the light-emitting substrate 100.

It can be understood that the letter "Z" in FIG. 2 refers to a third direction Z, which is a thickness direction of the display apparatus 1.

Exemplarily, the optical film sheets 200 include: a diffuser plate 210, a quantum dot film 220, a diffuser sheet 230 and a composite film 240 which are disposed on the light-exit side of the light-emitting substrate 100 in sequence.

For example, the diffuser plate 210 and the diffuser sheet 230 are used to reduce lamp shadows and uniformize the light emitted by the light-emitting substrate 100 to improve the uniformity of the light.

For example, the quantum dot film 220 is used to convert light emitted from the light-emitting substrate 100. Optionally, in a case where the light emitted by the light-emitting substrate 100 is blue light, the quantum dot film 220 can convert the blue light into white light and improve the purity of the white light.

The composite film 240 may be used to increase brightness of the light emitted by the light-emitting substrate 100.

It can be understood that the light emitted by the light-emitting substrate 100 is incident on the optical film sheets 200 and the brightness of the emitted light is enhanced after emitted from the optical film sheets 200, and the emitted light has high purity and good uniformity.

The backlight module 10 may include a plurality of light-emitting substrates 100 and corresponding pluralities of optical film sheets. The plurality of light-emitting substrates 100 may be spliced together, and the corresponding pluralities of optical film sheets may also be spliced together, so that the backlight module 10 has a large size. In this case, the backlight module 10 may be called a spliced backlight module, which may be applied to the spliced display apparatus.

In some examples, as shown in FIG. 2, the backlight module 10 further includes supporting pillars 201 disposed between the light-emitting substrate 100 and the diffuser plate 210 in the optical film sheets 200.

Exemplarily, the supporting pillars 201 can be fixed on the light-emitting substrate 100 by adhesives; alternatively, the supporting pillars 201 can be arranged on the light-emitting substrate 100 by riveting. The supporting pillars 201 can be used to support the optical film sheets 200, and make the light emitted by the light-emitting substrate 100 have a certain light-mixing distance, so as to further eliminate lamp shadows and improve the uniformity of light.

Exemplarily, the display apparatus 1 further includes: a frame, a display chip and other electronic components.

In some examples, the light-emitting substrate 100 includes: a substrate 110 and a plurality of light-emitting devices 120.

Exemplarily, the substrate 110 may be a flexible substrate. The flexible substrate may be, for example, a polyethylene terephthalate (PET) substrate, a polyethylene naphthalate (PEN) substrate, or a polyimide (PI) substrate.

Exemplarily, the substrate 110 may be a rigid substrate. A material of the substrate may be glass; alternatively, the substrate 110 may be a printed circuit board (PCB), an aluminum substrate, or the like.

For the convenience of description, the material of the substrate is glass as an example for description below.

In some examples, the plurality of light-emitting devices 120 may be LEDs, such as Mini-LEDs or Micro-LEDs.

Figure 3:
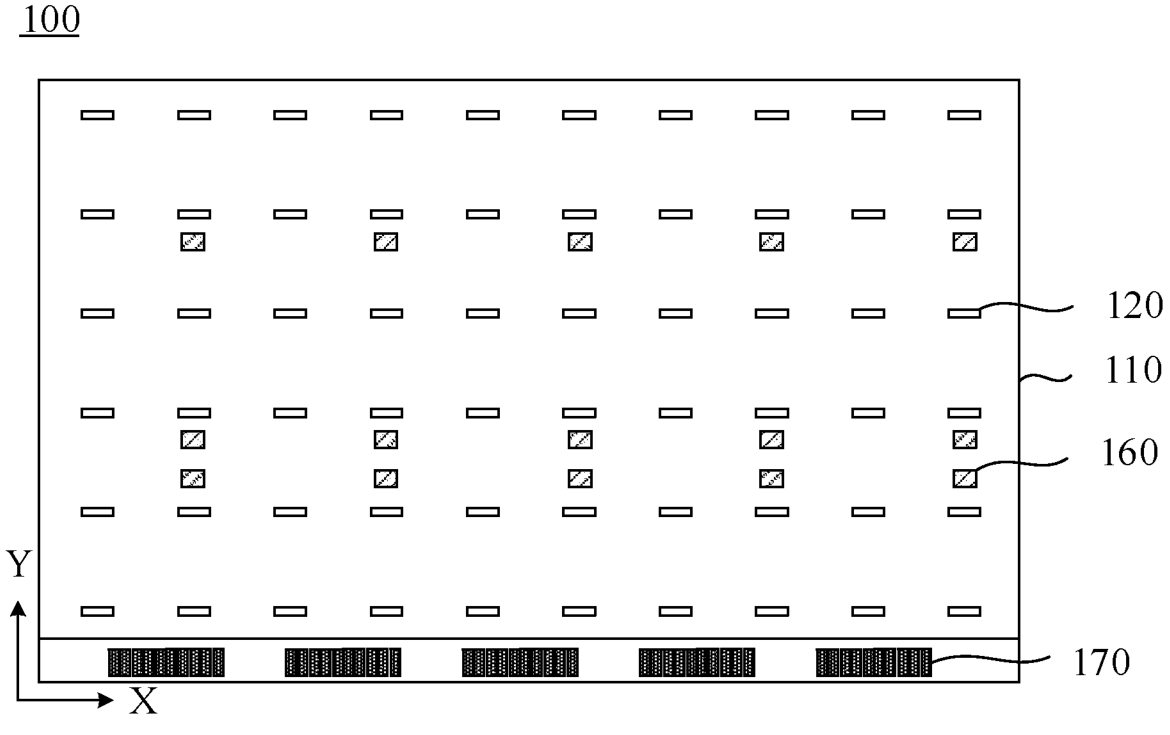
FIG. 3 is a structural diagram of a light-emitting substrate, in accordance with some embodiments of the present disclosure.

Exemplarily, as shown in FIG. 3, the plurality of light-emitting devices 120 may be arranged in multiple columns along the first direction X and in multiple rows along the second direction Y.

For example, the plurality of light-emitting devices 120 are arranged in an array. Any row of light-emitting devices 120 includes multiple light-emitting devices 120 arranged at intervals along the first direction X, and any column of light-emitting devices 120 includes multiple light-emitting devices 120 arranged at intervals along the second direction Y.

For example, an angle between the first direction X and the second direction Y may be 85°, 90°, 95°, or the like. The present disclosure takes the angle between the first direction X and the second direction Y as 90° as an example for illustration.

Exemplarily, the light-emitting devices 120 may serve as a light source of the light-emitting substrate 100.

In an implementation, the light-emitting substrate further includes: a reflective structure. The reflective structure may be a reflective layer located on a side of the light-emitting device proximate to the substrate. The reflective layer can reflect the light emitted by the light-emitting devices and improve the light efficiency of the light-emitting substrate. The reflective layer has second openings. A light-emitting device is located in a corresponding second opening. The reflective layer covers a region of the substrate except the light-emitting devices. The area of the reflective layer is large, and more reflective layer materials need to be used to prepare the reflective layer, which makes the manufacturing cost of the reflective layer and the light-emitting substrate relatively high, especially the cost of materials. Moreover, due to the large area of the reflective layer to be prepared, the preparation time of the reflective layer is long, and the preparation efficiency of the reflective layer is low, which further affects the overall manufacturing efficiency of the light-emitting substrate.

One solution is to attach a reflective sheet directly on the substrate of the light-emitting substrate as a reflective structure, omitting the preparation step of the reflective layer. Since the reflective sheet may be directly selected from finished reflective sheets, or the reflective sheet may be made separately, the reflective sheet may be directly attached to the substrate, which will not take up the manufacturing time of the light-emitting substrate, thereby improving the manufacturing efficiency of the light-emitting substrate. Moreover, the reflectivity of the reflective sheet is higher than that of the reflective layer, and has higher light efficiency. However, the accuracy of the opening in the reflective sheet is low (the accuracy of the opening is usually ±0.1 mm), and also what are needed to be considered during the process of attaching the reflective sheet are the attachment tolerance of the opening (the attachment tolerance is generally ±0.2 mm), the extension displacement of a material of the reflective sheet (the extension displacement is about 0.4 mm/m), and the like. Here, the extension displacement refers to that after a material returns to the normal temperature environment from a high temperature environment or a low temperature environment, the overall size of the material will expand or shrink, and the amount of extension or shrinkage per 1 m of the material is about 0.4 mm). After considering the above factors, it is necessary to use a reflective sheet with a larger opening area. However, the larger the opening area of the reflective sheet, the larger a distance between the light-emitting device and the opening, the light emitted by the light-emitting device will enter the opening, and the loss of the light emitted by the light-emitting device will be larger, reducing the light effect of the light-emitting substrate. Moreover, the area used for reflection in the reflective sheet is reduced to a certain extent compared with the reflective area of the reflective layer in the above implementation, so that the reflectivity of the reflective structure is reduced.

Figure 4A:
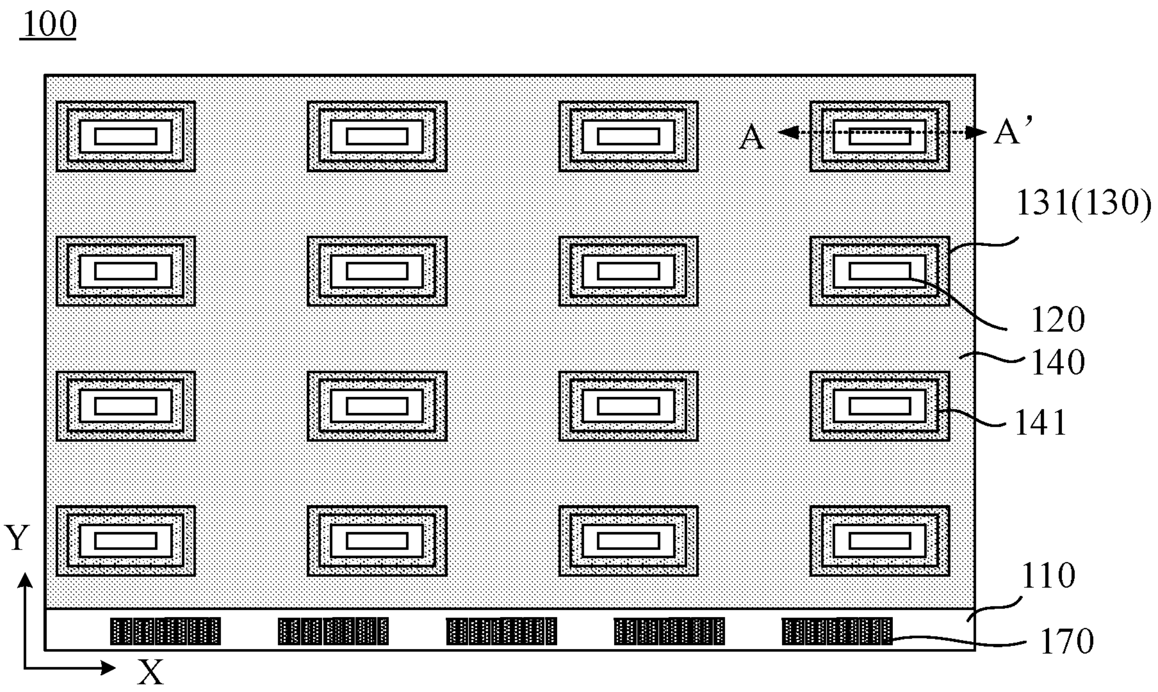
FIG. 4*a* is a structural diagram of another light-emitting substrate, in accordance with some embodiments of the present disclosure.
Figure 4B:
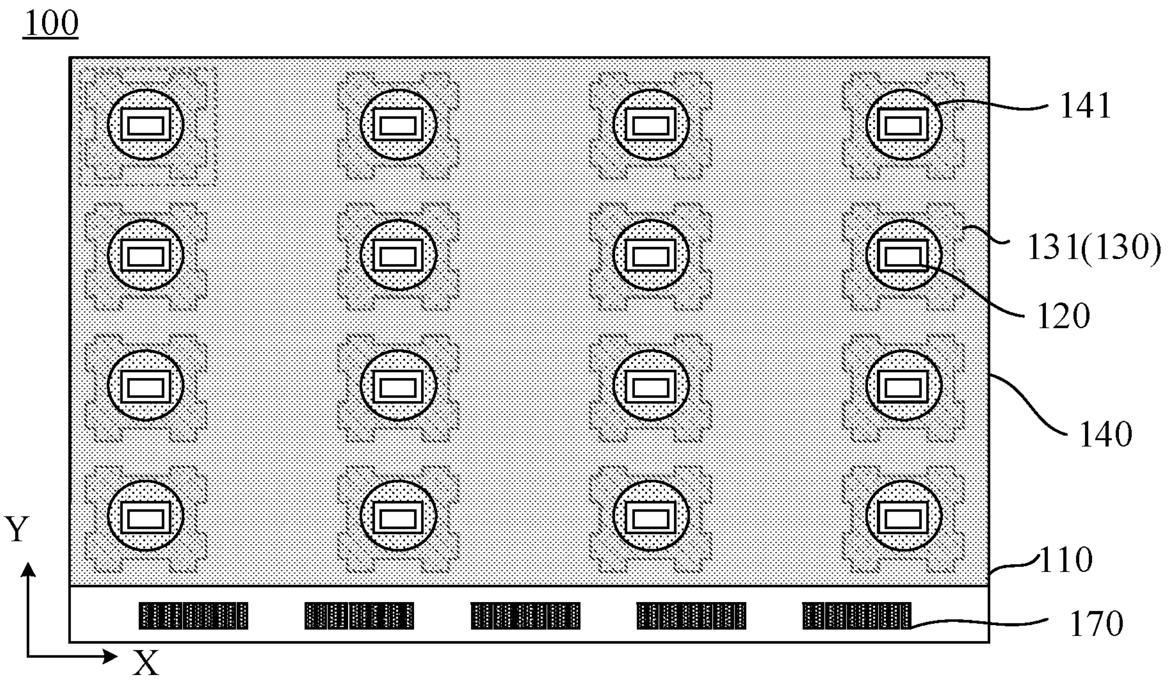
FIG. 4*b* is a structural diagram of yet another light-emitting substrate, in accordance with some embodiments of the present disclosure.
Figure 4C:
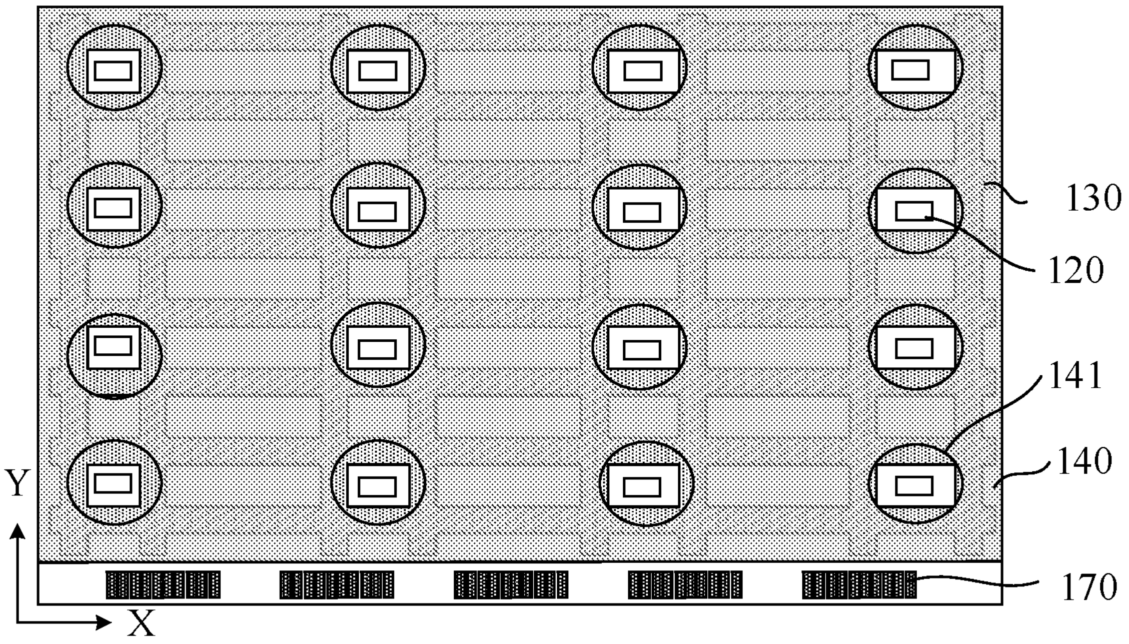
FIG. 4*c* is a structural diagram of yet another light-emitting substrate, in accordance with some embodiments of the present disclosure.

In light of this, some embodiments of the present disclosure provide a light-emitting substrate 100. As shown in FIG. 4*a*, FIG. 4*b* and FIG. 4*c*, the light-emitting substrate 100 further includes a reflective layer 130 located on a side of the substrate 110, and the reflective layer 130 has a plurality of annular patterns 131 arranged at intervals.

Exemplarily, the sum of areas of the plurality of annular patterns 131 is the effective area of the reflective layer 130. The effective area of the reflective layer 130 is small, which may save the reflective layer material, thereby reducing the manufacturing cost of the reflective layer 130 and the light-emitting substrate 100. In addition, the small effective area of the reflective layer 130 may shorten the preparation time of the reflective layer 130 and improve the preparation or production efficiency of the reflective layer 130 and the light-emitting substrate 100.

Exemplarily, the plurality of light-emitting devices 120 correspond to the plurality of annular patterns 131 one by one. It can be seen from the above that the plurality of light-emitting devices 120 are arranged in an array, and the plurality of annular patterns 131 are also arranged in an array.

Exemplarily, among the plurality of annular patterns 131, there is no direct connection between two adjacent annular patterns 131.

Figure 5A:
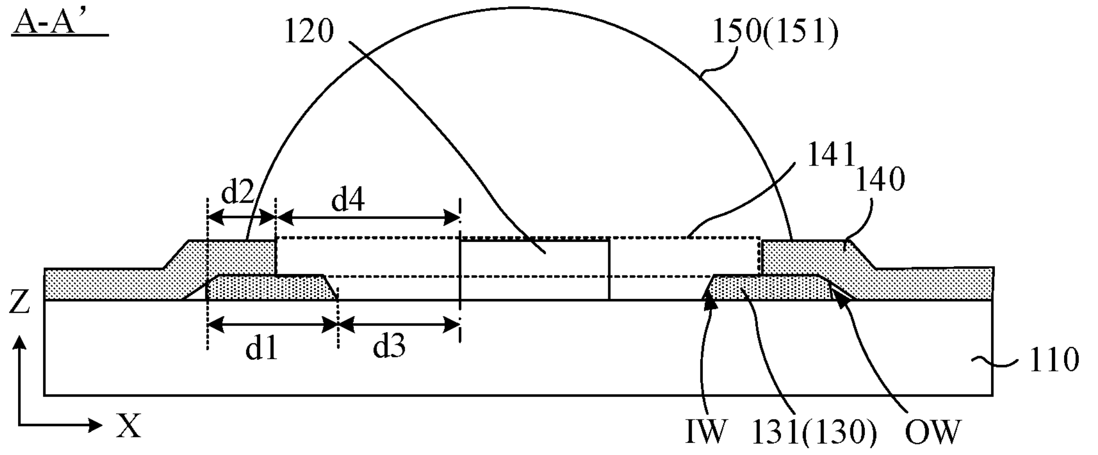
FIG. 5*a* is a structural diagram of a light-emitting substrate taken along the A-A' direction in FIG. 4*a;*

Exemplarily, as shown in FIG. 5*a*, the annular pattern 131 has a certain thickness, and the annular pattern 131 has an outer sidewall OW and an inner sidewall IW. An orthographic projection of the inner sidewall IW of the annular pattern 131 on the substrate 110 is in a range of an orthographic projection of the outer sidewall OW of the annular pattern 131 on the substrate 110. A boundary line of the orthographic projection of the inner sidewall IW of the annular pattern 131 on the substrate 110 forms a closed figure, and the closed figure is a first closed figure, for example. A boundary line of the orthographic projection of the outer sidewall OW of the annular pattern 131 on the substrate 110 also forms a closed figure, and the closed figure is a second closed figure, for example. The first closed figure is located in the second closed figure. The shape of the first closed figure may be the same as that of the second closed figure, for example, they are both circular. Alternatively, the shape of the first closed figure may be different from that of the second closed figure, for example, the shape of the first closed figure is a rectangle, and the shape of the second closed figure is a circle.

Exemplarily, a light-emitting device 120 is located in an inner sidewall IW of an annular pattern 131.

With the above arrangement, the light-emitting device 120 is located in the inner sidewall IW of the corresponding annular pattern 131. Since the preparation accuracy of the annular pattern 131 is relatively high (compared to the opening accuracy of the first opening in the reflective sheet mentioned below), a distance between the light-emitting device 120 and the annular pattern 131 can be made to be relatively small, which can prevent the light emitted by the light-emitting device 120 from entering a gap between the light-emitting device 120 and the annular pattern 131 to cause light loss, thereby improving the light efficiency of the light-emitting substrate 100.

In some examples, the reflective layer 130 further includes a connection portion connected to the plurality of annular patterns 131. The connection portion covers the region of the substrate 110 except the annular patterns. Thus, the connection portion can protect a surface of the substrate on a side proximate to the light-emitting device to avoid water vapor intrusion.

Exemplarily, the annular pattern 131 includes a first portion and a second portion arranged in layers. An orthographic projection of the first portion on the substrate is completely overlapping with an orthographic projection of the second portion on the substrate.

Exemplarily, a thickness of the annular pattern 131 is greater than a thickness of the connection portion, so the annular pattern 131 protrudes from the connection portion. In this way, not only can the connection portion protect the surface of the substrate 110, but also reduce the amount of the material of the reflective layer, and make the annular pattern 131 have sufficient thickness, thereby ensuring the light efficiency of the annular pattern 131 and improving the light efficiency of the light-emitting substrate 100.

For example, a thickness of the first portion is equal to the thickness of the connection portion.

For example, both the thickness of the first portion and the thickness of the connection portion may be 25 μm, and the thickness of the annular pattern 131 is 80 μm, that is, the sum of the thickness of the first portion and the thickness of the second portion is 80 μm.

Exemplarily, the first portion and the connection portion may be in the same layer and of the same material, so the first portion and the connection portion are of an integral structure. Therefore, the first portion and the connection portion may be formed in a single manufacturing process, thereby simplifying the manufacturing process of the reflective layer 130.

For example, the thickness of the first portion is equal to the thickness of the second portion.

As another example, the thickness of the first portion is different from the thickness of the second portion.

In some examples, as shown in FIG. 4*a* to FIG. 5*a*, the light-emitting substrate 100 further includes: a reflective sheet 140 located on a side of the reflective layer 130 away from the substrate 110, the reflective sheet 140 has a plurality of first openings 141, a first opening 141 exposes an annular pattern 131.

For example, a light-emitting device 120 is located in a first opening 141. Thus, the light-emitting device 120 can be exposed through the first opening 141, thereby preventing the light emitted by the light-emitting device 120 from being blocked by the reflective sheet 140, so that the light emitted by the light-emitting device 120 can be reflected by the reflective sheet 140, thereby improving the light efficiency of the light-emitting substrate 100.

Exemplarily, in a direction perpendicular to a plane where the substrate 110 is located (hereinafter referred to as "in a direction perpendicular to the substrate 110" as short), the outer sidewall OW of the annular pattern 131 surrounds the corresponding first opening 141, and the inner sidewall IW of the annular pattern 131 is located in the corresponding first opening 141.

For example, an outer boundary line of the orthographic projection of the annular pattern 131 on the substrate 110 is located out the first opening 141. An inner boundary line of the orthographic projection of the annular pattern 131 on the substrate 110 is located in the first opening 141. A part of the reflective sheet 140 proximate to the first opening 141 laps on the corresponding annular pattern 131, and the reflective sheet 140 is partially overlapping with each annular pattern 131.

It can be understood that the thickness of the annular pattern 131 is relatively small, which may be negligible compared to the thickness of the reflective sheet 140. Therefore, the part of the reflective sheet 140 lapping on the annular pattern does not generate an obvious step difference, which in turn does not affect the reflection of the light emitted by the light-emitting device 120 by the reflective sheet 140.

In some embodiments of the present disclosure, the reflective layer 130, the reflective sheet 140, and the light-emitting devices 120 are sequentially arranged on a side of the substrate 110 of the light-emitting substrate 100, so that the reflective area of a reflective structure composed of the reflective sheet 140 and the reflective layer 130 is relatively large, and a gap between the reflective structure and the light-emitting devices 120 is relatively small, thereby increasing the reflectivity of the reflective structure, reducing the light consumption of the light-emitting substrate 100, and improving the light efficiency of the reflective structure and the light-emitting substrate 100. Moreover, the reflective layer 130 to be set to have the plurality of annular patterns 131 arranged at intervals, and the reflective sheet 140 to be set to have the plurality of first openings 141, a first opening 141 exposes an annular pattern 131, and in the direction perpendicular to the substrate 110, the outer sidewall of the annular pattern 131 surrounds the corresponding In the first opening 141, and the inner sidewall of the annular pattern 131 is located in the corresponding first opening 141, so that the part of the reflective sheet 140 proximate to the first opening 141 laps on the annular pattern 131 of the reflective layer 130, and a light-emitting device 120 is located in the inner sidewall of an annular pattern 131. In this way, the effective area of the reflective layer 130 in the light-emitting substrate 100 (the sum of the areas of the plurality of annular patterns) is reduced, thereby reducing the amount of the reflective layer material and shortening the preparation time of the reflective layer 130, thereby reducing the manufacturing cost of the reflective layer 130 and the light-emitting substrate 100, and improving the production efficiency of the reflective layer 130 and the light-emitting substrate 100.

In some examples, as shown in FIG. 5*a*, in a direction parallel to a plane where the substrate 110 is located, the minimum distance d1 between the outer sidewall of the annular pattern 131 and the inner sidewall of the annular pattern 131 is greater than or equal to 2.3 mm.

For example, in the direction parallel to the plane where the substrate 110 is located, a distance between the outer sidewall of the annular pattern 131 and the inner sidewall of the annular pattern 131 is an annular width of the annular pattern 131, and in the direction parallel to the plane where the substrate 110 is located, the minimum distance d1 between the outer sidewall of the annular pattern 131 and the inner sidewall of the annular pattern 131 is the minimum annular width of the annular pattern 131.

Exemplarily, in the direction parallel to the plane where the substrate 110 is located, the minimum distance d1 between the outer sidewall of the annular pattern 131 and the inner sidewall of the annular pattern 131 may be 2.3 mm, 2.6 mm, 3.0 mm, 4.0 mm or 5.0 mm.

By using the above arrangement, an area of the projection of the annular pattern 131 on the substrate 110 may be large, and it may ensure to a certain extent that the reflective sheet 140 and the annular pattern 131 have a sufficient overlapping area. In this way, it is possible to avoid having a small overlapping area or even not being able to overlap between the reflective sheet 140 and the annular pattern 131 due to the small area of the projection of the annular pattern 131 on the substrate 110, thereby avoiding generating the gap between the reflective sheet 140 and the annular pattern 131, and avoiding a low reflectivity of the reflective structure.

In some examples, as shown in FIG. 5*a*, in the direction parallel to the plane where the substrate 110 is located, the minimum distance d2 between the outer sidewall of the annular pattern 131 and the first opening 141 is greater than or equal to 2 mm.

Exemplarily, in the direction parallel to the plane where the substrate 110 is located, the minimum distance d2 between the outer sidewall of the annular pattern 131 and the first opening 141 may be 2 mm, 2.5 mm, 3 mm, 4 mm or 4.5 mm.

By using the above arrangement, it is possible to make the overlapping area of the annular pattern 131 and the reflective sheet 140 large to ensure that the reflective sheet 140 laps on each annular pattern 131, so that the reflectivity of the reflective structure can be ensured to be high, to avoid a situation in which the reflective sheet 140 is not lapped on the annular pattern 131, and to avoid generating a gap between the annular pattern 131 and the reflective sheet 140, and to avoid that this gap makes the reflectivity of the reflective structure to be low, thereby avoiding reducing the light efficacy of the light-emitting substrate 100.

It can be understood that the structure of the annular pattern 131 may be varied, and may be set according to actual needs, which is not limited in the present disclosure.

Exemplarily, on a plane parallel to the plane where the substrate 110 is located, the shape of the outer sidewall of the annular pattern 131 may be the same as or different from the shape of the inner sidewall of the annular pattern 131.

For example, on the plane parallel to the plane where the substrate 110 is located, the shape of a figure surrounded by the outer sidewall of the annular pattern 131 may be an irregular shape, while the shape of a figure surrounded by the inner sidewall of the annular pattern 131 may be a regular shape, such as a circle or rectangle. As another example, on the plane parallel to the plane where the substrate 110 is located, the shape of a figure surrounded by the outer sidewall of the annular pattern 131 and the shape of a figure surrounded by the inner sidewall of the annular pattern 131 may both be regular shape, such as rectangles.

Figure 6A:
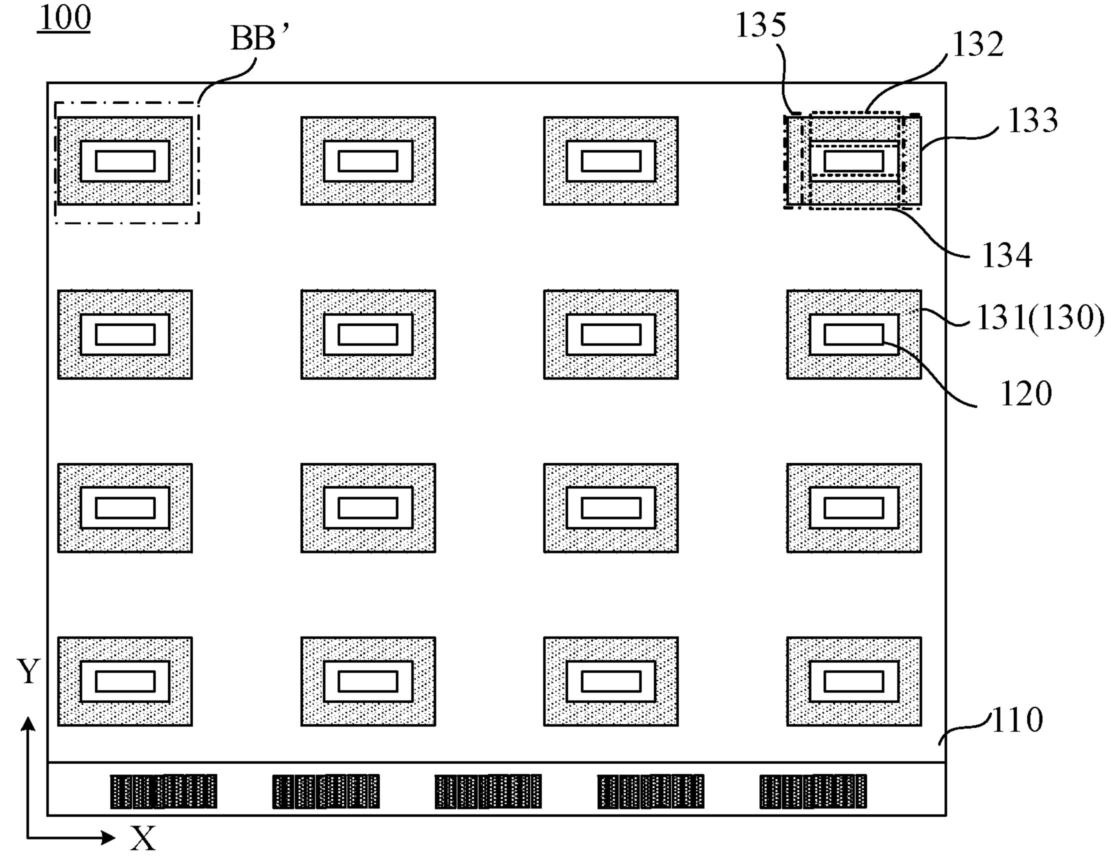
FIG. 6*a* is a structural diagram of yet another light-emitting substrate, in accordance with some embodiments of the present disclosure.
Figure 6B:
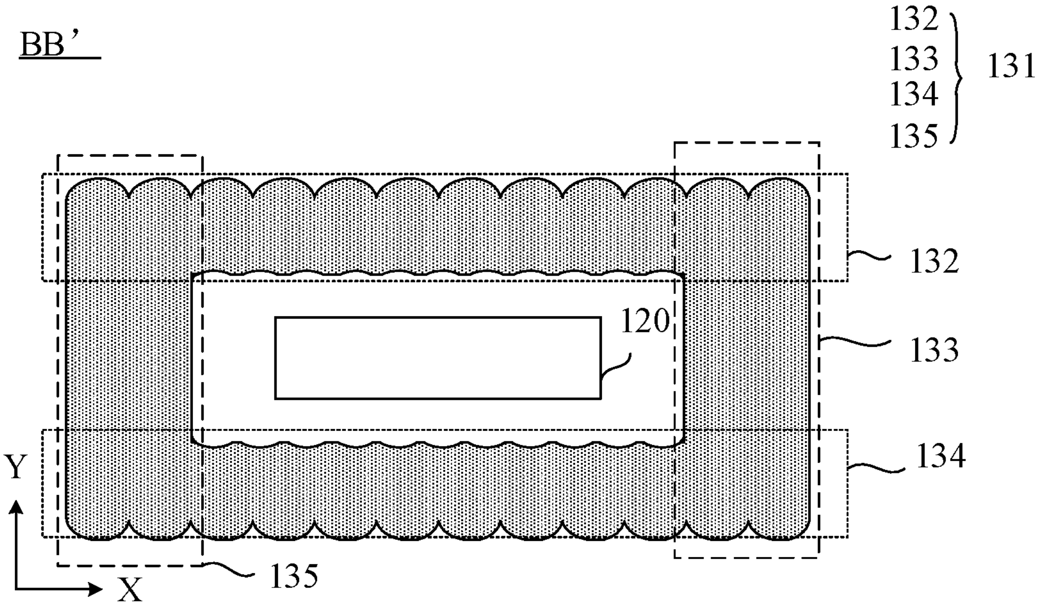
FIG. 6*b* is an enlarged structural diagram of the BB' region in FIG. 6*a;*

In some embodiments, as shown in FIG. 6*a* and FIG. 6*b*, the annular pattern 131 includes a first sub-portion 132, a second sub-portion 133, a third sub-portion 134 and a fourth sub-portion 135 which are sequentially connected end to end. The first sub-portion 132 and the third sub-portion 134 extend along the first direction X, and the second sub-portion 133 and the fourth sub-portion 135 extend along the second direction Y.

For example, the first sub-portion 132, the second sub-portion 133, the third sub-portion 134 and the fourth sub-portion 135 are each a strip-shaped structure, and the strip-shaped structure has two ends along its extending direction. The above-mentioned "connected end to end" means that a connection point between two adjacent ones of the first sub-portion 132, the second sub-portion 133, the third sub-portion 134 and the fourth sub-portion 135 is one of the two ends of each strip-shaped structure.

For example, as shown in FIG. 6*a*, two ends of the first sub-portion 132 are respectively connected to and overlapping with one end of the second sub-portion 133 and one end of the fourth sub-portion 135. Two ends of the third sub-portion 134 are respectively connected to and overlapping with the other end of the second sub-portion 133 and the other end of the fourth sub-portion 135.

Exemplarily, on the plane parallel to the plane where the substrate 110 is located, the annular pattern 131 is in the shape of the Chinese character "回". That is to say, the shape of the figure surrounded by the outer sidewall of the annular pattern 131 and the shape of the figure surrounded by the inner sidewall of the annular pattern 131 are both rectangles.

Figure 7A:
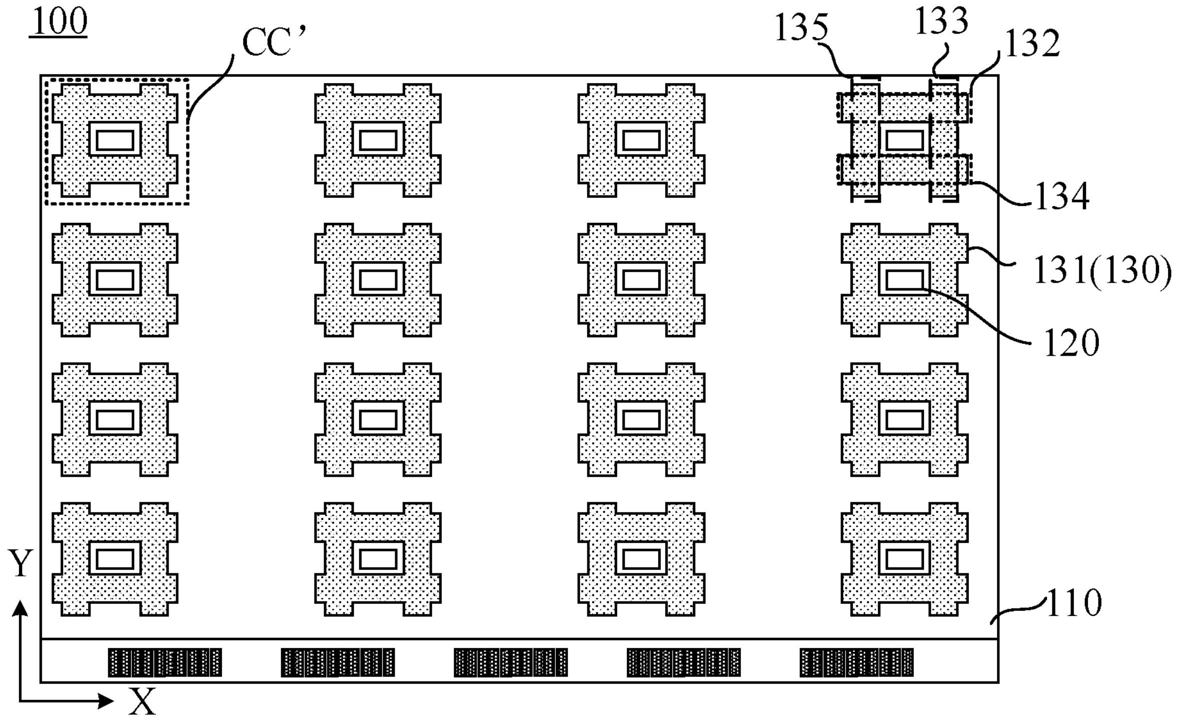
FIG. 7*a* is a structural diagram of yet another light-emitting substrate, in accordance with some embodiments of the present disclosure.

In some other examples, as shown in FIG. 7*a*, the annular pattern 131 includes a first sub-portion 132, a second sub-portion 133, a third sub-portion 134 and a fourth sub-portion 135 which are sequentially cross-connected. The first sub-portion 132 and the third sub-portion 134 extend along the first direction X, and the second sub-portion 133 and the fourth sub-portion 135 extend along the second direction Y.

For example, the first sub-portion 132, the second sub-portion 133, the third sub-portion 134 and the fourth sub-portion 135 are each a strip-shaped structure, and the strip-shaped structure has two ends along its extending direction. The above-mentioned "cross-connected" means that a connection point between two adjacent ones of the first sub-portion 132, the second sub-portion 133, the third sub-portion 134 and the fourth sub-portion 135 is proximate to one of the two ends of each strip-shaped structure and non-overlapping with the one.

For example, the end of the first sub-portion 132 adjacent to the second sub-portion 133 protrudes from the connection point between the first sub-portion 132 and the second sub-portion 133, and the end of the first sub-portion 132 adjacent to the fourth sub-portion 135 protrudes from the connection point between the first sub-portion 132 and the fourth sub-portion 135.

Exemplarily, on the plane parallel to the plane where the substrate 110 is located, the annular pattern 131 is in the shape of the Chinese character "井". That is to say, on the plane parallel to the plane where the substrate 110 is located, the shape of the figure surrounded by the outer sidewall of the annular pattern 131 is different from the shape of the figure surrounded by the inner sidewall of the annular pattern 131, and the shape of the figure surrounded by the inner sidewall of the annular pattern 131 is a rectangle.

By using the above arrangements, the connection reliability between the first sub-portion 132, the second sub-portion 133, the third sub-portion 134 and the fourth sub-portion 135 may be guaranteed, and the integrity of the annular pattern 131 formed by the first sub-portion 132, the second sub-portion 133, the third sub-portion 134 and the fourth sub-portion 135 may be guaranteed.

In some examples, as shown in FIG. 6*a* and FIG. 7*a*, the first sub-portion 132, the second sub-portion 133, the third sub-portion 134 and the fourth sub-portion 135 in the above two types of embodiments are of an integral structure.

The above "integral structure" means that two patterns connected to each other are arranged in the same layer, continuous and not separated. By using the above arrangement, the first sub-portion 132, the second sub-portion 133, the third sub-portion 134, and the fourth sub-portion 135 may be formed in the same manufacturing process, thereby simplifying the preparation of the reflective layer 130 and the light-emitting substrate 100.

In some embodiments, the plurality of annular patterns 131 are arranged in multiple columns along the first direction X, and arranged in multiple rows along the second direction Y.

For example, any row of annular patterns 131 includes multiple annular patterns 131 arranged at intervals along the first direction X in sequence; and any column of annular patterns 131 includes multiple annular patterns 131 arranged at intervals along the second direction Y in sequence.

Figure 8:
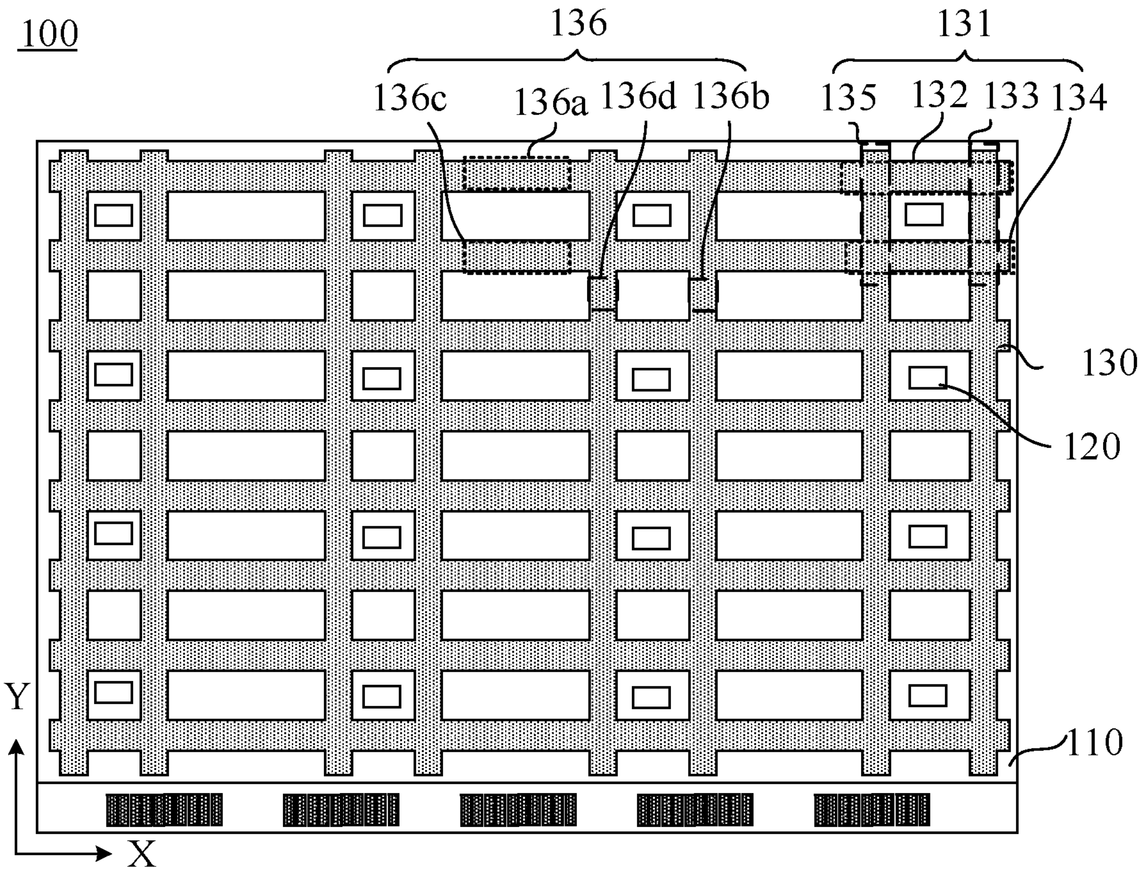
FIG. 8 is a structural diagram of yet another light-emitting substrate, in accordance with some embodiments of the present disclosure.

In some examples, as shown in FIG. 8, the reflective layer 130 further includes a plurality of connection patterns 136.

Exemplarily, the plurality of connection patterns 136 are arranged in multiple columns along the first direction X, and arranged in multiple rows along the second direction Y.

Exemplarily, the plurality of connection patterns 136 include: multiple first connection patterns 136*a* and multiple third connection patterns 136*c* which extend along the first direction X, and multiple second connection patterns 136*b* and multiple fourth connection patterns 136*d* which extend along the second direction Y.

Exemplarily, along the first direction X, two first sub-portions 132 of two adjacent annular patterns 131 are connected to a first connection pattern 136*a*, and two third sub-portions 134 of two adjacent annular patterns 131 are connected to a third connection pattern 136*c*; and along the second direction Y, two second sub-portions 133 of two adjacent annular patterns 131 are connected to a second connection pattern 136*b*, and two fourth sub-portions 135 of two adjacent annular patterns 131 are connected to a fourth connection pattern 136*d*.

It can be understood that, in these examples, any annular pattern 131 may include a first sub-portion 132, a second sub-portion 133, a third sub-portion 134 and a fourth sub-portion 135 which are sequentially connected end to end or are sequentially cross-connected.

For example, as shown in FIG. 8, the whole structure formed by the pluralities of connection patterns 136 and annular patterns 131 in the reflective layer 130 is in a shape of a dam.

By using the above arrangements, the connection reliability between the first sub-portion 132, the second sub-portion 133, the third sub-portion 134 and the fourth sub-portion 135 may be further guaranteed, thereby guaranteeing the integrity of the annular pattern 131 formed by the first sub-portion 132, the second sub-portion 133, the third sub-portion 134 and the fourth sub-portion 135.

In some examples, an annular pattern 131 and connection patterns 136 connected thereto are of an integral structure.

By using the above arrangement, an annular pattern 131 and a connection pattern 136 connected thereto may be formed in the same manufacturing process, thereby simplifying the manufacturing process of the reflective layer 130 and the light-emitting substrate 100.

In some examples, in the direction perpendicular to the substrate 110, a thickness of the reflective layer 130 is in a range of 50 μm to 80 μm, inclusive.

Figure 5B:
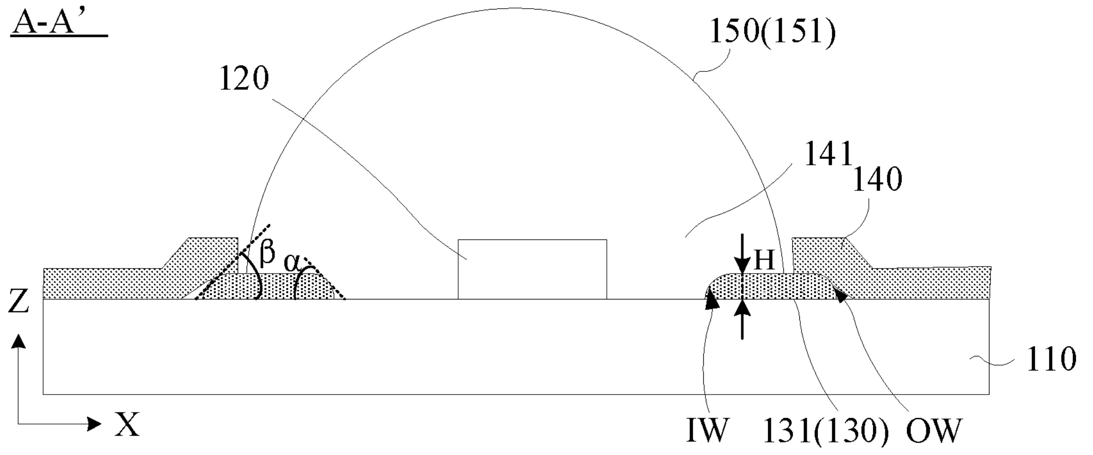
FIG. 5*b* is a structural diagram of another light-emitting substrate taken along the A-A' direction in FIG. 4*a;*

For example, as shown in FIG. 5*b*, the thickness H of the reflective layer 130 may be 50 μm, 57 μm, 63 μm, 72 μm or 80 μm.

By using the above setting method, the thickness H of the reflective layer 130 may be made appropriate, so as to ensure a high reflectivity of the reflective layer 130 and avoid the risk of a decrease in the reflectivity of the reflective layer 130 caused by a small thickness of the reflective layer 130.

In some embodiments, as shown in FIG. 5*b*, an angle α between at least part of the inner sidewall of the annular pattern 131 and the plane where the substrate 110 is located is an acute angle, and/or an angle β between at least part of the outer sidewall of the annular pattern 131 and the plane where the substrate 110 is located is an acute angle.

In some examples, the angle α between at least part of the inner sidewall of the annular pattern 131 and the plane where the substrate 110 is located is an acute angle.

For example, the angle α between at least part of the inner sidewall of the annular pattern 131 and the plane where the substrate 110 is located may be 30°, 45°, 60°, 75° or 80°.

Exemplarily, the at least part of the inner sidewall of the annular pattern 131 protrudes along a direction toward the center of a corresponding light-emitting device 120.

For example, the angle α between part of the inner sidewall of the annular pattern 131 and the plane where the substrate 110 is located is an acute angle.

As another example, the angle α between the inner sidewall of the annular pattern 131 and the plane where the substrate 110 is located is an acute angle.

In a case where the light emitted by the light-emitting device 120 is incident on the at least part of the inner sidewall, the light can be reflected on this part of the inner sidewall, and is generally emitted toward a light-exit direction of the light-emitting substrate 100, thereby improving the reflectivity of the reflective layer 130, to improve the light efficiency of the light-emitting substrate 100.

In some other examples, the angle β between at least part of the outer sidewall of the annular pattern 131 and the plane where the substrate 110 is located is an acute angle.

For example, the angle β between at least part of the outer sidewall of the annular pattern 131 and the plane where the substrate 110 is located may be 30°, 45°, 60°, 75° or 80°.

Exemplarily, the at least part of the outer sidewall of the annular pattern 131 protrudes along a direction away from the center of a corresponding light-emitting device 120.

For example, the angle β between part of the outer sidewall of the annular pattern 131 and the plane where the substrate 110 is located is an acute angle.

As another example, the angle β between the outer sidewall of the annular pattern 131 and the plane where the substrate 110 is located is an acute angle.

By using the above arrangements, the preparation process of the annular pattern 131 and the reflective layer 130 may be simplified.

In yet some other examples, the angle α between at least part of the inner sidewall of the annular pattern 131 and the plane where the substrate 110 is located is an acute angle, and the angle β between at least part of the outer sidewall of the annular pattern 131 and the plane where the substrate 110 is located is an acute angle. Therefore, In the case where the light emitted by the light-emitting device 120 is incident on the at least part of the inner sidewall, the light can be reflected on this part of the inner sidewall, and is generally emitted toward the light-exit direction of the light-emitting substrate 100, thereby improving the reflectivity of the reflective layer 130, to improve the light efficiency of the light-emitting substrate 100. In this way, the preparation process of the annular pattern 131 and the reflective layer 130 may be also simplified.

Exemplarily, the at least part of the inner sidewall of the annular pattern 131 protrudes along a direction toward the center of a corresponding light-emitting device 120; and the at least part of the outer sidewall of the annular pattern 131 protrudes along a direction away from the center of a corresponding light-emitting device 120.

In some embodiments, as shown in FIG. 5*b*, at least part of the inner sidewall IW of the annular pattern 131 is a cambered surface, and/or at least part of the outer sidewall OW of the annular pattern 131 is a cambered surface.

In some examples, at least part of the inner sidewall IW of the annular pattern 131 is a cambered surface.

Exemplarily, an annular pattern 131 corresponds to a light-emitting device 120, and an inner sidewall IW with a cambered surface protrudes along a direction toward the light-emitting device 120 corresponding thereto.

For example, part of the inner sidewall IW of the annular pattern 131 is a cambered surface.

As another example, the inner sidewall IW of the annular pattern 131 is a cambered surface.

In a case where the light emitted by the light-emitting device 120 is incident on the at least part of the inner sidewall IW, the light can be reflected on this part of the inner sidewall IW, and is generally emitted toward a light-exit direction of the light-emitting substrate 100, thereby improving the reflectivity of the reflective layer 130, to improve the light efficiency of the light-emitting substrate 100.

In some other examples, at least part of the outer sidewall OW of the annular pattern 131 is a cambered surface.

For example, an annular pattern 131 corresponds to a light-emitting device 120, and an outer sidewall OW with a cambered surface protrudes along a direction away from the light-emitting device 120 corresponding thereto.

For example, part of the outer sidewall OW of the annular pattern 131 is a cambered surface.

As another example, the outer sidewall OW of the annular pattern 131 is a cambered surface.

By using the above arrangements, the preparation process of the annular pattern 131 and the reflective layer 130 may be simplified.

In yet some other examples, at least part of the inner sidewall IW of the annular pattern 131 is a cambered surface, and at least part of the outer sidewall OW of the annular pattern 131 is a cambered surface. Therefore, In the case where the light emitted by the light-emitting device 120 is incident on the at least part of the inner sidewall IW, the light can be reflected on this part of the inner sidewall IW, and is generally emitted toward the light-exit direction of the light-emitting substrate 100, thereby improving the reflectivity of the reflective layer 130, to improve the light efficiency of the light-emitting substrate 100. In this way, the preparation process of the annular pattern 131 and the reflective layer 130 may be also simplified.

Figure 6C:
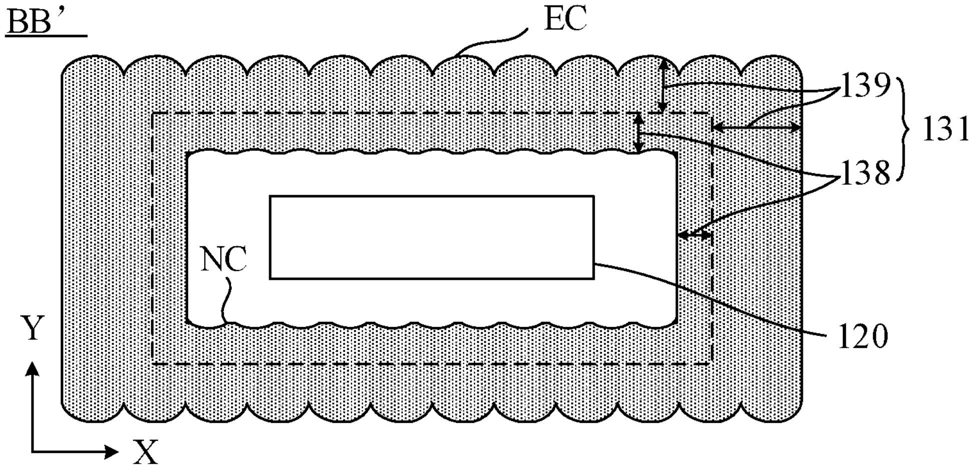
FIG. 6*c* is another enlarged structural diagram of the BB' region in FIG. 6*a;*
Figure 6D:
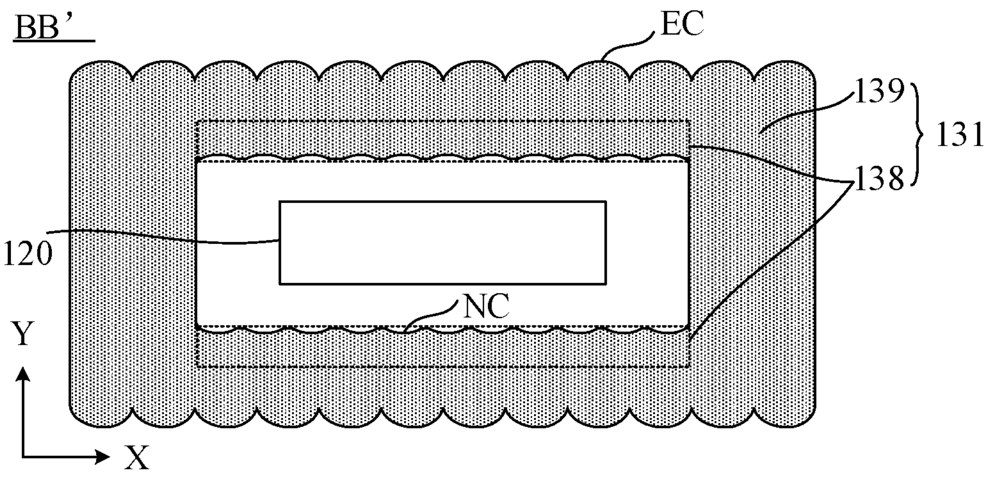
FIG. 6*d* is yet another enlarged structural diagram of the BB' region in FIG. 6*a;*
Figure 7B:
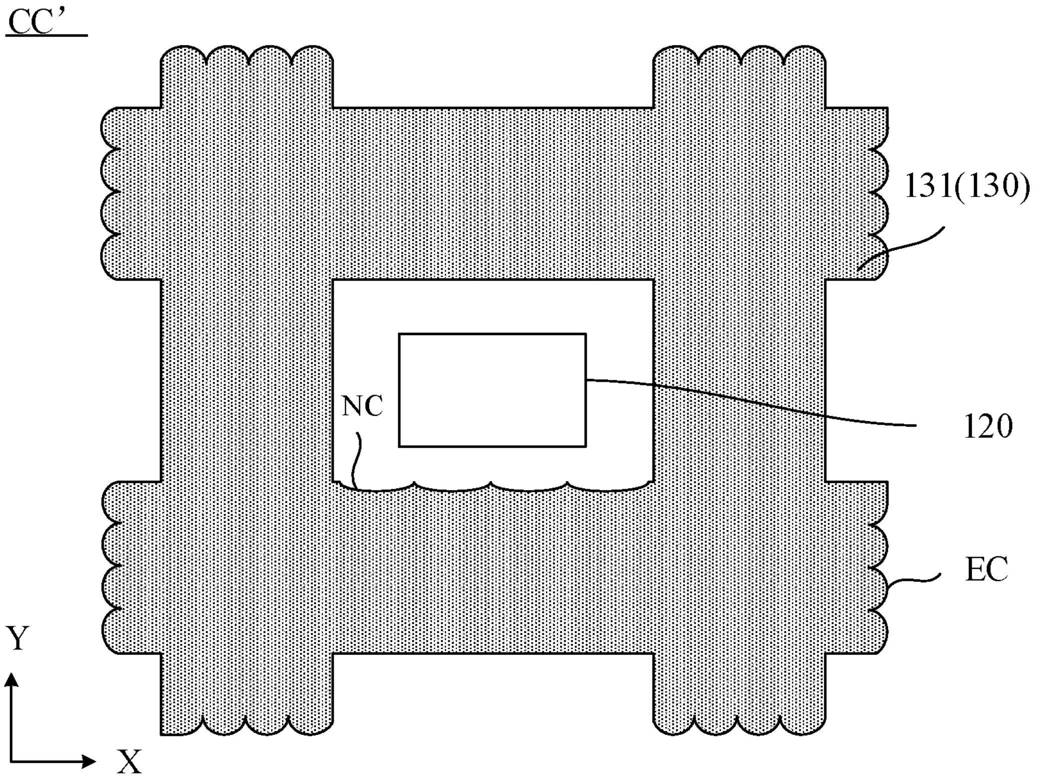
FIG. 7*b* is an enlarged structural diagram of the CC' region in FIG. 7*a;*

In some embodiments, as shown in FIG. 6*c*, FIG. 6*d* and FIG. 7*b*, an outer boundary line of an orthographic projection of the annular pattern 131 on the substrate 110 includes at least one outer curved segment EC, and the outer curved segment EC protrudes in a direction away from a corresponding light-emitting device 120; and/or an inner boundary line of the orthographic projection of the annular pattern 131 on the substrate 110 includes at least one inner curved segment NC, and the inner curved segment NC protrudes in a direction toward the corresponding light-emitting device 120.

In some examples, an outer boundary line of an orthographic projection of the annular pattern 131 on the substrate 110 includes at least one outer curved segment EC, and the outer curved segment EC protrudes in a direction away from a corresponding light-emitting device 120.

Exemplarily, the outer curved segment EC is a curved line segment. The corresponding light-emitting device 120 refers to a light-emitting device corresponding to the annular pattern 131.

For example, the outer boundary line of the orthographic projection of the annular pattern 131 on the substrate 110 includes one outer curved segment EC. That is, part of the outer boundary line of the orthographic projection of the annular pattern 131 on the substrate 110 is a curved line segment, and the other part of the outer boundary line of the orthographic projection of the annular pattern 131 on the substrate 110 is a straight-line segment.

As another example, the outer boundary line of the orthographic projection of the annular pattern 131 on the substrate 110 includes multiple outer curved segments EC. That is, part of the outer boundary line of the orthographic projection of the annular pattern 131 on the substrate 110 has a plurality of curved line segments, or the entire outer boundary line of the orthographic projection of the annular pattern 131 on the substrate 110 is constituted of a plurality of curved line segments connected to each other.

In some other examples, an inner boundary line of the orthographic projection of the annular pattern 131 on the substrate 110 includes at least one inner curved segment NC, and the inner curved segment NC protrudes in a direction toward the corresponding light-emitting device 120.

Exemplarily, the inner curved segment NC is a curved line segment. The corresponding light-emitting device 120 refers to a light-emitting device corresponding to the annular pattern 131.

For example, the inner boundary line of the orthographic projection of the annular pattern 131 on the substrate 110 includes one inner curved segment NC. That is, part of the inner boundary line of the orthographic projection of the annular pattern 131 on the substrate 110 is a curved line segment, and the other part of the inner boundary line of the orthographic projection of the annular pattern 131 on the substrate 110 is a straight-line segment.

As another example, the inner boundary line of the orthographic projection of the annular pattern 131 on the substrate 110 includes multiple inner curved segments NC. That is, part of the inner boundary line of the orthographic projection of the annular pattern 131 on the substrate 110 has a plurality of curved line segments, or the entire inner boundary line of the orthographic projection of the annular pattern 131 on the substrate 110 is constituted of a plurality of curved line segments connected to each other.

By using the above arrangements, in a case where the light emitted by the light-emitting device 120 is incident on the inner curved segment NC of the annular pattern 131, this light is reflected on the inner curved segment NC and is generally emitted toward a light-exit direction of the light-emitting substrate 100, thereby avoiding the light from being lost, to improve the light efficiency of the light-emitting substrate 100.

In yet some other examples, an outer boundary line of an orthographic projection of the annular pattern 131 on the substrate 110 includes at least one outer curved segment EC, and the outer curved segment EC protrudes in a direction away from a corresponding light-emitting device 120; and/or an inner boundary line of the orthographic projection of the annular pattern 131 on the substrate 110 includes at least one inner curved segment NC, and the inner curved segment NC protrudes in a direction toward the corresponding light-emitting device 120. Therefore, in a case where the light emitted by the light-emitting device 120 is incident on the outer curved segment and inner curved segment of the annular pattern 131, this light is reflected on the outer curved segment and inner curved segment and is generally emitted toward a light-exit direction of the light-emitting substrate 100, thereby avoiding the light from being lost, to improve the light efficiency of the light-emitting substrate 100.

Figure 9:
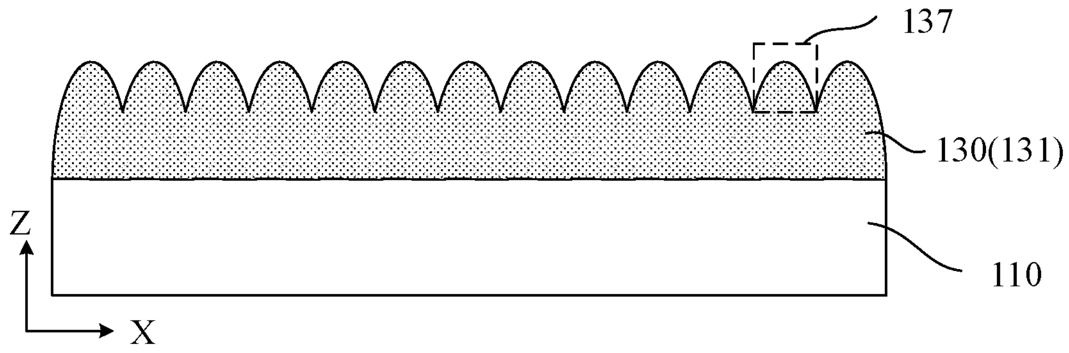
FIG. 9 is a structural diagram of yet another light-emitting substrate, in accordance with some embodiments of the present disclosure.

In some embodiments, as shown in FIG. 9, a surface of the annular pattern 131 away from the substrate 110 has a plurality of protrusion structures 137.

Exemplarily, the surface of the annular pattern 131 away from the substrate 110 is an uneven surface. The protrusion structures 137 are shape features brought about by the preparation method of the reflective layer 130.

By using the above arrangement, the light emitted by the light-emitting device 120 can be reflected on the protrusion structures 137, and the uniformity of the light emitted by the light-emitting substrate 100 may be improved.

Exemplarily, each protrusion structure 137 has a certain height. Heights of the plurality of protrusion structures 137 are determined by the specific preparation method and preparation process of the reflective layer 130. The heights of the plurality of protrusion structures 137 may be the same or different.

For example, among the plurality of protrusion structures 137, the height of a protrusion structure 137 proximate to a corresponding light-emitting device 120 may be less than or equal to the height of a protrusion structure 137 away from the corresponding light-emitting device 120.

In some embodiments, as shown in FIG. 6*b* and FIG. 6*c*, the annular pattern 131 includes a first annular portion 138 and a second annular portion 139 which are connected to each other. The first annular portion 138 surrounds at least part of the light-emitting device 120, and the second annular portion 139 surrounds the light-emitting device 120 and surrounds the first annular portion 138; and the thickness of the first annular portion 138 is less than or equal to the thickness of the second annular portion 139.

For example, as shown in FIG. 6*d*, the first annular portion 138 surrounds part of the light-emitting device 120; and the first annular portion 138 may be located on two opposite sides of the light-emitting device 120 along the first direction X, alternatively, the first annular portion 138 may be located on two opposite sides of the light-emitting device 120 along the second direction Y. An inner sidewall of the first annular portion 138 serves as part of the inner sidewall of the annular pattern 131, part of an inner sidewall of the second annular portion 139 serves as the other part of the inner sidewall of the annular pattern 131, and an outer sidewall of the second annular portion 139 serves as the outer sidewall of the annular pattern 131.

As another example, as shown in FIG. 6*c*, the first annular portion 138 surrounds the light-emitting device 120. The inner sidewall of the first annular portion 138 serves as the inner sidewall of the annular pattern 131, and the outer sidewall of the second annular portion 139 serves as the outer sidewall of the annular pattern 131.

For example, as shown in FIG. 6*c*, in a case where the first annular portion 138 surrounds the light-emitting device 120, the second annular portion 139 and the first annular portion 138 may be concentric rings, and the outer sidewall of the first annular portion 138 is connected to the inner sidewall of the second annular portion 139.

For example, the thickness of the first annular portion 138 may be less than the thickness of the second annular portion 139.

As another example, the thickness of the first annular portion 138 may be equal to the thickness of the second annular portion 139.

Exemplarily, since the surface of the annular pattern 131 away from the substrate 110 has the plurality of protrusion structures 137, the above thickness refers to the average thickness of the annular pattern 131.

By using the above setting method, the first annular portion 138 may have a high the preparation accuracy, and a distance between the inner sidewall of the annular pattern 131 and the corresponding light-emitting device 120 may be well controlled, so as to well control the shape accuracy of the formed annular pattern 131, thereby further improving the manufacturing accuracy of the reflective layer 130 and the light-emitting substrate 100.

In some embodiments, as shown in FIG. 5*a*, in the direction parallel to the plane where the substrate 110 is located, a distance d3 between the inner sidewall of the annular pattern 131 and the light-emitting device 120 is in a range of 0 μm to 300 μm, inclusive.

For example, in the direction parallel to the plane where the substrate 110 is located, the distance d3 between the inner sidewall of the annular pattern 131 and the corresponding light-emitting device 120 may be 0 μm, 10 μm, 50 μm, 200 μm or 300 μm.

By using the above arrangement, the inner sidewall of the annular pattern 131 and the light-emitting device 120 may have a relatively small distance therebetween, so that the sum of the areas of the plurality of annular patterns 131 in the reflective layer 130 is relatively large, so that the reflective structure composed of the reflective layer 130 and the reflective sheet 140 has a large area, which may increase the reflective area and reflectivity of the reflective structure, thereby reducing the light loss of the light-emitting substrate 100 and improving the light efficiency of the light-emitting substrate 100.

In some embodiments, as shown in FIG. 5*a*, in the direction parallel to a plane where the substrate 110 is located, a minimum distance d4 between the first opening 141 and a light-emitting device 120 is greater than or equal to 500 μm.

For example, in the direction parallel to a plane where the substrate 110 is located, the minimum distance d4 between the first opening 141 and the light-emitting device 120 may be 500 μm, 700 μm, 1000 μm, 1500 μm or 2000 μm.

By using the above setting method, it is possible to avoid the possible blocking of the light-emitting device 120 by the reflective sheet 140 due to misalignment between the reflective sheet 140 and the substrate 110, thereby avoiding blocking the light emitted by the light-emitting device 120, thereby improving the production efficiency of the light-emitting substrate 100.

In some embodiments, as shown in FIG. 5*a*, the light-emitting substrate 100 further includes an encapsulation layer 150 located on a side of the plurality of light-emitting devices 120 away from the substrate 110. The encapsulation layer 150 includes a plurality of encapsulation patterns 151.

Exemplarily, a material of the encapsulation layer 150 may be adhesive sealant. The adhesive sealant may be a transparent material.

For example, the plurality of encapsulation patterns 151 in the encapsulation layer 150 are arranged at intervals, and the plurality of encapsulation patterns 151 are independent and not connected to each other.

In some examples, an orthographic projection of a light-emitting device 120 on the substrate 110 is located in a range of an orthographic projection of an encapsulation pattern 151 on the substrate 110.

For example, an encapsulation pattern 151 is arranged corresponding to a light-emitting device 120.

For example, an encapsulation pattern 151 covers a corresponding light-emitting device 120.

Thus, the encapsulation patterns 151 in the encapsulation layer 150 can encapsulate the light-emitting devices 120, so as to prevent external water and oxygen from invading into the interior of the light-emitting devices 120 and avoid affecting the light efficiency of the light-emitting devices 120.

In some examples, as shown in FIG. 5*a*, an orthographic projection of an encapsulation pattern 151 on the substrate 110 is overlapping with an orthographic projection of an annular pattern 131 on the substrate 110.

For example, an encapsulation pattern 151 is arranged corresponding to a light-emitting device 120, and the light-emitting device 120 is arranged corresponding to an annular pattern 131, thus, the encapsulation pattern 151 is also arranged corresponding to the annular pattern 131.

For example, an encapsulation pattern 151 covers part of an annular pattern 131.

By using the above arrangement, the encapsulation pattern 151 can be used to protect the annular pattern 131, and the encapsulation pattern 151 can also be used to increase the bonding strength between the annular pattern 131 and the substrate 110, so as to avoid warping of the edge of the annular pattern 131 and avoid reducing the reflection of the light emitted by the light-emitting device 120 on the annular pattern 131, to ensure the reflectivity of the annular pattern 131.

It can be understood that there are various relative positional relationships between the encapsulation pattern 151 and the reflective sheet 140, which can be set according to actual needs, which is not limited in the present disclosure.

In some examples, as shown in FIG. 5*a*, an orthographic projection of the encapsulation pattern 151 on the substrate 110 is partially overlapping with an orthographic projection of the reflective sheet 140 on the substrate 110.

Exemplarily, a first opening 141 in the reflective sheet 140 is arranged corresponding to a light-emitting device 120, thus, a first opening 141 is arranged corresponding to an encapsulation pattern 151. Each encapsulation pattern 151 covers part of the reflective sheet 140 around each first opening 141. In other words, each encapsulation pattern 151 laps on the part of the reflective sheet 140 around each first opening 141.

By using the setting methods, the reflective sheet 140 can be protected by the encapsulation patterns 151, and the bonding strength between the reflective sheet 140 and the substrate 110 or reflective layer 130 may be increased by the encapsulation patterns 151, so as to avoid warping of the edge of the reflective sheet 140, so as to avoid warping of the edge of the annular pattern 131 and avoid reducing the reflection of the light emitted by the light-emitting device 120 on the annular pattern 131, to ensure the reflectivity of the annular pattern 131. In addition, since the thickness of the reflective sheet 140 is generally greater than 100 μm, the thickness of the reflective layer 130 is in the range of 50 μm to 80 μm, and the reflectivity of the reflective sheet 140 is greater than or equal to the reflectivity of the reflective layer 130, in a case where an orthographic projection of an encapsulation pattern 151 on the substrate 110 is overlapping with an orthographic projection of an annular pattern 131 on the substrate 110, the orthographic projection of the encapsulation pattern 151 on the substrate 110 is partially overlapping with an orthographic projection of the reflective sheet 140 on the substrate 110, the reflectivity of the reflective structure near the light-emitting device 120 may be improved, the reflective effect of the reflective structure may be improved, and the overall reflectivity of the reflective structure is avoided from being reduced due to the relatively small reflectivity of the reflective layer 130.

In some other examples, as shown in FIG. 5*b*, an orthographic projection of an encapsulation pattern 151 on the substrate 110 is non-overlapping with an orthographic projection of the reflective sheet 140 on the substrate 110.

Exemplarily, a boundary line of the orthographic projection of the encapsulation pattern 151 on the substrate 110 does not cross a boundary line of the orthographic projection of the reflective sheet 140 on the substrate 110.

In a case where the area of the orthographic projection of the encapsulation pattern 151 on the substrate 110 is constant, the opening area of the first opening 141 of the reflective sheet 140 in the above arrangement may be relatively large, thereby reducing the attachment accuracy of the reflective sheet 140 and the difficulty of the manufacturing process of the light-emitting substrate 100.

Exemplarily, the shape of the first opening 141 may be varied, which can be selected according to actual needs. For example, the matching shape and size of the first opening 141 may be selected according to the structure of the reflective layer 130, the shape and size of the light-emitting device 120, and the like.

Exemplarily, the shape of the orthographic projection of the encapsulation pattern 151 on the substrate 110 may be a circle, for example, the diameter of the circle may be 2.5 mm.

In some examples, the shape of the first opening 141 includes a rectangle or a circle.

Exemplarily, as shown in FIG. 4*b* and FIG. 4*c*, the first opening 141 is in a shape of a circle. In a case where the light-emitting device 120 has a small size, the circular first opening 141 may be used. The circular first opening 141 is easy to be processed and formed, and the first opening 141 can well release the attaching stress applied externally during the attaching process of the reflective sheet 140, thereby reducing the difficulty of attaching the reflective sheet 140, and improving the preparation efficiency of the light-emitting substrate 100.

Exemplarily, the diameter of the circular first opening 141 may be in a range of 3.5 mm to 5 mm, inclusive.

For example, the diameter of the circular first opening 141 may be 3.5 mm, 3.8 mm, 4.2 mm, 4.7 mm or 5 mm.

Exemplarily, the diameter of the circular first opening 141 may also be less than or equal to 2 mm.

For example, the diameter of the circular shaped first opening 141 may be 1.0 mm, 1.2 mm, 1.5 mm, 1.7 mm or 2 mm.

Exemplarily, as shown in FIG. 4*a*, the first opening 141 is in a shape of a rectangle. In a case where the light-emitting device 120 has a large size, (for example, the cross-sectional shape of the light-emitting device 120 is a rectangle, in which the length of any side of the rectangle in the cross-sectional shape is greater than 2 mm), the rectangular first opening 141 may be used. The length of any side of the rectangular first opening 141 may be in a range of 1 mm to 10 mm, inclusive. For example, the length of any side of the rectangular first opening 141 may be 1 mm, 2 mm, 5 mm, 7 mm or 10 mm.

Taking the shape of the orthographic projection of the encapsulation pattern 151 on the substrate 110 as a circle, and the diameter of the circle is 2.5 mm as an example, if the first opening 141 is circular and has the diameter less than 2 mm, then the orthographic projection of the encapsulation pattern 151 on the substrate 110 is overlapping with the orthographic projection of the reflective sheet 140 on the substrate 110; and if the first opening 141 is circular and has the diameter greater than 2 mm, the orthographic projection of the encapsulation pattern 151 on the substrate 110 is non-overlapping with the orthographic projection of the reflective sheet 140 on the substrate 110.

In some embodiments, as shown in FIG. 3, the light-emitting substrate 100 further includes a plurality of driving chips 160 disposed on the same side of the substrate 110 as the plurality of light-emitting devices 120.

In some examples, a driving chip 160 is electrically connected to at least one light-emitting device 120, and the driving chip 160 is configured to drive the at least one light-emitting device 120 to emit light.

For example, a driving chip 160 is electrically connected to one light-emitting device 120, and drives the one light-emitting device 120 to emit light.

As another example, a driving chip 160 is electrically connected to four light-emitting devices 120, and drives the four light-emitting devices 120 to emit light.

As another example, a driving chip 160 is electrically connected to nine light-emitting devices 120, and drives the nine light-emitting devices 120 to emit light.

In some examples, an orthographic projection of at least one driving chip 160 on the substrate 110 is located within a range of an orthographic projection of the reflective sheet 140 on the substrate 110. The at least one driving chip 160 is covered by the reflective sheet 140, and the rest of the driving chips 160 can be exposed through the first openings 141 of the reflective sheet 140.

For example, in a case where some driving chips 160 are exposed through first openings 141 of the reflective sheet 140, corresponding annular patterns 131 of the reflective layer 130 may also be provided around the some driving chips 160, and the structural features of these annular patterns 131 may be referred to the description about the annular pattern 131 in some of the above embodiments, which will not be repeated here. And the reflective layer 130 may not be disposed around the driving chip 160 covered by the reflective sheet 140.

As another example, orthographic projections of the plurality of driving chips 160 on the substrate 110 may be within a range of an orthographic projection of the reflective sheet 140 on the substrate 110.

By using the above arrangement, the number of the first openings 141 in the reflective sheet 140 may be reduced, thereby simplifying the preparation process of the reflective sheet 140, and also reducing the number of the annular patterns 131 in the reflective layer 130, thereby simplifying the preparation process of the reflective layer 130. In addition, the reflective sheet 140 may also protect the driving chips 160 to a certain extent, avoiding adverse phenomena such as corrosion or electric leakage of the driving chips 160 caused by external water vapor intruding into the driving chips 160.

In some examples, as shown in FIG. 3, the light-emitting substrate 100 further includes bonding structures 170. The bonding structures 170 are electrically connected to the driving chips 160, for example.

Exemplarily, the bonding structures 170 are located on a side of the light-emitting substrate 100 proximate to the edge. The bonding structures 170 are used to transmit different types of working signals to the driving chips 160, and the driving chips 160 can generate driving signals according to the different types of working signals, and transmit the driving signals to corresponding light-emitting devices 120, thereby driving the light-emitting devices 120 to emit light.

Exemplarily, a region where the bonding structures 170 are located is not covered by the reflective layer 130 and the reflective sheet 140.

Exemplarily, the bonding structure 170 may use a COF (Chip on Film, or Chip on Flex) to achieve the bonding with a PCB (Printed Circuit Board) or an FPC (Flexible Printed Circuit).

It can be understood that there are many manufacturing methods for the light-emitting substrate 100 in the above embodiments, which can be selected according to actual conditions.

It can be understood that the beneficial effects that may be achieved by the backlight module and the display apparatus provided in some embodiments of the present disclosure are the same as the beneficial effects that may be achieved by the light-emitting substrate provided in some embodiments, and will not be repeated herein.

Figure 10:
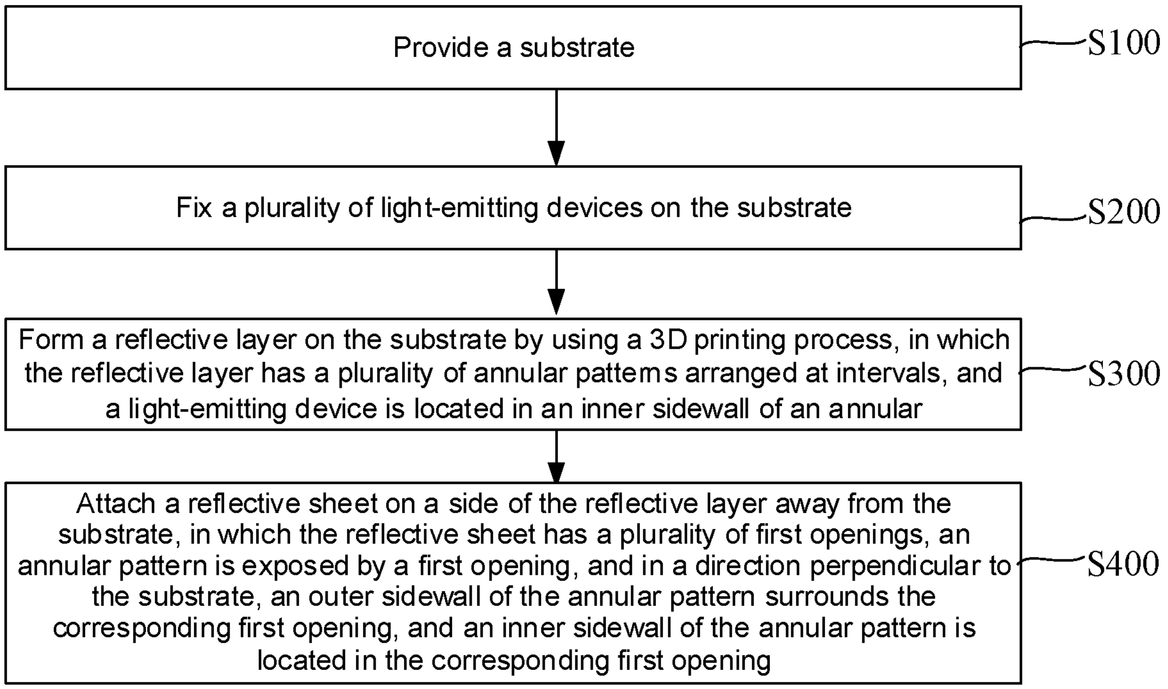
FIG. 10 is a flowchart for manufacturing a light-emitting substrate, in accordance with some embodiments of the present disclosure.

Some embodiments of the present disclosure provide a manufacturing method for a light-emitting substrate 100, as shown in FIG. 10, the manufacturing method includes steps S100 to S400.

Figure 11A:
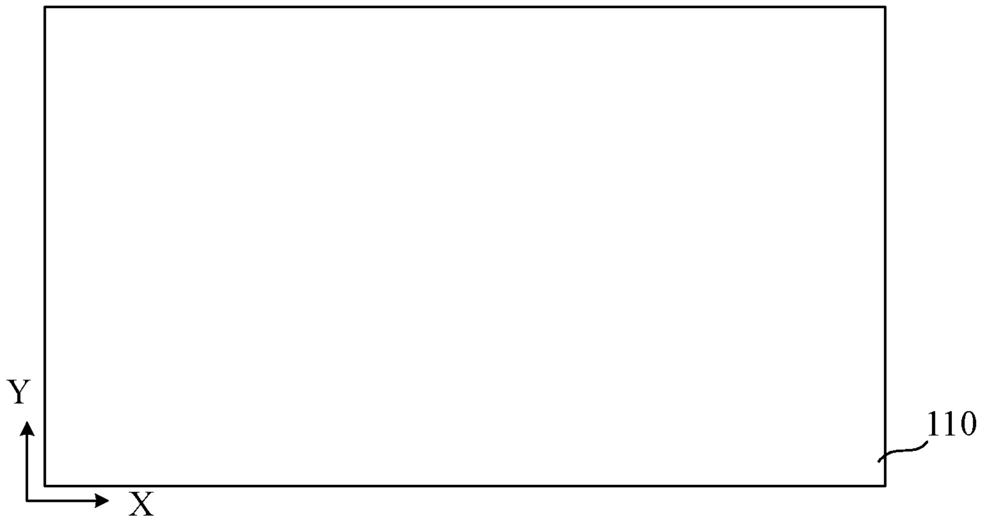
FIG. 11*a* to FIG. 11*d* are structural diagrams of a light-emitting substrate in different manufacturing stages, in accordance with some embodiments of the present disclosure.

In S100, as shown in FIG. 11*a*, a substrate 100 is provided.

Exemplarily, for a structure of the substrate 110, reference may be made to the explanation in some embodiments of the present disclosure described above, which will not be repeated here.

Figure 11B:
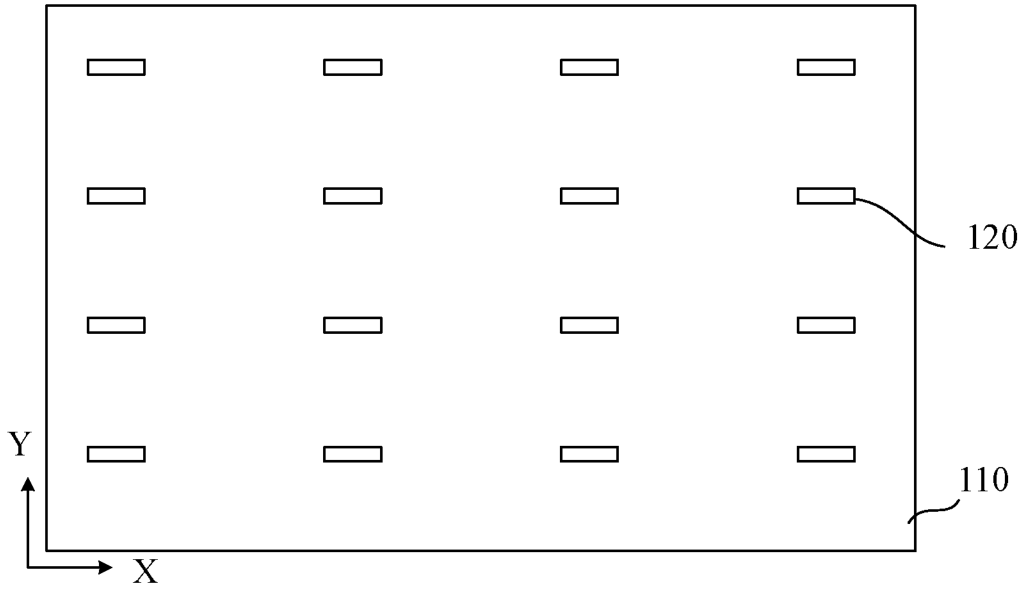

In S200, as shown in FIG. 11*b*, a plurality of light-emitting devices 120 are fixed on the substrate 110.

Exemplarily, the plurality of light-emitting devices 120 may be fixed on the substrate 110 by using a die-bonding process.

Exemplarily, the light-emitting device 120 may be a LED, such as a Micro LED or a Mini LED.

For example, taking the light-emitting device 120 is a Mini-LED, the structure of the Mini-LED may be an upright structure, a vertical structure, or an inverted structure.

Exemplarily, the plurality of light-emitting devices 120 may be evenly distributed on the substrate 110, so that the entire surface of the light-emitting substrate 100 can emit light evenly, thereby improving the display quality of the backlight module 10 and the display apparatus 1.

Figure 11C:
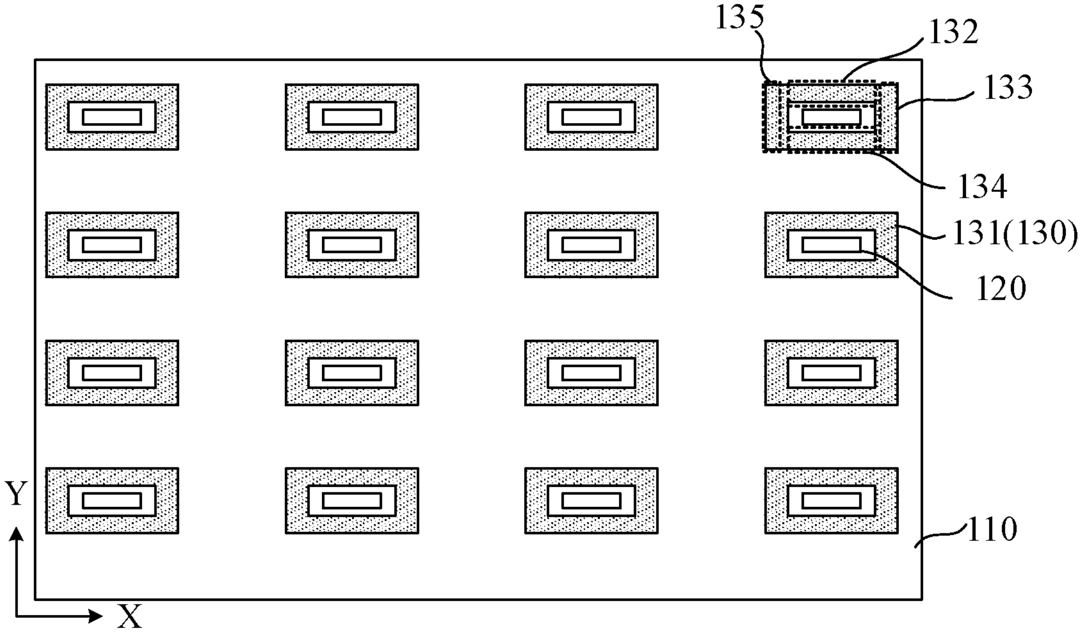

In S300, as shown in FIG. 11*c*, a reflective layer 130 is formed on the substrate 110 by using a three dimensional (3D) printing process. The reflective layer 130 has a plurality of annular patterns 131 arranged at intervals. A light-emitting device 120 is located in an inner sidewall of an annular pattern 131.

In some examples, a material of the reflective layer 130 may include: epoxy resin, phenyl silicone resin, polytetrafluoroethylene resin and the like.

In the embodiments of the present disclosure, a 3D printing device may be used to perform the 3D printing process. The 3D printing device includes multiple printing heads with the same function, and the printing heads are each provided with a printing valve. The material of the reflective layer 130 is put into the 3D printing device after certain pretreatment, and then the printing heads are moved on the substrate 110 according to the set printing path by controlling the state of the printing valves, so that the material of the reflective layer 130 is ejected from the printing heads in dots. The dots of the reflective layer material are dropped onto the substrate 110 and converge together to form a line of the reflective layer material, and adjacent lines of the reflective layer material are connected to form a plane of the reflective layer material to form a printed pattern. The whole of all printed patterns forms the reflective layer 130.

Exemplarily, the 3D printing has a high degree of freedom, the printing head ejects the fluid in non-contact manner onto the substrate 110 to be printed, and the dimensional accuracy of the reflective layer 130 and the dimensional accuracy of the opening which are formed by printing are relatively high. In this way, it is beneficial to increase the proportion of the area of the substrate 110 occupied by the reflective layer 130, thereby increasing the reflectivity of the reflective layer 130 and improving the utilization rate of light emitted by the light-emitting device 120. The 3D printing may also centrally seal and provide the reflective layer material, so that the loss rate of the reflective layer material is low during the preparation process, where the loss rate is generally less than about 5%. Therefore, forming the reflective layer 130 through the 3D printing process may greatly reduce the material cost of the reflective layer 130, and further reduce the manufacturing cost of the light-emitting substrate 100, the backlight module 10 and the display apparatus 1. In addition, in the 3D printing process, the thickness of the printed pattern formed by a single printing can already meet the reflection effect. Therefore, the process flow of the reflective layer 130 may be greatly simplified, the preparation time of the reflective layer 130 may be shortened, and the preparation efficiency of the reflective layer 130 and the light-emitting substrate 100 may be improved. In addition, shortening the preparation time of the reflective layer 130 may also reduce the extent of usage of the 3D printing device, thereby increasing the service life of spare parts in the 3D printing device, which may increase the service life of the spare parts by more than 80%.

Figure 11D:
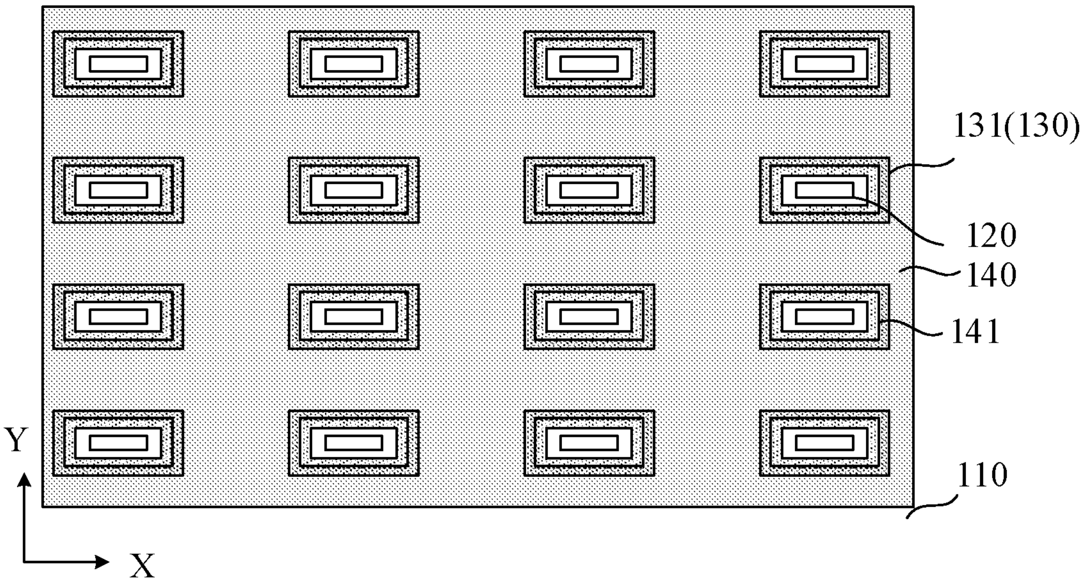

In S400, as shown in FIG. 11*d*, a reflective sheet 140 is attached on a side of the reflective layer 130 away from the substrate 110. The reflective sheet 140 has a plurality of first openings 141, an annular pattern 131 is exposed by a first opening 141, and in a direction perpendicular to the substrate 110, an outer sidewall of the annular pattern 131 surrounds the corresponding first opening 141, and an inner sidewall of the annular pattern 131 is located in the corresponding first opening 141.

Exemplarily, the first opening 141 in the reflective sheet 140 may be aligned with the light-emitting device 120 and the annular pattern 131 on the substrate 110 before attaching.

Exemplarily, the plurality of first openings 141 are arranged in multiple rows along the first direction X, and are arranged in multiple columns along the second direction Y.

Exemplarily, a distance between the sidewall of the first opening 141 and the corresponding light-emitting device 120 is greater than or equal to a distance between the inner sidewall of the corresponding annular pattern 131 and the light-emitting device 120.

In the manufacturing method for the light-emitting substrate 100 provided in some embodiments of the present disclosure provide, since the light-emitting device 120 is fixed on the substrate 110 first, and then the reflective layer 130 is formed by the 3D printing process, that is, the reflective layer 130 is formed after the die-bonding process (here refers to the process of fixing the light-emitting device 120 on the substrate 110), so that the reflective layer material can be deposited less or hardly on a pad connected to the light-emitting device 120 (residues of the reflective layer material on the pad are reduced by about 80%), which can avoid the phenomenon of extinguishing or virtual soldering caused by the deposition of the reflective layer material on the pad when the reflective layer 130 is formed first, thereby improving the production yield of the light-emitting substrate 100. The above manufacturing method may further avoid the phenomenon that the reflective layer material is oxidized and turned yellow due to the high temperature of the reflow soldering process in the die-bonding process when the reflective layer is formed before the die-bonding process, thereby avoiding the reduction of the reflectivity the reflective layer 130. In this way, the above manufacturing method may improve the light efficiency of the reflective layer 130, improve the light-emitting efficiency of the light-emitting substrate 100, improve the display brightness of the backlight module 10 and the display apparatus 1, and reduce the power consumption of the backlight module 10 and the display apparatus 1.

Moreover, the reflective layer 130 formed in the manufacturing method of the present disclosure includes the plurality of annular patterns 131 arranged at intervals, and a light-emitting device 120 is located in an inner sidewall of an annular pattern 131, that is, the reflective layer 130 is provided only in a local region of the substrate 110 (only in the region around the light-emitting devices 120 on the substrate), and then the reflective sheet 140 is attached on the reflective layer 130, and a first opening 141 in the reflective sheet 140 is provided to expose an annular pattern 131, and in the direction perpendicular to the substrate 110, the outer sidewall of the annular pattern 131 surrounds the corresponding first opening 141, and the inner sidewall of the annular pattern 131 is located in the corresponding first opening 141, so that the effective area of the reflective layer 130 in the light-emitting substrate 100 (the effective area refers to the sum of the areas of the plurality of annular patterns) is reduced, thereby reducing the amount of the reflective layer material, shortening the preparation time of the reflective layer 130, thereby reducing the damage rate of the device for preparing the reflective layer 130, reducing the material cost and device cost of the reflective layer 130 (saving about 80% of the material cost) reducing the material cost and device cost of the light-emitting substrate 100, and improving the production efficiency of the reflective layer 130 and the light-emitting substrate 100.

In addition, the reflective sheet 140 attached in the manufacturing method of the present disclosure has the plurality of first openings 141. During the process of attaching the reflective sheet, a first opening 141 exposes an annular pattern 131, and in the direction perpendicular to the substrate 110, the outer sidewall of the annular pattern 131 surrounds the corresponding first opening 141, and the inner sidewall of the annular pattern 131 is located in the corresponding first opening 141, so that the part of the reflective sheet 140 proximate to the first opening 141 laps on the annular pattern 131 of the reflective layer 130, as a result, the reflective area of the reflective structure composed of the reflective sheet 140 and the reflective layer 130 is large, and the gap between the reflective structure and the light-emitting device is small, thereby improving the reflectivity of the reflective structure and reducing the light consumption of the light-emitting substrate 100, improving the light efficiency of the reflective structure and the light-emitting substrate 100, and reducing the light consumption of the display apparatus 1.

It can be understood that the above-mentioned preparation method of the reflective layer 130 may also be a screen printing process combined with a dot repair process, or a screen printing process combined with an exposure and development process.

In a case where the reflective layer 130 is prepared by the screen printing process combined with a dot repair process, the preparation steps of the light-emitting substrate 100 may be: material preparation→screen printing process→die-bonding→dot repair→attaching reflective sheet, etc.

Exemplarily, for the reflective layer 130 formed by the above preparation method, the distance between the reflective layer 130 and the light-emitting device 120 is about 0.30 mm±0.15 mm, and the thickness of the reflective pattern formed by a single screen printing is about 30 μm±5 μm, and in order to make the reflective layer reach a certain thickness, for example, 55 μm, two screen printing processes are required. The reflectivity of the reflective layer 130 formed by this preparation method (the reflectivity is for blue light tested at a wavelength of 450 nm) is about 92%. In this preparation method, the distance between the reflective layer 130 and the light-emitting device 120 is large, the reflectivity of the reflective layer is low, the optical effect of the reflective layer is relatively poor, and the loss rate of the reflective layer material is as high as 30%.

In a case where the reflective layer 130 is prepared by the screen printing process combined with an exposure and development process, the preparation steps of the light-emitting substrate 100 may be: material preparation→screen printing process→exposure→development→die-bonding, etc.

Exemplarily, for the reflective layer 130 formed by the above preparation method, the distance between the reflective layer 130 and the light-emitting device 120 is about 0.05 mm±0.03 mm, and the thickness of the reflective pattern formed by a single screen printing is about 30 μm±5 μm, and in order to make the reflective layer reach a certain thickness, for example, 55 μm, two screen printing processes are required. The reflectivity of the reflective layer 130 formed by this preparation method (the reflectivity is for blue light tested at a wavelength of 450 nm) is about 92%. In this preparation method, the distance between the reflective layer 130 and the light-emitting device 120 is reduced, but the production capacity of two times of screen printings and two times of exposures and developments is required, which makes the preparation cost of the reflective layer relatively high, and the loss rate of the material of the reflective layer is as high as 30%.

In the manufacturing method for the light-emitting substrate provided in some of the above-mentioned embodiments of the present disclosure, the reflective layer 130 is formed on the substrate 110 by using the 3D printing process, and the reflective patterns each with a required thickness can be formed in a single printing (the thickness of the reflective layer material in the single printing is in a range of 30 μm to 100 μm, inclusive), thereby reducing the production loss of the light-emitting substrate 100, and the printing cost is low, which reduces the manufacturing cost of the reflective layer and the light-emitting substrate. In addition, the reflective layer in this manufacturing method is formed after the die-bonding, which may also avoid the risk of reducing the reflectivity of the reflective layer 130 caused by the reflow soldering process in the die-bonding process, thereby improving the light efficiency of the reflective layer 130 and improving the light-emitting efficiency of the light-emitting substrate 100, improving the display brightness of the backlight module 10 and the display apparatus 1, and reducing the power consumption of the backlight module 10 and the display apparatus 1. The reflectivity of the reflective layer in the present disclosure is about 93.5% (the reflectivity is for blue light tested at a wavelength of 450 nm), which is greater than the reflectivity of the reflective layer formed by the above screen printing preparation, and the loss rate of the reflective layer material is less than 5%.

Exemplarily, the reflective layer material ejected by the 3D printing device drops onto the substrate in the form of dots, forming a plurality of circular patterns on the substrate, and adjacent circular patterns of the plurality of circular patterns partially overlap to form a printed pattern. Thus, the amount of reflective layer material ejected by the printing valve of the printing device can be adjusted according to actual needs, so as to control the size of the circular pattern formed on the substrate.

Figure 12A:
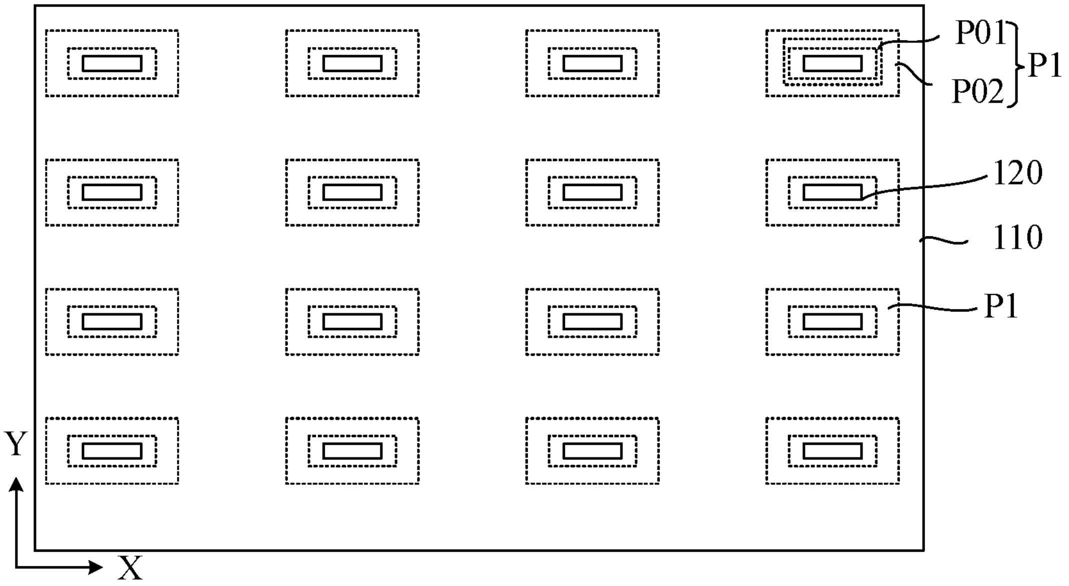
FIG. 12*a* is a structural diagram of yet another light-emitting substrate, in accordance with some embodiments of the present disclosure.
Figure 12B:
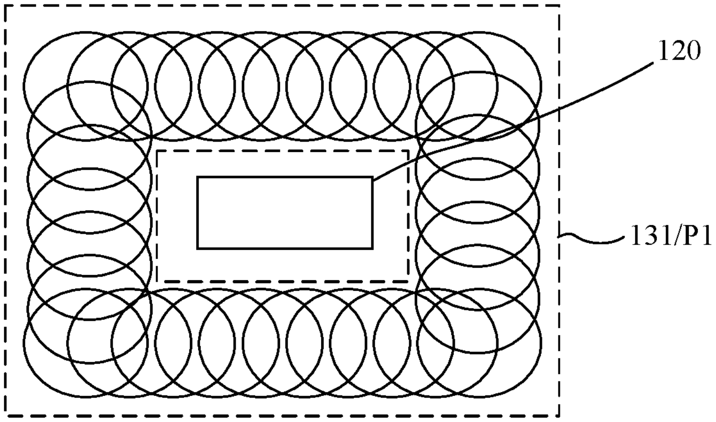
FIG. 12*b* to FIG. 12*e* are schematic diagrams showing types of three dimensional (3D) printing processes, in accordance with some embodiments of the present disclosure.
Figure 12C:
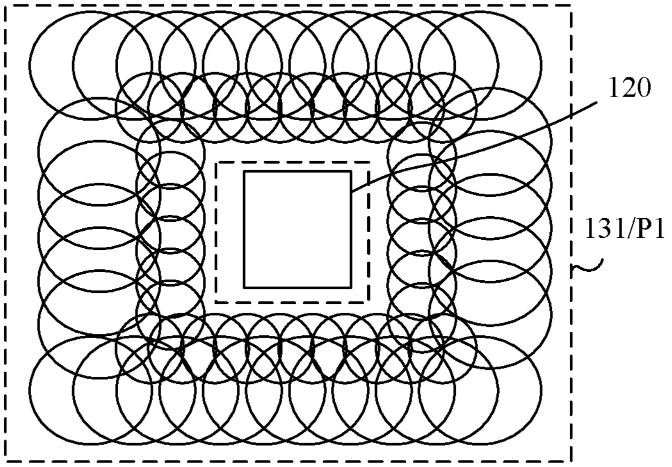
Figure 12D:
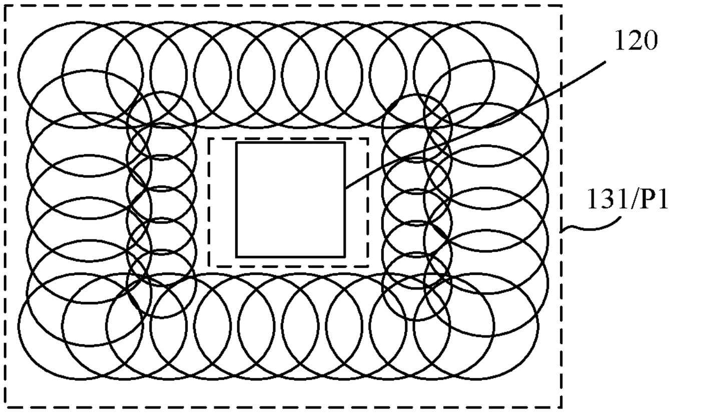
Figure 12E:
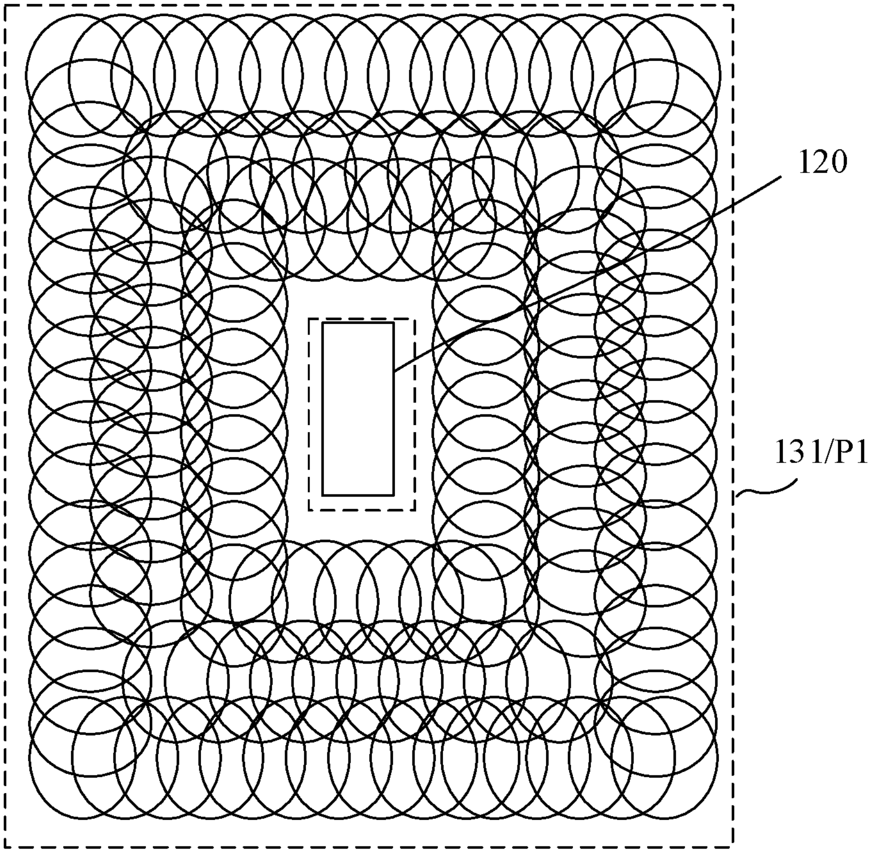

For example, as shown in FIG. 12*b*, in a case where the required printed pattern or the width of the annular pattern is small, the printing head of the 3D printing device can be adjusted to make the 3D printing device eject large dots of the reflective layer material to the substrate, thereby reducing the printing times of the printing device and improving the printing efficiency. As shown in FIG. 12*c* and FIG. 12*d*, in a case where the required printed pattern, such as the annular pattern, has high accuracy, in a region proximate to the light-emitting device 120 (such as the first sub-area P01 below), a method of small dot printing may be used (the method of small dot printing refers to a printing method in which the printing head ejects small dots of the reflective layer material), so that the accuracy of the formed annular pattern may be precisely controlled; and in a region (such as the second sub-area P02 below), a method of large dot printing may be used (the method of large dot printing refers to a printing method in which the printing head ejects large dots of the reflective layer material), so that the manufacturing efficiency of the annular pattern 131 is improved. As shown in FIG. 12*e*, in a case where the required printed pattern or the width of the annular pattern 131 is relatively large, the printing of the annular pattern 131 can be carried out in a large dot printing method, thereby reducing the number of printing times of the printing device and improving printing efficiency. The thickness of the printed pattern formed by the large dot printing method is greater than the thickness of the printed pattern formed by the small dot printing method.

In a case where the reflective layer 130 includes a connection portion connected to the plurality of annular patterns 131, the connection portion covers the region of the substrate 110 except the annular patterns, and the thickness of the annular pattern 131 is greater than the thickness of the connection portion, the preparation method of the reflective layer 130 may further include: forming first portions and the connection portion using a screen printing process; and forming second portions using a screen printing process and a dot repair process. A first portion and a second portion form an annular pattern 131, and annular patterns 131 and the connection portion form the reflective layer 130. In this way, not only can the connection portion protect the surface of the substrate 110 to avoid water vapor intrusion, but also reduce the amount of material used in the reflective layer, and make the annular pattern 131 have sufficient thickness, thereby ensuring the light effect of the annular pattern 131, and improving the light efficiency of the light-emitting substrate 100.

It can be understood that since the reflective layer in some embodiments of the present disclosure is formed by the aforementioned 3D printing process, some structural and shape features of the reflective layer 130 are unique to the 3D printing process.

Figure 12F:
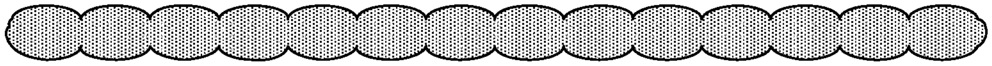
FIG. 12*f* is a schematic diagram showing a printed strip formed by a 3D printing process, in accordance with some embodiments of the present disclosure.
Figure 12G:
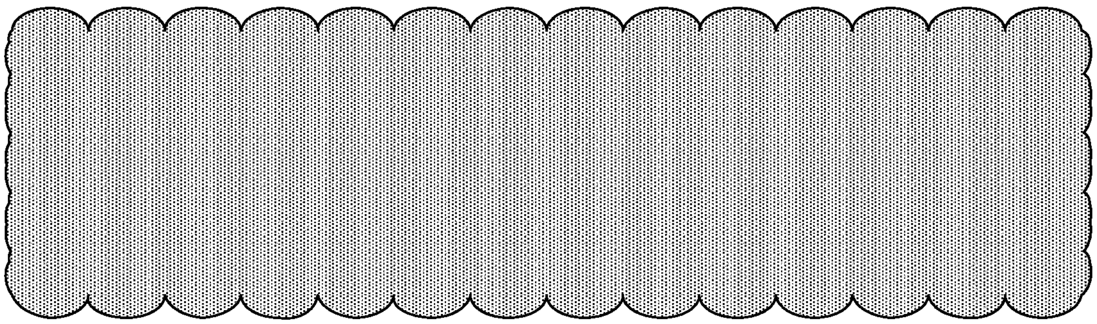
FIG. 12*g* is a schematic diagram showing a printed pattern formed by a 3D printing process, in accordance with some embodiments of the present disclosure.

Due to the use of 3D printing process, after the dots of the reflective layer material are dropped onto the substrate, these dots will level off to a certain extent. Therefore, the edge of the annular pattern formed by the 3D printing process has a specific shape and printing texture. The shape features of a single printed strip are shown in FIG. 12*f*, where the edge of the printed strip is of multiple connected curved segments. Multiple printing strips are superimposed and connected to form a printed pattern as shown in FIG. 12*g*. The edge of the printed pattern is of multiple connected curve segments, which is wavy. This is a characteristic shape of the printed pattern formed by 3D printing in some embodiments of the present disclosure.

Exemplarily, as shown in FIG. 5*b*, in the reflective layer 130 formed by the above-mentioned 3D printing process, an angle α between at least part of the inner sidewall of the annular pattern 131 and a plane where the substrate 110 is located is an acute angle, and/or an angle β between at least part of the outer sidewall of the annular pattern 131 and the plane where the substrate 110 is located is an acute angle (refer to FIG. 5*b*). For the features of the angle α and the angle β, reference may be made to the introductions in some of the above-mentioned embodiments herein, and details will not be repeated here.

Exemplarily, as shown in FIG. 5*b*, at least part of the inner sidewall of the annular pattern 131 is a cambered surface, and/or at least part of the outer sidewall of the annular pattern 131 is a cambered surface. For the features that the inner sidewall of the annular pattern 131 is the cambered surface and the outer sidewall of the annular pattern is the cambered surface, reference may be made to the introductions in some of the above-mentioned embodiments herein, and details will not be repeated here.

Exemplarily, as shown in FIG. 6*b* and FIG. 6*c*, an outer boundary line of an orthographic projection of the annular pattern 131 on the substrate 110 includes at least one outer curved segment, and the outer curved segment protrudes in a direction away from a corresponding light-emitting device; and/or an inner boundary line of the orthographic projection of the annular pattern on the substrate includes at least one inner curved segment, and the inner curved segment protrudes in a direction toward the corresponding light-emitting device. For the features of the inner curve segment and the outer curve segment, reference may be made to the introductions in some of the above-mentioned embodiments herein, and details will not be repeated here.

Exemplarily, as shown in FIG. 9, the surface of the annular pattern 131 away from the substrate 110 has a plurality of protrusion structures 137. Since the reflective layer may be formed by the 3D printing in the combination of the above-mentioned large dot printing method and small dot printing method, shapes of the protrusion structures 137 on the surface of the annular pattern 131 away from the substrate 110 are different. The height of a protrusion structure 137 on the printed pattern formed by the large dot printing method is greater than the height of a protrusion structure 137 on the printed pattern formed by the small dot printed method.

For the features of the protrusion structures, reference may be made to the introductions in some of the above-mentioned embodiments herein, and details will not be repeated here.

Exemplarily, in the direction perpendicular to the substrate 110, a thickness of the reflective layer 130 is in a range of 50 μm to 80 μm, inclusive.

Exemplarily, in the direction parallel to the plane where the substrate 110 is located, a distance d3 between the inner sidewall of the annular pattern 131 and the light-emitting device 120 is in a range of 0 μm to 300 μm, inclusive.

Exemplarily, in the direction parallel to a plane where the substrate 110 is located, a minimum distance d4 between the first opening 141 and the light-emitting device 120 is greater than or equal to 500 μm.

It should be noted that there are various preparation methods for forming the reflective layer 130 by using the 3D printing process proposed in the above embodiments of the present disclosure, which can be selected according to the structure and other features of the annular pattern 131 to be formed, which is not limited in the present disclosure. The preparation methods for the annular patterns 131 in the shape of the Chinese character "回", or in the shape of the Chinese character "井", or in the shape of a dam mentioned above in the present disclosure will be introduced respectively below.

Exemplarily, the plurality of light-emitting devices 120 are arranged in multiple columns along a first direction X, and arranged in multiple rows along a second direction Y, and the first direction X intersects with the second direction Y.

In some examples, as shown in FIG. 12*a*, the substrate 110 has a plurality of first printing areas P1, and a first printing area P1 surrounds a light-emitting device 120. Exemplarily, the shape of the first printing area P1 may be annular.

Exemplarily, the plurality of first printing areas P1 are arranged in multiple columns along the first direction X, and arranged in multiple rows along the second direction Y.

For example, any row of first printing areas P1 includes multiple first printing areas P1 arranged at intervals sequentially along the first direction X; and any column of first printing areas P1 includes multiple first printing areas P1 arranged at intervals sequentially along the second direction Y.

In some examples, S300 in which the reflective layer is formed on the substrate by using the 3D printing process includes a step S310.

In S310, as shown in FIG. 12*b* to FIG. 12*e*, the annular pattern 131 is formed in the first printing area P1 by using a printing process in a surrounding manner. The plurality of annular patterns 131 form the reflective layer 130.

Exemplarily, a printing path is needed to be set for the 3D printing device before printing. The printing process in a surrounding manner means that the overall printing path of the 3D printing device is non-linear, and after printing is completed, the overall outline of the formed printed pattern is a closed ring or a part of a ring.

In a case where the printing process in a surrounding manner is used, the printing valve may be a piezoelectric valve or a solenoid valve. The printing frequency of the 3D printing device controlled by the piezoelectric valve is in a range of 300 Hz to 600 Hz, since the printing frequency is high, and the fluid output from the printing head is less, there will be no tailing phenomenon at the initial printing position, so that high-accuracy printing can be obtained. In this way, the thickness of the printed pattern formed by printing is small, and the shape accuracy of the annular pattern 131 may be improved, so that the distance between the annular pattern 131 and the light-emitting device 120 may be precisely controlled, and the distance between the light-emitting device 120 and the annular pattern 131 may be controlled to be small or even zero, which may increase the reflectivity of the reflective layer 130, improve the light efficiency of the light-emitting substrate 100, and reduce the power consumption of the backlight module 10 and the display apparatus 1.

As shown in FIG. 11*d*, an orthographic projection on the substrate 110 of the annular pattern 131 formed by the above-mentioned preparation method is in a shape of the Chinese character "回".

A reflective layer prepared and formed in an implementation will be compared and described below with the reflective layer prepared and formed in embodiments of the present disclosure. For example, a plurality of light-emitting devices 120 are evenly arranged on a substrate 110, a distance between two adjacent light-emitting devices 120 is 10 mm, the number of the light-emitting devices 120 is 100, and the area of a region used for light-emitting in the light-emitting substrate 100 is 10000 $mm^2$ (the region for light-emitting is a square, the side length is 100 mm, and the area is 100 mm*100 mm). In an implementation, a reflective layer is prepared and formed on the substrate 110, and second openings are provided in the reflective layer, and the second openings correspond to the light-emitting devices, so the number of the second openings is 100, and the shape of the second opening may be a square, and the side length of the square is 1 mm, the area of the reflective layer that needs to be printed is 9900 $mm^2$ (the area is obtained by the difference between the area of the region for light-emitting of 10000 $mm^2$ and the sum of the areas of 100 second openings of 100 $mm^2$). In the present disclosure, the reflective layer 130 has the plurality of annular patterns 131, and the annular patterns 131 are each in the structure of the Chinese character "回". If in a plane parallel to the plane where the substrate 110 is located, the side length of a square surrounded by the outer sidewall of the annular pattern 131 is 4 mm, and the side length of a square surrounded by the inner sidewall of the annular pattern 131 is 1 mm, the area of the reflective layer 130 that needs to be printed is 1500 $mm^2$ (this area is the sum of the areas of 100 annular patterns 131), the area of the reflective layer 130 formed by printing is 1500 $mm^2$, which is much less than the above-mentioned 9900 $mm^2$. It can be seen that, compared with the design scheme of the reflective layer in the above implementation, the area of the reflective layer in the present disclosure is reduced by 85%, which may further reduce the material cost of the reflective layer by about 85%.

In the above example, as shown in FIG. 12*a*, the first printing area P1 includes: a first sub-area P01 and a second sub-area P02. The first sub-area P01 is closer to the light-emitting device 120 than the second sub-area P02; the first sub-area P01 surrounds at least part of the light-emitting device 120, and the second sub-area P02 surrounds the light-emitting device 120.

For example, the first sub-area P01 surrounds part of the light-emitting device 120. The first sub-area P01 may be located on two opposite sides of the light-emitting device 120 along the first direction X; alternatively, the first sub-area P01 may be located on two opposite sides of the light-emitting device 120 along the second direction Y.

As another example, the first sub-area P01 surrounds the light-emitting device 120. The first sub-area P01 is an annular area.

For example, the second sub-area P02 surrounds the first sub-area P01, and the first sub-area P01 and the second sub-area P02 are connected to each other.

Figure 13:
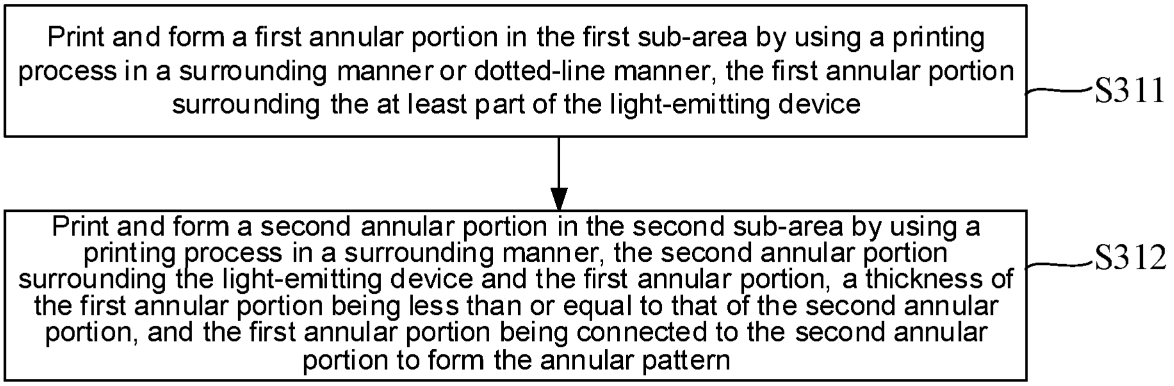
FIG. 13 is a flowchart for manufacturing another light-emitting substrate, in accordance with some embodiments of the present disclosure.

In some examples, as shown in FIG. 13, S310 in which the annular pattern 131 in the first printing area P1 by using a printing process in a surrounding manner includes steps S311 and S312.

Figure 14A:
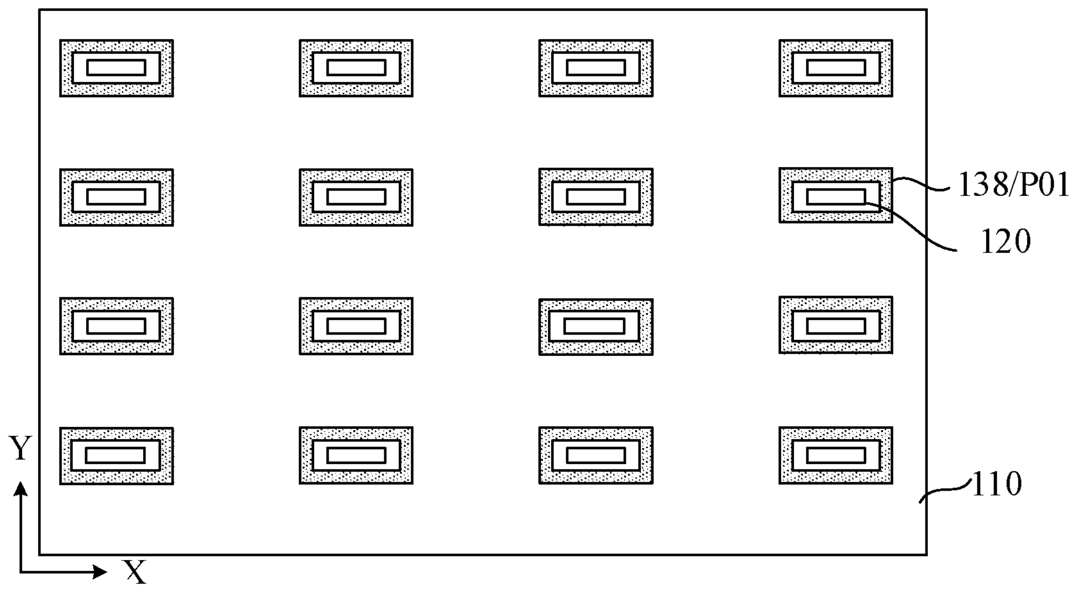
FIG. 14*a* and FIG. 14*b* are structural diagrams of another light-emitting substrate in different manufacturing stages, in accordance with some embodiments of the present disclosure.

In S311, as shown in FIG. 14*a*, a first annular portion 138 is printed and formed in the first sub-area P01 by using a printing process in a surrounding manner or dotted-line manner, the first annular portion 138 surrounding the at least part of the light-emitting device.

Exemplarily, a printing process in a surrounding manner may be used to print and form the first annular portion 138 in the first sub-area P01; alternatively, a printing process in a dotted-line manner may be used to print and form the first annular portion 138 in the first sub-area P01.

Exemplarily, the above printing process in a dotted-line manner refers to that the 3D printing device moves along a set printing path, and by controlling the printing valve to be turned on or off intermittently, the shape of a printed pattern formed by the 3D printing device is a discontinuous and intermittent shape similar to a dotted-line after a single printing is completed.

For example, in a case where the above printing process in a dotted-line manner is used, the printing valve may be a pneumatic valve. The printing frequency of the 3D printing device controlled by the pneumatic valve is 20 Hz to 50 Hz. The cost of spare parts of this printing device is relatively low, which may reduce the cost of preparing the reflective layer 130, thereby reducing the manufacturing cost of the light-emitting substrate 100.

Figure 14B:
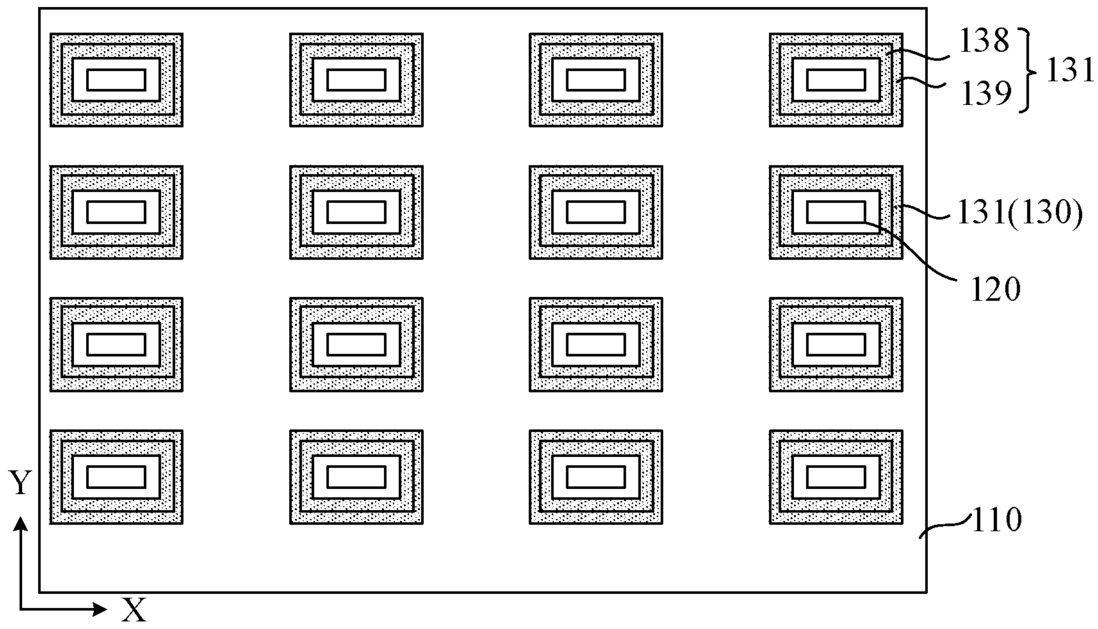

In S312, as shown in FIG. 14*b*, a second annular portion 139 is printed and formed in the second sub-area P02 by using a printing process in a surrounding manner. The second annular portion 139 surrounds the light-emitting device 120 and surrounds the first annular portion 138, a thickness of the first annular portion 138 is less than or equal to a thickness of the second annular portion 139, and the first annular portion 138 is connected to the second annular portion 139 to form the annular pattern 131.

Exemplarily, in the process of printing the first annular portion 138, the output of the printing device may be adjusted down first, so that the size of dots of a material ejected from the printing valve by the printing device is relatively small, thereby, the structural features and shape features of the first annular portion 138 formed by the dots of the material may be more precisely controlled. This in turn makes the shape of the inner sidewall of the formed annular pattern 131 more precise, so that the distance between the inner sidewall of the annular pattern 131 and the light-emitting device 120 can be precisely controlled to be small, ensuring that the reflectivity of the reflective layer 130 is high.

It can be understood that the annular pattern 131 formed by the above-mentioned preparation method is in the shape of the Chinese character "回".

By using the above preparation method, the cost of the reflective layer material may be reduced during the preparation process, and the shape of the formed annular pattern 131 made be made more precise, so that the distance between the inner sidewall of the annular pattern 131 and the light-emitting device 120 may be as far as possible small, so that the reflectivity of the annular pattern 131 may be improved, the light efficiency of the light-emitting device 120 may be improved, light consumption may be avoided, and the energy consumption of the display apparatus 1 may be reduced.

Figure 15:
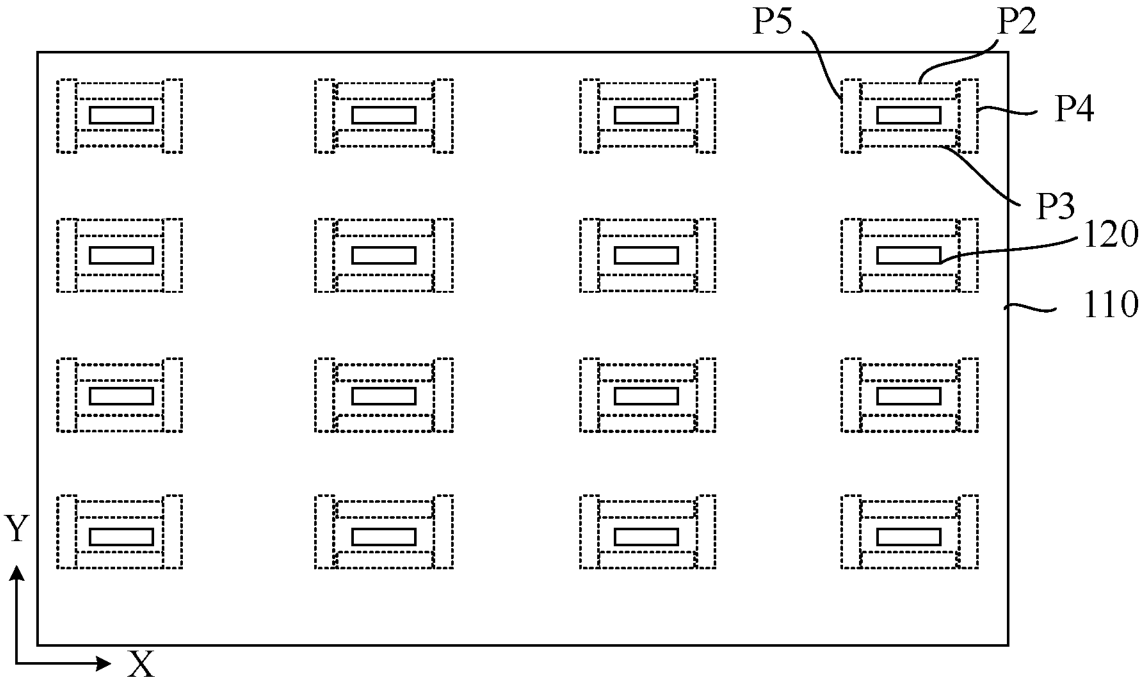
FIG. 15 is a structural diagram of yet another light-emitting substrate, in accordance with some embodiments of the present disclosure.

In other embodiments, as shown in FIG. 15, the substrate 110 has a plurality of second printing areas P2 and a plurality of third printing areas P3 which extend along the first direction X, and a plurality of fourth printing areas P4 and fifth printing areas P5 which extend along the second direction Y. Two opposite sides of the light-emitting device 120 along the second direction Y are respectively provided with a second printing area P2 and a third printing area P3, and two opposite sides of the light-emitting device 120 along the first direction are X respectively provided with a fourth printing area P4 and a fifth printing area P5.

Figure 16:
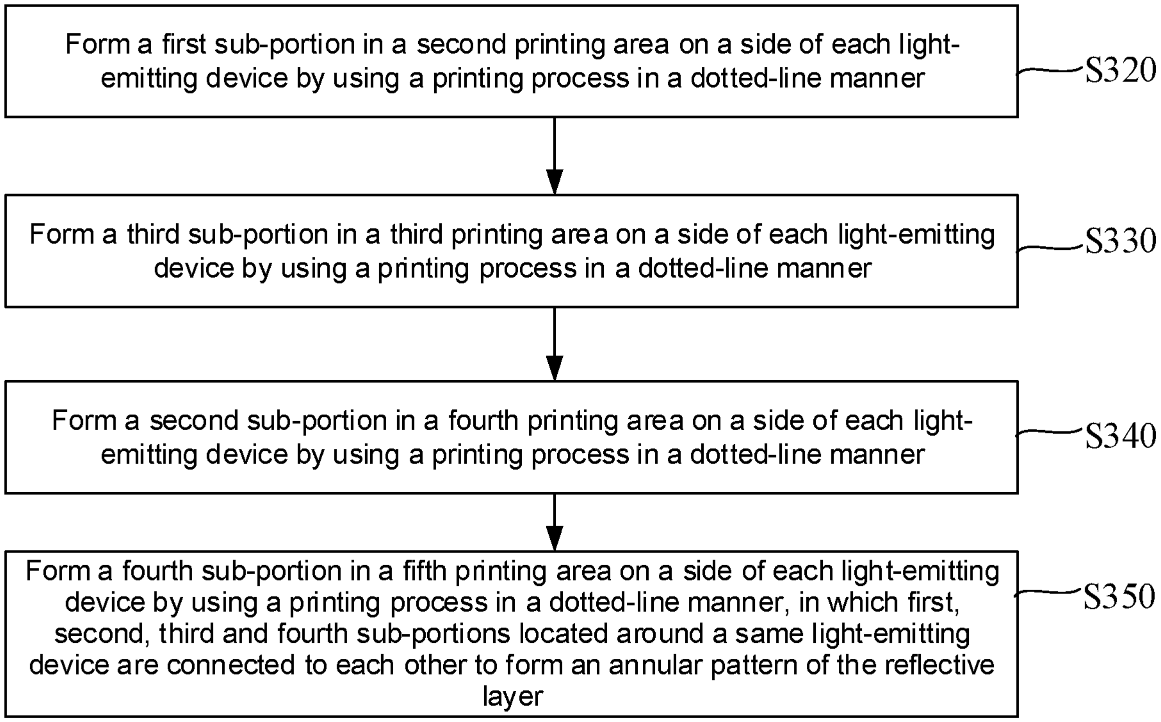
FIG. 16 is a flowchart for manufacturing yet another light-emitting substrate, in accordance with some embodiments of the present disclosure.

In some examples, as shown in FIG. 16, S300 in which the reflective layer is formed on the substrate by using the 3D printing process includes steps S320 to S350.

Figure 17A:
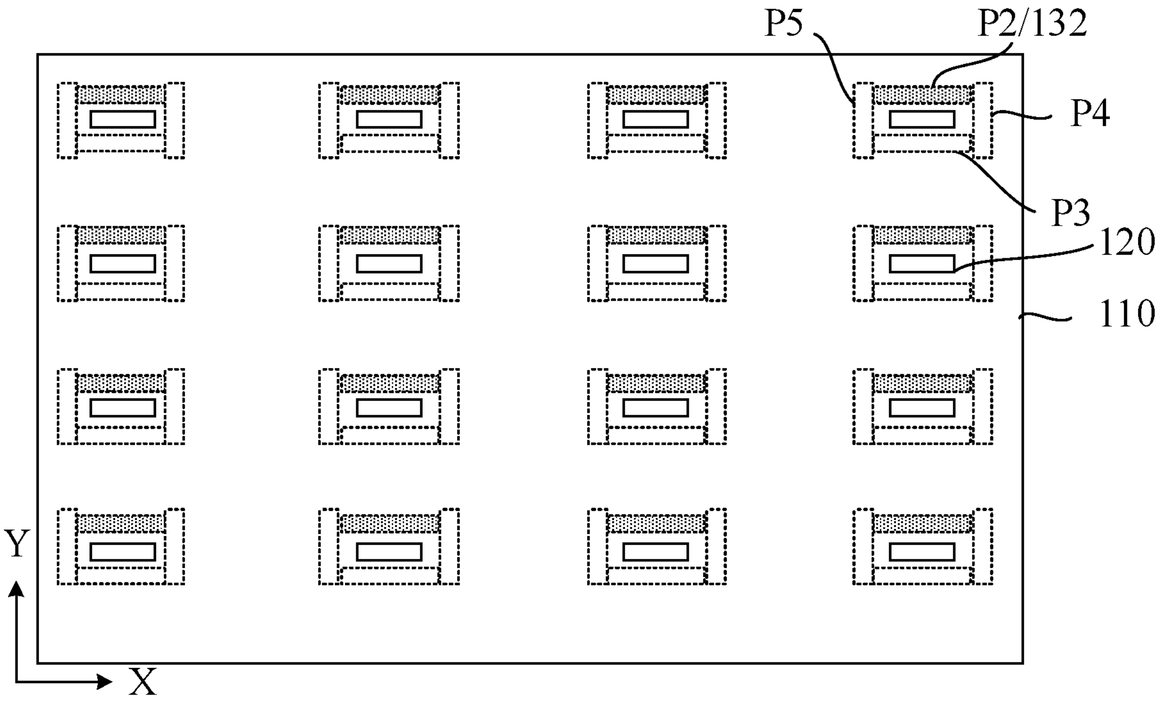
FIG. 17*a* to FIG. 17*d* are structural diagrams of yet another light-emitting substrate in different manufacturing stages, in accordance with some embodiments of the present disclosure.

In S320, as shown in FIG. 17*a*, a first sub-portion 132 is formed in a second printing area P2 on a side of each light-emitting device 120 by using a printing process in a dotted-line manner.

Exemplarily, in a zone where the first sub-portion 132 is to be formed in the second printing area P2, the printing head of the 3D printing device may be turned on to eject the reflective layer material to form the first sub-portion 132; and in other zones of the second printing area P2, the printing head of the 3D printing device may be turned off.

Figure 17B:
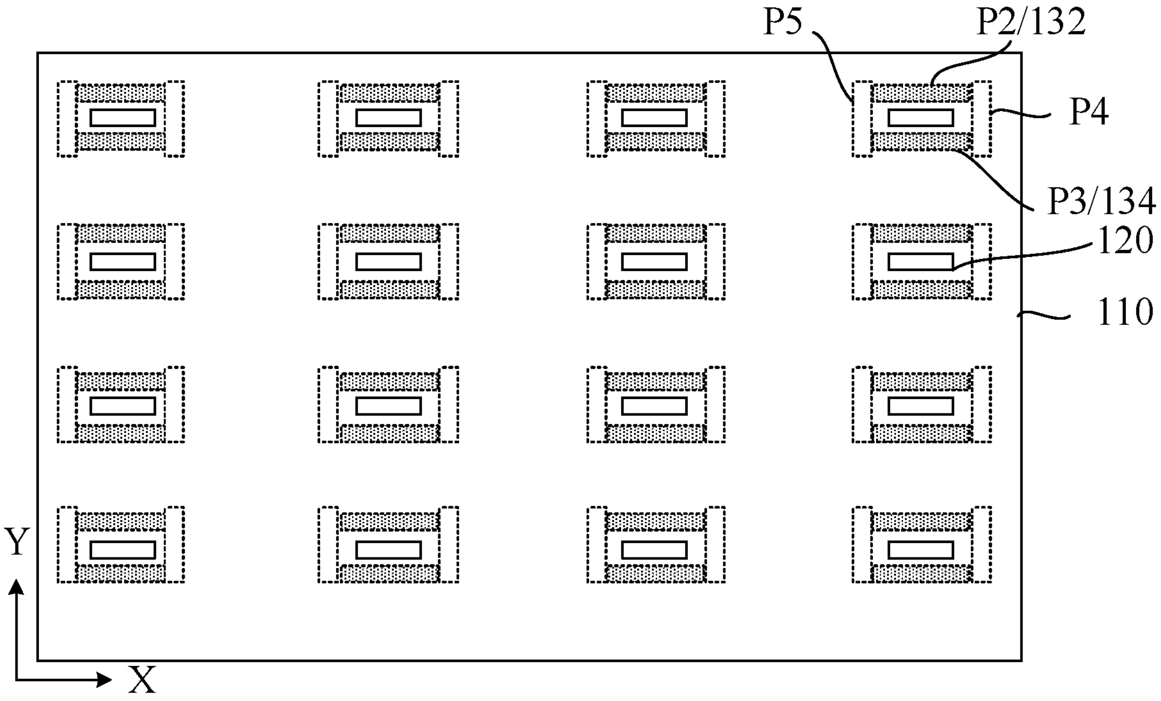

In S330, as shown in FIG. 17*b*, a third sub-portion 134 is formed in a third printing area P3 on a side of each light-emitting device 120 by using a printing process in a dotted-line manner.

Exemplarily, in a zone where the third sub-portion 134 is to be formed in the third printing area P3, the printing head of the 3D printing device may be turned on to eject the reflective layer material to form the third sub-portion 134; and in other zones of the third printing area P3, the printing head of the 3D printing device may be turned off.

Figure 17C:
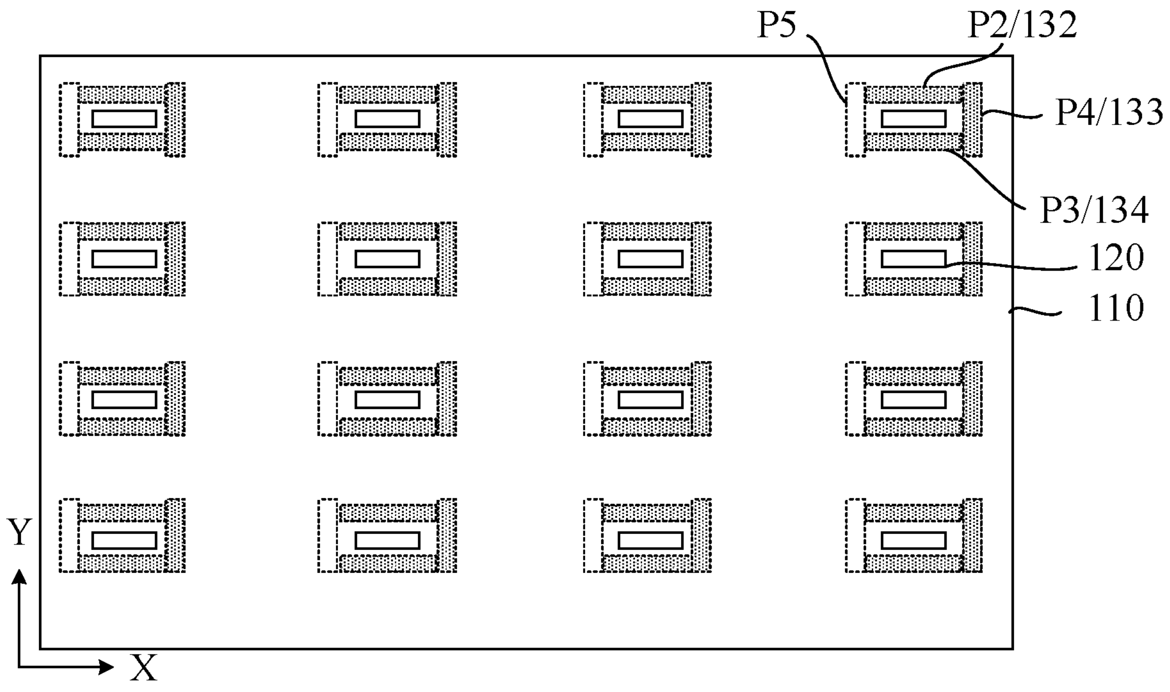

In S340, as shown in FIG. 17*c*, a second sub-portion 133 is formed in a fourth printing area P4 on a side of each light-emitting device 120 by using a printing process in a dotted-line manner.

Exemplarily, in a zone where the second sub-portion 133 is to be formed in the fourth printing area P4, the printing head of the 3D printing device may be turned on to eject the reflective layer material to form the second sub-portion 133; and in other zones of the fourth printing area P4, the printing head of the 3D printing device may be turned off.

Figure 17D:
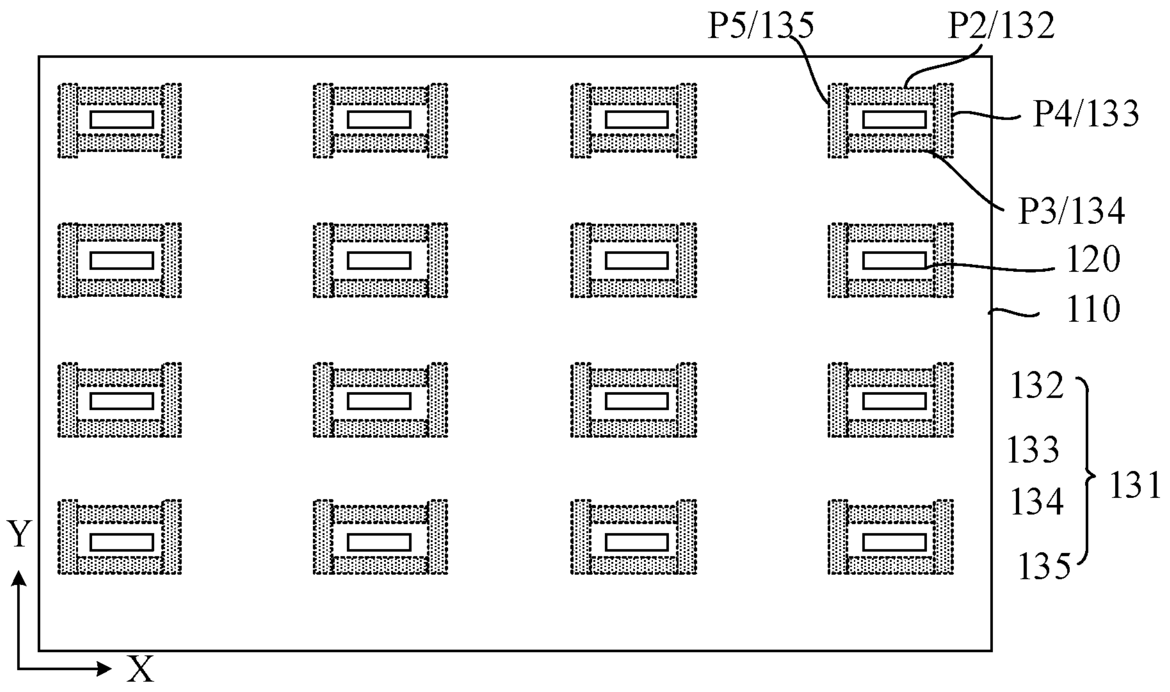

In S350, as shown in FIG. 17*d*, a fourth sub-portion 135 is formed in a fifth printing area P5 on a side of each light-emitting device 120 by using a printing process in a dotted-line manner. A first sub-portion 132, a second sub-portion 133, a third sub-portion 134 and a fourth sub-portion 135 which are located around a same light-emitting device 120 are connected to each other to form an annular pattern 131 of the reflective layer 130.

Exemplarily, in a zone where the fourth sub-portion 135 is to be formed in the fifth printing area P5, the printing head of the 3D printing device may be turned on to eject the reflective layer material to form the fourth sub-portion 135; and in other zones of the fifth printing area P5, the printing head of the 3D printing device may be turned off.

In some examples, the first sub-portion 132, the second sub-portion 133, the third sub-portion 134 and the fourth sub-portion 135 which are located around the same light-emitting device 120 may be sequentially connected end to end. In this case, the annular pattern 131 printed and formed by the above-mentioned preparation method is in the shape of the Chinese character "回".

In some other examples, the first sub-portion 132, the second sub-portion 133, the third sub-portion 134 and the fourth sub-portion 135 which are located around the same light-emitting device 120 may be sequentially cross-connected. In this case, the annular pattern 131 printed and formed by the above-mentioned preparation method is in the shape of the Chinese character "井".

For example, in a case where the annular pattern 131 formed by printing is in the shape of the Chinese character "井", the printing valve may be a pneumatic valve, and the printing frequency of the 3D printing device controlled by the pneumatic valve is 20 Hz to 50 Hz. In this way, the accuracy of the printing starting area may be ignored, which may reduce the printing cost and the manufacturing cost of the light-emitting substrate 100.

Of course, the first sub-portion 132, the second sub-portion 133, the third sub-portion 134 and the fourth sub-portion 135 in the annular pattern 131 are formed in a single patterning process, and the first sub-portion 132, the second sub-portion 133, the third sub-portion 134 and the fourth sub-portion 135 are of an integral structure.

Forming the annular pattern 131 by the above preparation method may improve the preparation efficiency of the reflective layer 130 and shorten the preparation time of the light-emitting substrate 100, thereby improving the preparation efficiency of the light-emitting substrate 100.

Figure 18:
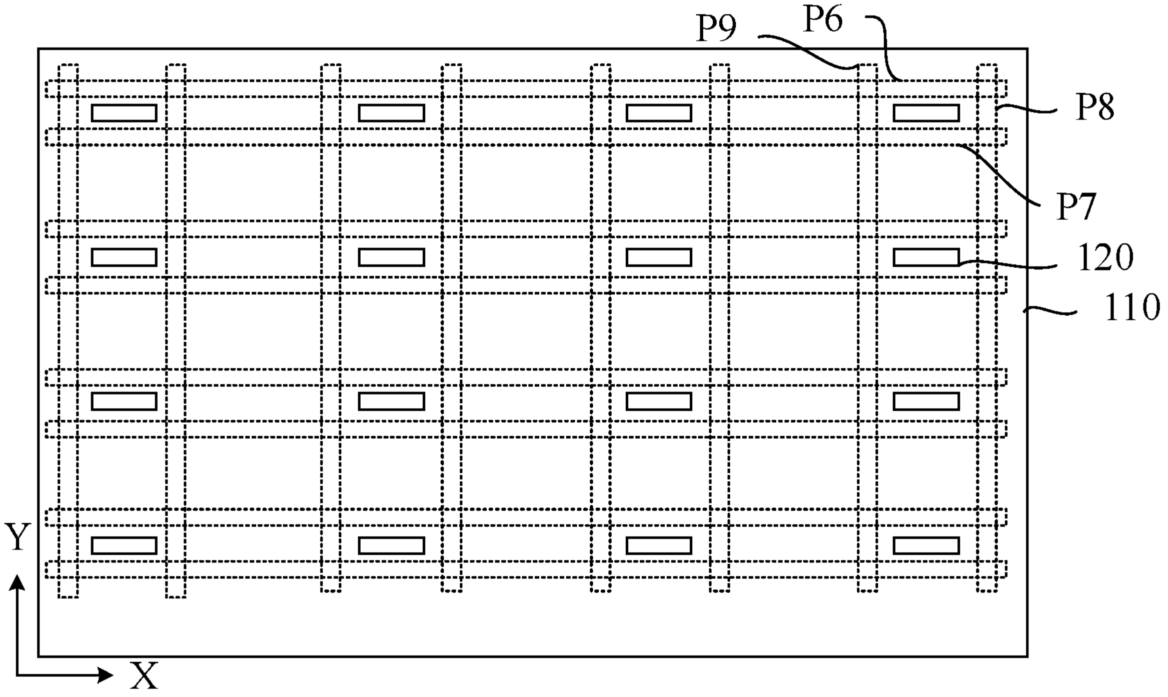
FIG. 18 is a structural diagram of yet another light-emitting substrate, in accordance with some embodiments of the present disclosure.

In some other embodiments, as shown in FIG. 18, the substrate 110 has a plurality of sixth printing areas P6 and a plurality of seventh printing areas P7 which extend along the first direction X, and a plurality of eighth printing areas P8 and a plurality of ninth printing areas P9 which extend along the second direction Y. Two opposite sides of a row of light-emitting devices 120 along the second direction Y are respectively provided with a sixth printing area P6 and a seventh printing area P7, and two opposite sides of a column of light-emitting devices 120 along the second direction Y are respectively provided with an eighth printing area P8 and a ninth printing area P9.

Exemplarily, the sixth printing area P6 have an overlapping area with each of the pluralities of eighth printing areas P8 and ninth printing areas P9; and the seventh printing area P7 have an overlapping area with each of the pluralities of eighth printing areas P8 and ninth printing areas P9.

Figure 19:
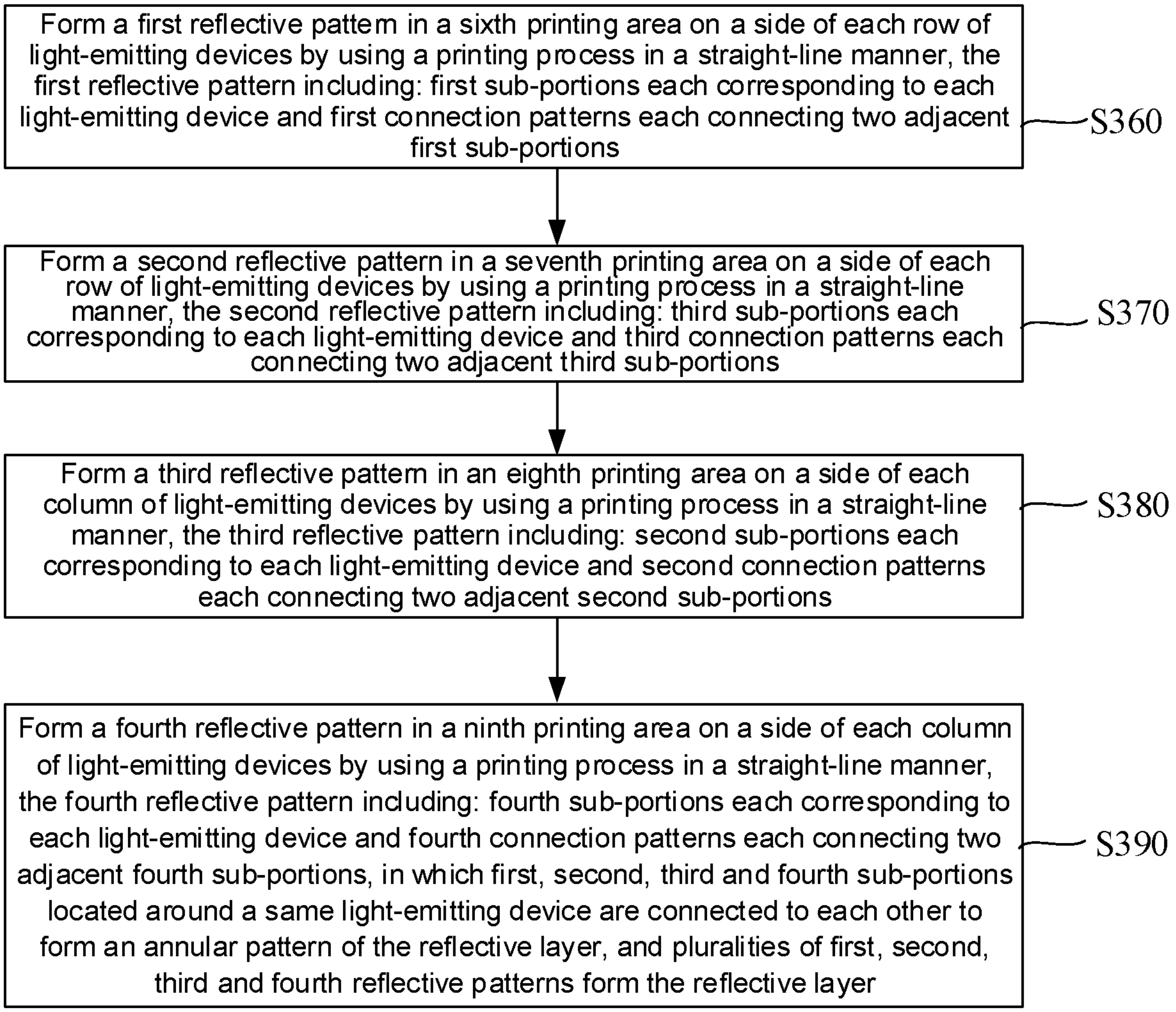
FIG. 19 is a flowchart for manufacturing yet another light-emitting substrate, in accordance with some embodiments of the present disclosure.

As shown in FIG. 19, S300 in which the reflective layer is formed on the substrate by using the 3D printing process includes steps S360 to S390.

Figure 20A:
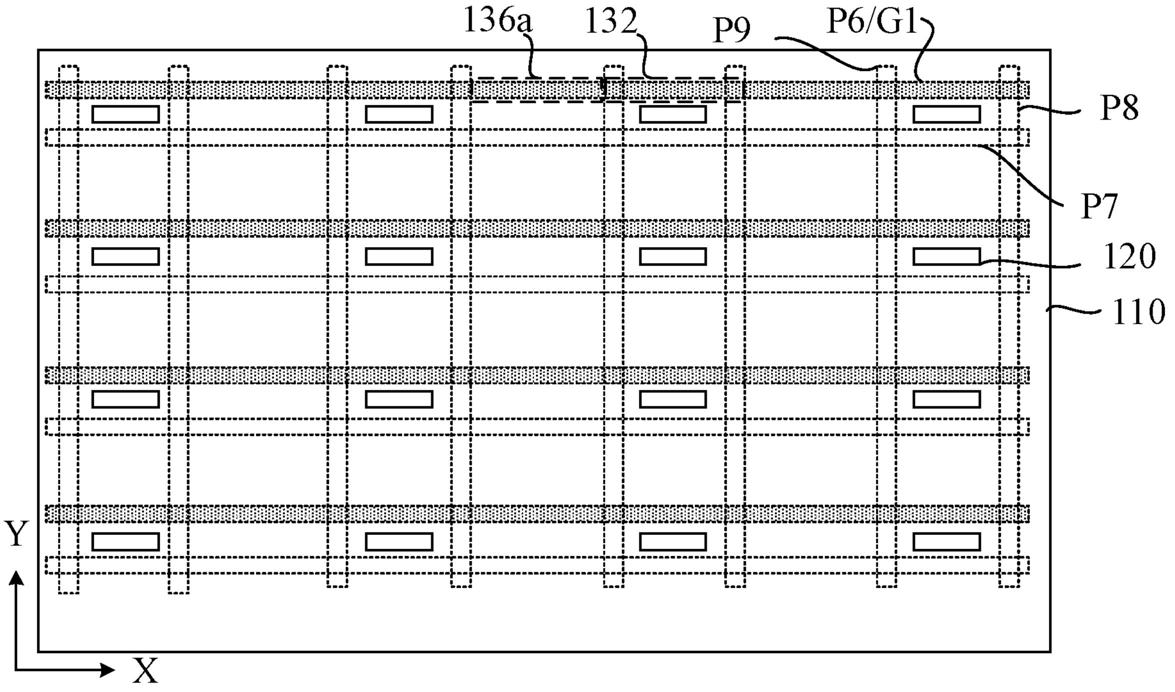
FIG. 20*a* to FIG. 20*d* are structural diagrams of yet another light-emitting substrate in different manufacturing stages, in accordance with some embodiments of the present disclosure.

In S360, as shown in FIG. 20*a*, a first reflective pattern G1 is formed in a sixth printing area P6 on a side of each row of light-emitting devices 120 by using a printing process in a straight-line manner. The first reflective pattern G1 includes: first sub-portions 132 each corresponding to each light-emitting device 120 and first connection patterns 136*a* each connecting two adjacent first sub-portions 132.

Exemplarily, the above printing process in a straight-line manner refers to that the 3D printing device moves along a set printing path, and by controlling each printing valve to be turned on, the shape of a printed pattern formed by the 3D printing device is a continuous and unintermittent shape similar to a straight-line after a single printing is completed.

Exemplarily, the plurality of first sub-portions 132 and the plurality of first connection patterns 136*a* are alternately arranged.

Exemplarily, the plurality of first sub-portions 132 and the plurality of first connection patterns 136*a* are formed in a single patterning process and are in an integral structure.

Figure 20B:
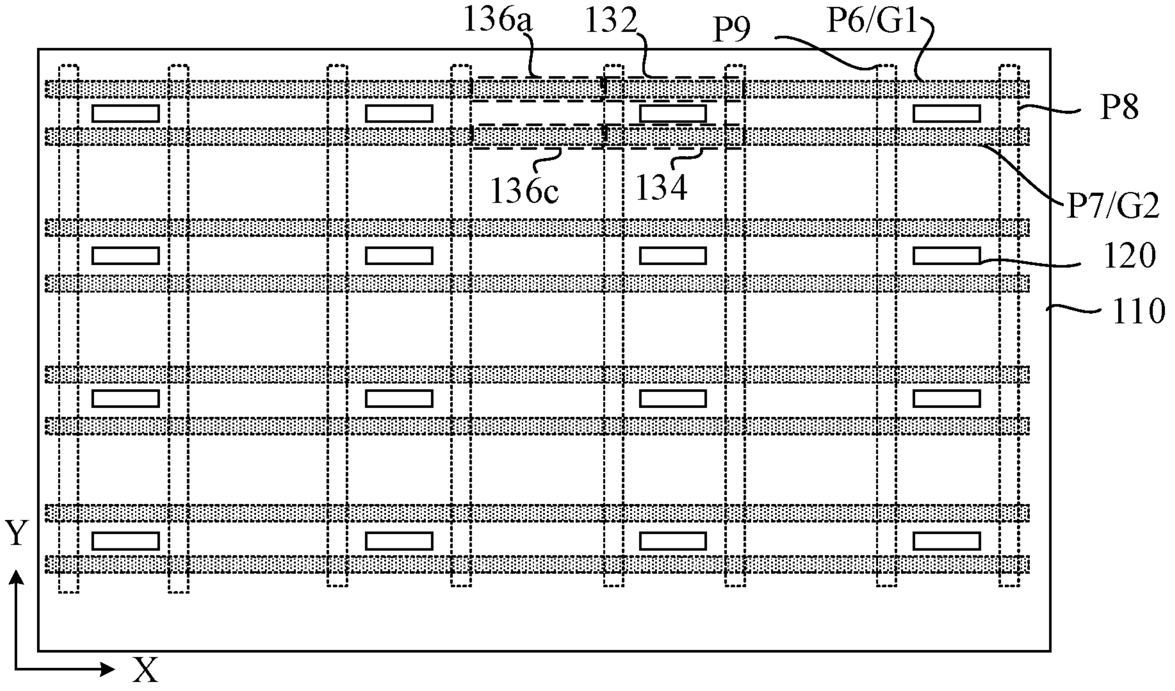

In S370, as shown in FIG. 20*b*, a second reflective pattern G2 is formed in a seventh printing area P7 on a side of each row of light-emitting devices 120 by using a printing process in a straight-line manner. The second reflective pattern G2 includes: third sub-portions 134 each corresponding to each light-emitting device 120 and third connection patterns 136*c* each connecting two adjacent third sub-portions 134.

Exemplarily, the plurality of third sub-portions 134 and the plurality of third connection patterns 136*c* are alternately arranged.

Figure 20C:
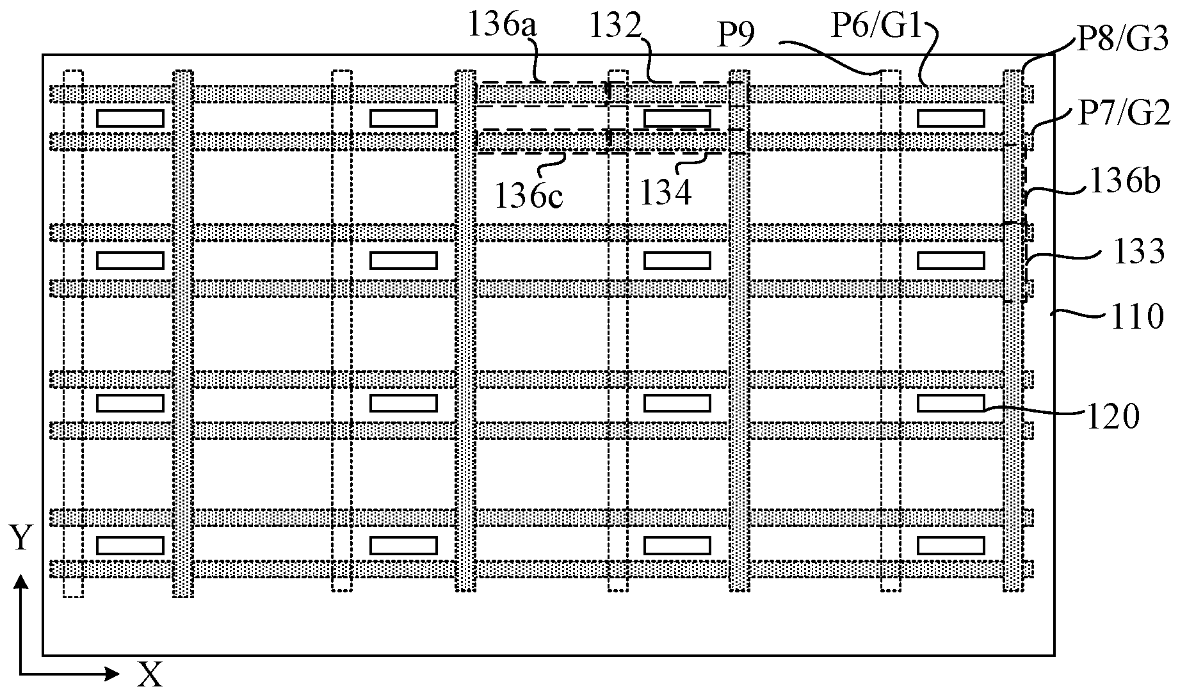

In S380, as shown in FIG. 20*c*, a third reflective pattern G3 is formed in an eighth printing area P8 on a side of each column of light-emitting devices 120 by using a printing process in a straight-line manner. The third reflective pattern G3 includes: second sub-portions 133 each corresponding to each light-emitting device 120 and second connection patterns 136*b* each connecting two adjacent second sub-portions 133.

Exemplarily, the plurality of second sub-portions 133 and the plurality of second connection patterns 136*b* are alternately arranged.

Exemplarily, the plurality of second sub-portions 133 and the plurality of second connection patterns 136*b* are formed in a single patterning process and are in an integral structure.

Figure 20D:
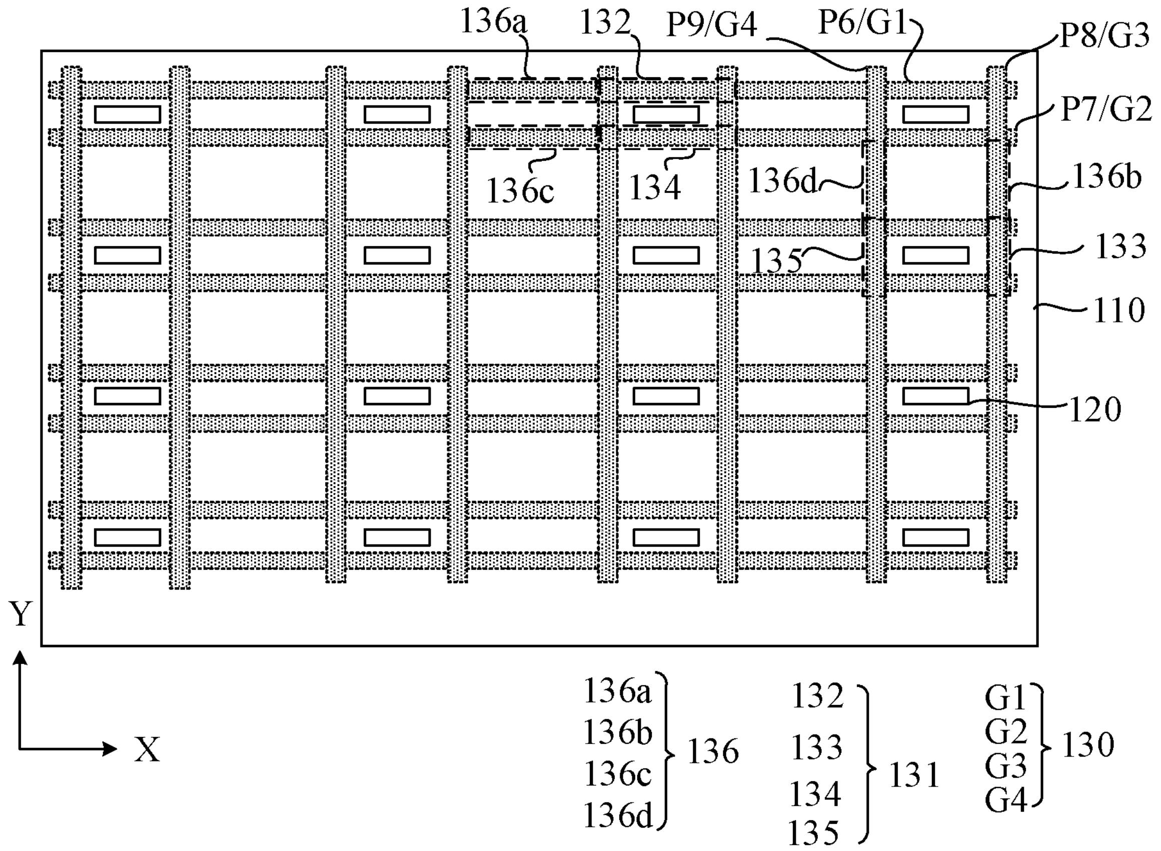

In S390, as shown in FIG. 20*d*, a fourth reflective pattern G4 is formed in a ninth printing area P9 on a side of each column of light-emitting devices 120 by using a printing process in a straight-line manner. The fourth reflective pattern G4 includes: fourth sub-portions 135 each corresponding to each light-emitting device 120 and fourth connection patterns 136*d* each connecting two adjacent fourth sub-portions 135. A first sub-portion 132, a second sub-portion 133, a third sub-portion 134 and a fourth sub-portion 135 which are located around a same light-emitting device 120 are connected to each other to form an annular pattern of the reflective layer. A plurality of first reflective patterns G1, a plurality of second reflective patterns G2, a plurality of third reflective patterns G3 and a plurality of fourth reflective patterns G4 form the reflective layer 130.

Exemplarily, the plurality of fourth sub-portions 135 and the plurality of fourth connection patterns 136*d* are alternately arranged.

Exemplarily, the plurality of fourth sub-portions 135 and the plurality of fourth connection patterns 136*d* are formed in a single patterning process and are in an integral structure.

It can be understood that by using the above-mentioned preparation method, the reflective layer 130 formed by the pluralities of connection patterns 136 and annular patterns 131 which are formed by printing is in the shape of a dam as a whole.

Exemplarily, in the printing process in a straight-line manner, a pneumatic valve may be used to control the turning on or off of the printing valve of the 3D printing device.

Forming the reflective layer by the above preparation method may improve the preparation efficiency of the reflective layer 130 and shorten the preparation time of the light-emitting substrate 100, thereby improving the manufacturing efficiency of the light-emitting substrate 100.

It can be understood that the light-emitting substrate 100 further includes an encapsulation layer 150. During the manufacturing process of the light-emitting substrate 100, there are various preparation sequences of the encapsulation layer 150 and the reflective sheet 140, which may be selected according to actual needs, which is not limited in the present disclosure.

In some embodiments, before attaching the reflective sheet 140 on a side of the reflective layer 130 away from the substrate 110 in S400, the manufacturing method further includes a step S401.

In S401, the encapsulation layer 150 is formed on the side of the reflective layer 130 away from the substrate 110. The encapsulation layer 150 includes a plurality of encapsulation patterns 151, and the encapsulation patterns 151 correspond to the light-emitting devices 120. An orthographic projection of a light-emitting device 120 on the substrate 110 is located in a range of an orthographic projection of an encapsulation pattern 151 on the substrate 110, and the orthographic projection of the encapsulation pattern 151 on the substrate 110 is overlapping with an orthographic projection of the annular pattern 131 on the substrate 110.

Exemplarily, adhesive sealant may be used to form the encapsulation layer 150 to encapsulate the light-emitting devices 120, so as to prevent water vapor from intruding into the interior of the light-emitting device 120 and avoid affecting the light emission of the light-emitting device 120.

By using the above preparation method, the encapsulation layer 150 is formed before attaching the reflective sheet 140, which can avoid the influence of the formation process of the encapsulation layer 150 on the reflective sheet 140 and avoid affecting the reflectivity of the reflective sheet 140.

In the above preparation method, the encapsulation layer 150 is formed before the reflective sheet 140 is attached, so the orthographic projection of the encapsulation pattern 151 on the substrate 110 is nonoverlapping with the orthographic projection of the reflective sheet 140 on the substrate 110.

Exemplarily, a boundary line of the orthographic projection of the encapsulation pattern 151 on the substrate 110 does not cross a boundary line of the orthographic projection of the reflective sheet 140 on the substrate 110. That is to say, since formed before, the encapsulation pattern 151 cannot cover the reflective sheet 140 attached later. In this case, the area of the first opening 141 of the reflective sheet 140 is relatively large, the encapsulation pattern 151 is located in the first opening 141 of the reflective sheet 140, the attachment of the reflective sheet 140 is less difficult, and the preparation of the light-emitting substrate 100 is less difficult.

For the relative positional relationship between the encapsulation pattern 151 and the reflective sheet 140, reference may be made to the descriptions in some embodiments above, which will not be repeated here.

In some other embodiments, after attaching the reflective sheet 140 on the side of the reflective layer 130 away from the substrate 110 in S400, the manufacturing method further includes a step S501.

In S501, an encapsulation layer 150 is formed on a side of the reflective layer 130 away from the substrate 110. The encapsulation layer 150 includes a plurality of encapsulation patterns 151, and the encapsulation patterns 151 correspond to the light-emitting devices 120. An orthographic projection of a light-emitting device 120 on the substrate 110 is located in a range of an orthographic projection of an encapsulation pattern 151 on the substrate 110, and the orthographic projection of the encapsulation pattern 151 on the substrate 110 is overlapping with an orthographic projection of the annular pattern 131 on the substrate 110.

Exemplarily, adhesive sealant may be used to form the encapsulation layer 150 to encapsulate the light-emitting devices 120, so as to prevent water vapor from intruding into the interior of the light-emitting device 120 and avoid affecting the light emission of the light-emitting device 120.

In the above preparation method, the encapsulation layer 150 is formed after the reflective sheet 140 is attached, so the orthographic projection of the encapsulation pattern 151 on the substrate 110 may be non-overlapping with or partially overlapping with the orthographic projection of the reflective sheet 140 on the substrate 110.

In a case where the orthographic projection of the encapsulation pattern 151 on the substrate 110 is partially overlapping with the orthographic projection of the reflective sheet 140 on the substrate 110, the encapsulation pattern 151 may be used to protect the reflective sheet 140, or to increase the bonding strength between the reflective sheet 140 and the substrate 110 or reflective layer 130, which avoids the edge warping of the reflective sheet 140, and avoids affecting the reflection of the light emitted by the light-emitting device 120 by the reflective sheet 140, thereby ensuring the reflectivity of the reflective sheet 140, and improving the production yield of the light-emitting substrate 100.

Exemplarily, after the plurality of light-emitting devices 120 are fixed on the substrate 110 in S200, the manufacturing method further includes: fixing a plurality of driving chips 160 on the substrate 110.

Exemplarily, a driving chip 160 is electrically connected to at least one light-emitting device 120.

Exemplarily, after the plurality of light-emitting devices 120 are fixed on the substrate 110 in S200, the manufacturing method further includes: cleaning part of the substrate 110 located around each light-emitting device 120.

Exemplarily, the above cleaning operation can change the surface tension coefficient of the part of the substrate 110 located around the light-emitting device 120, thereby improving the wetting effect of the reflective layer material on the substrate 110, and then in the subsequent printing of the reflective layer material, alleviating or improving the repel phenomenon between the reflective layer material and the area surrounding the light-emitting devices 120. As a result, the shape accuracy of the formed reflective layer 130 may be improved and the luminance of the light-emitting substrate 100.

The foregoing description is only specific embodiments of the present disclosure, but the scope of protection of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A light-emitting substrate, comprising:

a substrate;

a reflective layer located on a side of the substrate, the reflective layer having a plurality of annular patterns arranged at intervals;

a reflective sheet located on a side of the reflective layer away from the substrate, wherein the reflective sheet has a plurality of first openings, an annular pattern is exposed by a corresponding first opening, and in a direction perpendicular to a plane where the substrate is located, an outer sidewall of the annular pattern surrounds the corresponding first opening, and an inner sidewall of the annular pattern is located in the corresponding first opening; and a plurality of light-emitting devices, a light-emitting device is located in an inner sidewall of one of the annular patterns; wherein a surface of the annular pattern away from the substrate has a plurality of protrusion structures.

2. The light-emitting substrate according to claim 1, wherein in a direction parallel to the plane where the substrate is located, a minimum distance between the outer sidewall of the annular pattern and the inner sidewall of the annular pattern is greater than or equal to 2.3 mm; and/or in the direction parallel to the plane where the substrate is located, a minimum distance between the outer sidewall of the annular pattern and the corresponding first opening is greater than or equal to 2 mm.

3. The light-emitting substrate according to claim 1, wherein the annular pattern includes a first sub-portion, a second sub-portion, a third sub-portion and a fourth sub-portion, wherein the first sub-portion and the third sub-portion extend along a first direction, the second sub-portion and the fourth sub-portion extend along a second direction, and the first direction intersects the second direction, wherein the first sub-portion, the second sub-portion, the third sub-portion and the fourth sub-portion are sequentially connected end to end, or are sequentially cross-connected.

4. The light-emitting substrate according to claim 3, wherein the plurality of annular patterns are arranged in multiple columns along the first direction, and arranged in multiple rows along the second direction;

the reflective layer further includes a plurality of connection patterns; the plurality of connection patterns include: multiple first connection patterns and multiple third connection patterns which extend along the first direction, and multiple second connection patterns and multiple fourth connection patterns which extend along the second direction; and along the first direction, two first sub-portions of two adjacent annular patterns are connected to a first connection pattern, and two third sub-portions of two adjacent annular patterns are connected to a third connection pattern; and along the second direction, two second sub-portions of two adjacent annular patterns are connected to a second connection pattern, and two fourth sub-portions of two adjacent annular patterns are connected to a fourth connection pattern.

5. The light-emitting substrate according to claim 4, wherein an annular pattern and a connection pattern connected thereto are of an integral structure.

6. The light-emitting substrate according to claim 1, wherein an angle between at least part of the inner sidewall of the annular pattern and the plane where the substrate is located is an acute angle; and/or an angle between at least part of the outer sidewall of the annular pattern and the plane where the substrate is located is an acute angle; and/or at least part of the inner sidewall of the annular pattern is a cambered surface; and/or at least part of the outer sidewall of the annular pattern is a cambered surface.

7. The light-emitting substrate according to claim 1, wherein an outer boundary line of an orthographic projection of the annular pattern on the substrate includes at least one outer curved segment, and the outer curved segment protrudes in a direction away from a corresponding light-emitting device; and/or an inner boundary line of the orthographic projection of the annular pattern on the substrate includes at least one inner curved segment, and the inner curved segment protrudes in a direction toward the corresponding light-emitting device.

8. The light-emitting substrate according to claim 1, wherein the annular pattern includes a first annular portion and a second annular portion which are connected to each other, wherein the first annular portion surrounds at least part of a corresponding light-emitting device, and the second annular portion surrounds the corresponding light-emitting device and surrounds the first annular portion; and a thickness of the first annular portion is less than or equal to a thickness of the second annular portion.

9. The light-emitting substrate according to claim 1, wherein in a direction parallel to the plane where the substrate is located, a distance between the inner sidewall of the annular pattern and a corresponding light-emitting device is in a range of 0 μm to 300 μm, inclusive; and/or in the direction parallel to the plane where the substrate is located, a minimum distance between the first opening and the corresponding light-emitting device is greater than or equal to 500 μm.

10. The light-emitting substrate according to claim 1, further comprising: an encapsulation layer located on a side of the plurality of light-emitting devices away from the substrate, the encapsulation layer including a plurality of encapsulation patterns, wherein an orthographic projection of the light-emitting device on the substrate is located in a range of an orthographic projection of an encapsulation pattern on the substrate, and the orthographic projection of the encapsulation pattern on the substrate is overlapping with an orthographic projection of the annular pattern on the substrate.

11. The light-emitting substrate according to claim 10, wherein the orthographic projection of the encapsulation pattern on the substrate is partially overlapping with an orthographic projection of the reflective sheet on the substrate; or the orthographic projection of the encapsulation pattern on the substrate is non-overlapping with the orthographic projection of the reflective sheet on the substrate.

12. A backlight module, comprising: the light-emitting substrate according to claim 1; and optical film sheets located on a light-exit side of the light-emitting substrate.

13. A display apparatus, comprising: the backlight module according to claim 12;

a color filter substrate located on a light-exit side of the backlight module; and an array substrate located between the backlight module and the color filter substrate.

14. A manufacturing method for a light-emitting substrate, the manufacturing method comprising:

providing a substrate;

fixing a plurality of light-emitting devices on the substrate;

forming a reflective layer on the substrate by using a three dimensional (3D) printing process, wherein the reflective layer has a plurality of annular patterns arranged at intervals, and a light-emitting device is located in an inner sidewall of one of the annular patterns; and attaching a reflective sheet on a side of the reflective layer away from the substrate, wherein the reflective sheet has a plurality of first openings, an annular pattern is exposed by a corresponding first opening, and in a direction perpendicular to a plane where the substrate is located, an outer sidewall of the annular pattern surrounds the corresponding first opening, and an inner sidewall of the annular pattern is located in the corresponding first opening.

15. The manufacturing method according to claim 14, wherein the plurality of light-emitting devices are arranged in multiple columns along a first direction, and arranged in multiple rows along a second direction, and the first direction intersects with the second direction; and the substrate has a plurality of first printing areas, and a first printing area surrounds a light-emitting device;

forming the reflective layer on the substrate by using the 3D printing process, includes:

forming an annular pattern in the first printing area by using a printing process in a surrounding manner, the plurality of annular patterns forming the reflective layer.

16. The manufacturing method according to claim 15, wherein the first printing area includes: a first sub-area and a second sub-area; the first sub-area is closer to the light-emitting device than the second sub-area; and the first sub-area surrounds at least part of the light-emitting device, and the second sub-area surrounds the light-emitting device;

forming the annular pattern in the first printing area by using the printing process in a surrounding manner, includes:

forming a first annular portion in the first sub-area by using a printing process in a surrounding manner or dotted-line manner, the first annular portion surrounding the at least part of the light-emitting device; and forming a second annular portion in the second sub-area by using another printing process in a surrounding manner, wherein the second annular portion surrounds the light-emitting device and surrounds the first annular portion, a thickness of the first annular portion is less than or equal to a thickness of the second annular portion, and the first annular portion is connected to the second annular portion to form the annular pattern.

17. The manufacturing method according to claim 14, wherein the plurality of light-emitting devices are arranged in multiple columns along a first direction, and arranged in multiple rows along a second direction, and the first direction intersects with the second direction; and the substrate has a plurality of second printing areas and a plurality of third printing areas which extend along the first direction, and a plurality of fourth printing areas and fifth printing areas which extend along the second direction; and two opposite sides of the light-emitting device along the second direction are respectively provided with a second printing area and a third printing area, and two opposite sides of the light-emitting device along the first direction are respectively provided with a fourth printing area and a fifth printing area;

forming the reflective layer on the substrate by using the 3D printing process, includes:

forming a first sub-portion in a second printing area on a side of each light-emitting device by using a printing process in a dotted-line manner;

forming a third sub-portion in a third printing area on another side of each light-emitting device by using another printing process in a dotted-line manner;

forming a second sub-portion in a fourth printing area on yet another side of each light-emitting device by using yet another printing process in a dotted-line manner; and forming a fourth sub-portion in a fifth printing area on still yet another side of each light-emitting device by using still yet another printing process in a dotted-line manner, wherein a first sub-portion, a second sub-portion, a third sub-portion and a fourth sub-portion which are located around a same light-emitting device are connected to each other to form an annular pattern of the reflective layer.

18. The manufacturing method according to claim 14, wherein the plurality of light-emitting devices are arranged in multiple columns along a first direction, and arranged in multiple rows along a second direction, and the first direction intersects with the second direction; and the substrate has a plurality of sixth printing areas and a plurality of seventh printing areas which extend along the first direction, and a plurality of eighth printing areas and a plurality of ninth printing areas which extend along the second direction; and two opposite sides of a row of light-emitting devices along the second direction are respectively provided with a sixth printing area and a seventh printing area, and two opposite sides of a column of light-emitting devices along the second direction are respectively provided with an eighth printing area and a ninth printing area;

forming the reflective layer on the substrate by using the 3D printing process, includes:

forming a first reflective pattern in a sixth printing area on a side of each row of light-emitting devices by using a printing process in a straight-line manner, the first reflective pattern including: first sub-portions and first connection patterns each connecting two adjacent first sub-portions, and each light-emitting device in the row corresponds to one of the first sub-portions;

forming a second reflective pattern in a seventh printing area on another side of each row of light-emitting devices by using another printing process in a straight-line manner, the second reflective pattern including: third sub-portions and third connection patterns each connecting two adjacent third sub-portions, and each light-emitting device in the row corresponds to one of the third sub-portions;

forming a third reflective pattern in an eighth printing area on yet another side of each column of light-emitting devices by using yet another printing process in a straight-line manner, the third reflective pattern including: second sub-portions and second connection patterns each connecting two adjacent second sub-portions, and each light-emitting device in the column corresponds to one of the second sub-portions; and forming a fourth reflective pattern in a ninth printing area on still yet another side of each column of light-emitting devices by using still yet another printing process in a straight-line manner, the fourth reflective pattern including: fourth sub-portions and fourth connection patterns each connecting two adjacent fourth sub-portions, and each light-emitting device in the column corresponds to one of the fourth sub-portions, wherein a first sub-portion, a second sub-portion, a third sub-portion and a fourth sub-portion which are located around a same light-emitting device are connected to each other to form an annular pattern of the reflective layer; and a plurality of first reflective patterns, a plurality of second reflective patterns, a plurality of third reflective patterns and a plurality of fourth reflective patterns form the reflective layer.

19. The manufacturing method according to claim 14, further comprising: before attaching the reflective sheet on the side of the reflective layer away from the substrate, forming an encapsulation layer on the side of the reflective layer away from the substrate, the encapsulation layer including a plurality of encapsulation patterns, wherein the encapsulation patterns correspond to the light-emitting devices; and an orthographic projection of the light-emitting device on the substrate is located in a range of an orthographic projection of an encapsulation pattern on the substrate, and the orthographic projection of the encapsulation pattern on the substrate is overlapping with an orthographic projection of the annular pattern on the substrate.

* * * * *